United States Patent
Kobari et al.

(10) Patent No.: US 7,212,483 B2
(45) Date of Patent: May 1, 2007

(54) MODULATION DEVICE, MODULATION METHOD AND RECORDING MEDIUM

(75) Inventors: Harukuni Kobari, Yokohama (JP); Toshio Kuroiwa, Yokohama (JP); Hirotoshi Ohno, Yokohama (JP); Hiroyoshi Yoshikawa, Zama (JP); Nobuchika Ochi, Yokohama (JP); Junzo Suzuki, Yokohama (JP)

(73) Assignee: Victor Company of Japan, Limited, Yokohama (JP)

( * ) Notice: Subject to any disclaimer, the term of this patent is extended or adjusted under 35 U.S.C. 154(b) by 723 days.

(21) Appl. No.: 10/668,283

(22) Filed: Sep. 24, 2003

(65) Prior Publication Data

US 2004/0062168 A1   Apr. 1, 2004

(30) Foreign Application Priority Data

Sep. 25, 2002 (JP) ............ P2002-279629
Sep. 25, 2002 (JP) ............ P2002-279751
Sep. 25, 2002 (JP) ............ P2002-279916
Nov. 8, 2002 (JP) ............ P2002-325934
Nov. 8, 2002 (JP) ............ P2002-325975
Nov. 8, 2002 (JP) ............ P2002-325977

(51) Int. Cl.
*G11G 20/10*   (2006.01)
*H03M 7/00*   (2006.01)

(52) U.S. Cl. ............ 369/59.23; 341/59
(58) Field of Classification Search ............ None
See application file for complete search history.

(56) References Cited

U.S. PATENT DOCUMENTS 5,400,023 A * 3/1995 Ino et al. ............ 341/59

(Continued)

FOREIGN PATENT DOCUMENTS

JP   H06-197024   7/1994
JP   2001-357536   12/2001

*Primary Examiner*—Thang V. Tran
(74) *Attorney, Agent, or Firm*—The Nath Law Group; Jerald L. Meyer; Stanley N. Protigal

(57) ABSTRACT

When a code word sequence is generated by converting input data words of p bits into code words of q bits and concatenating adjacent ones of the code words with a merge bit sequence of r bits in order to obtain the best DSV value, according to one aspect, the adjacent code words are concatenated with the merge bit sequence of r bits which is selected, free from the restriction of the minimum run-length of (d+1)T and the maximum run-length of (k+1)T based on the run-length limiting rule RLL(d, k) but permitting the minimum run-length of (d+1)T and the maximum run-length of (k+2)T. According to another aspect, a merge bit sequence to be inserted after a current code word is selected by prefetching the current code word, a next code word, and a further next code word, temporarily concatenating these code words with merge bit sequences of r bits respectively to prepare code word sequence candidates free from the predetermined run-length limiting rule, calculating the DSV values of the code word sequence candidates, selecting one of the code word sequence candidates having a DSV value whose absolute value is closest to zero, and selecting the merge bit sequence between the current code word and the next code word of the selected merge bit sequence candidate. According to a further aspect, the input data words are encoded by a p-q modulation scheme after introducing for a predetermined period, as an input data word, specific data comprising alternating current signals or direct current signals which would cause a modulation device that prefetches only the next code word to output a code word sequence which includes particular frequency components.

36 Claims, 22 Drawing Sheets

U.S. PATENT DOCUMENTS

| | | | |
|---|---|---|---|
| 5,635,933 A * | 6/1997 | Fitzpatrick et al. | 341/58 |
| 5,774,078 A * | 6/1998 | Tanaka et al. | 341/59 |
| 6,281,815 B1 * | 8/2001 | Shim et al. | 341/59 |
| 6,359,930 B1 * | 3/2002 | Nakagawa et al. | 341/59 |
| 6,492,920 B2 * | 12/2002 | Oki et al. | 369/59.24 |
| 6,496,541 B1 * | 12/2002 | Kahlman et al. | 341/59 |
| 6,573,848 B2 * | 6/2003 | Hayami | 341/68 |
| 6,853,320 B2 * | 2/2005 | Hayami et al. | 341/143 |
| 6,950,042 B2 * | 9/2005 | Nakagawa et al. | 341/58 |
| 6,963,296 B2 * | 11/2005 | Oki et al. | 341/106 |

* cited by examiner

FIG.2
PRIOR ART

CODING TABLE

| INPUT DATA WORD D | CODE WORD C |
|---|---|
| 000 | 01001000100000 |
| 001 | 10000100000000 |
| 002 | 10010000100000 |
| 003 | 10001000100000 |
| ⋮ | ⋮ |
| 253 | 00001000010010 |
| 254 | 00010000010010 |
| 255 | 00100000010010 |

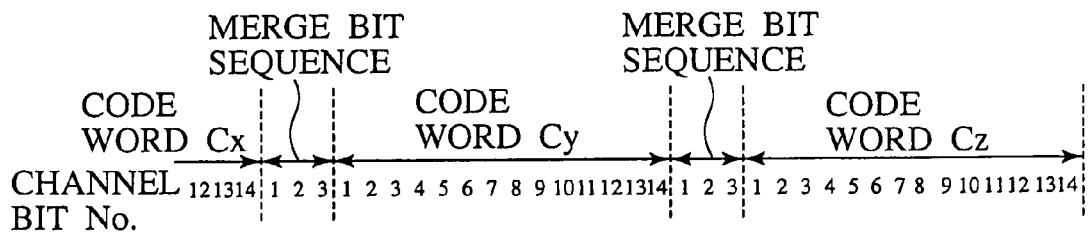
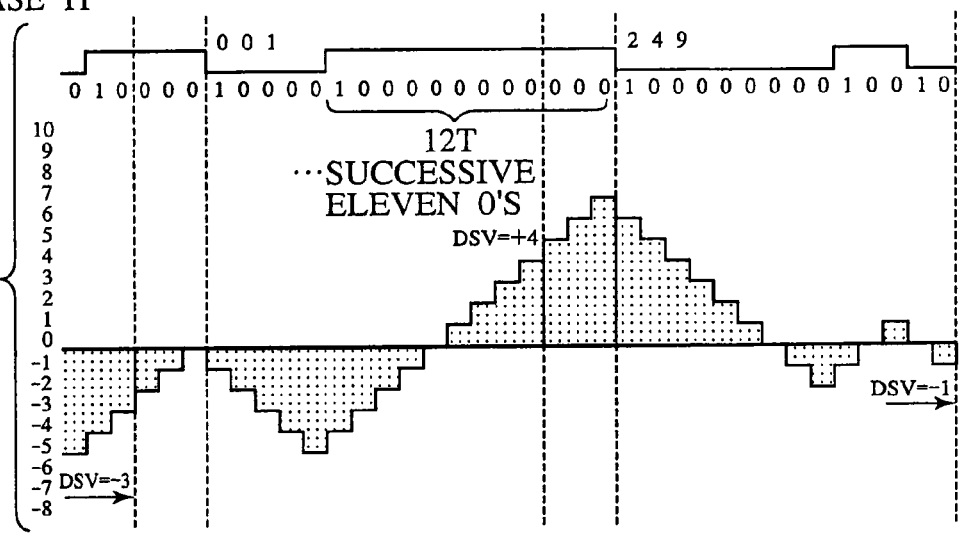
FIG.8A
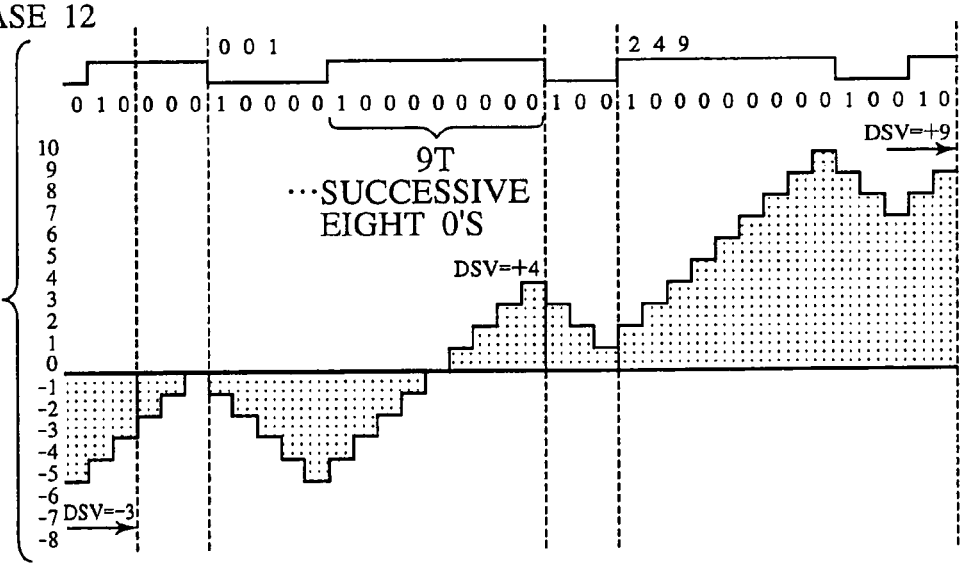
FIG.8B

LASER BEAM Lp
IRRADIATION SIDE

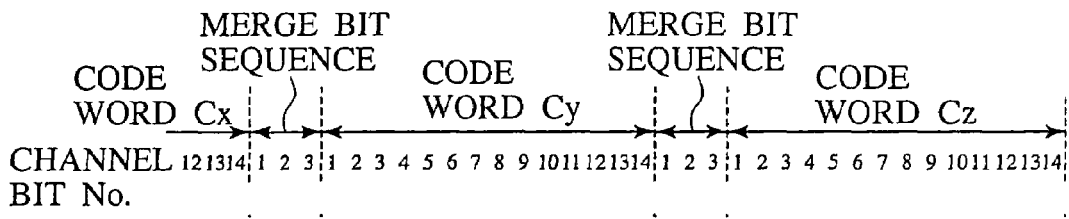
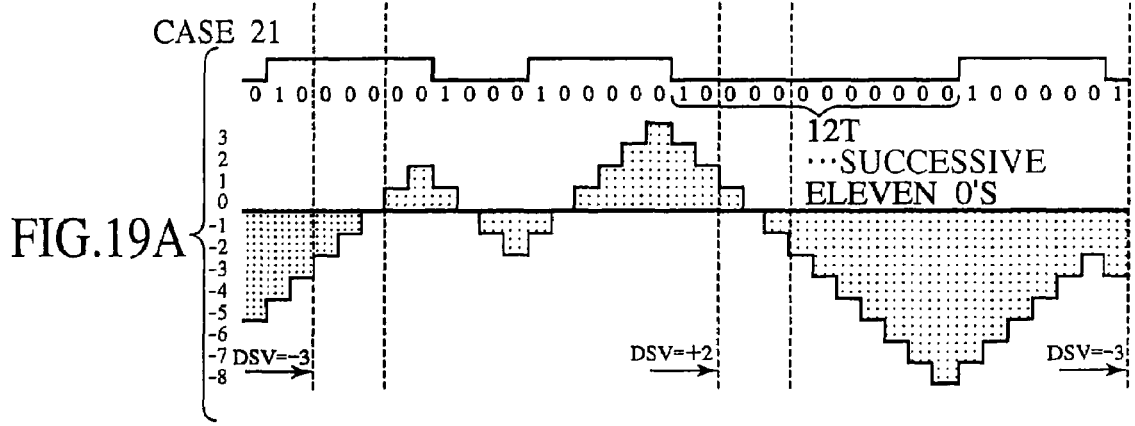
FIG.19A
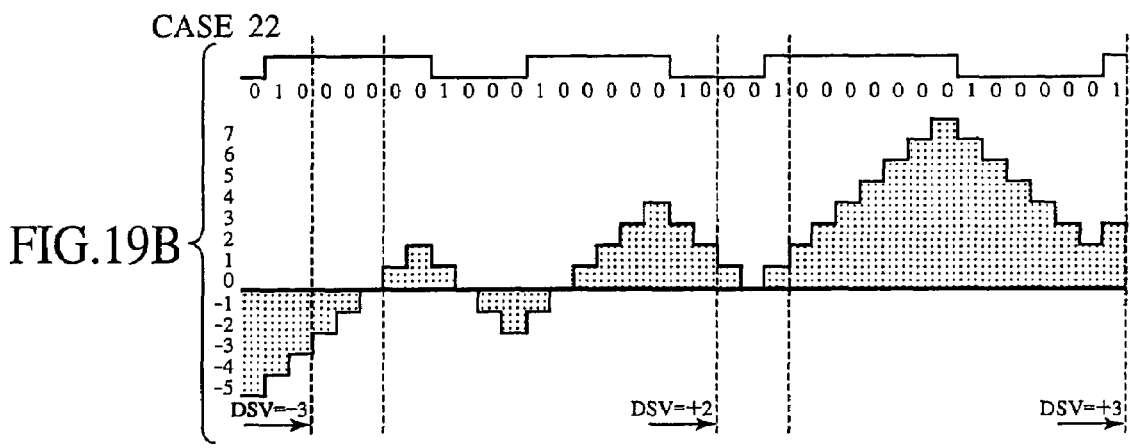
FIG.19B
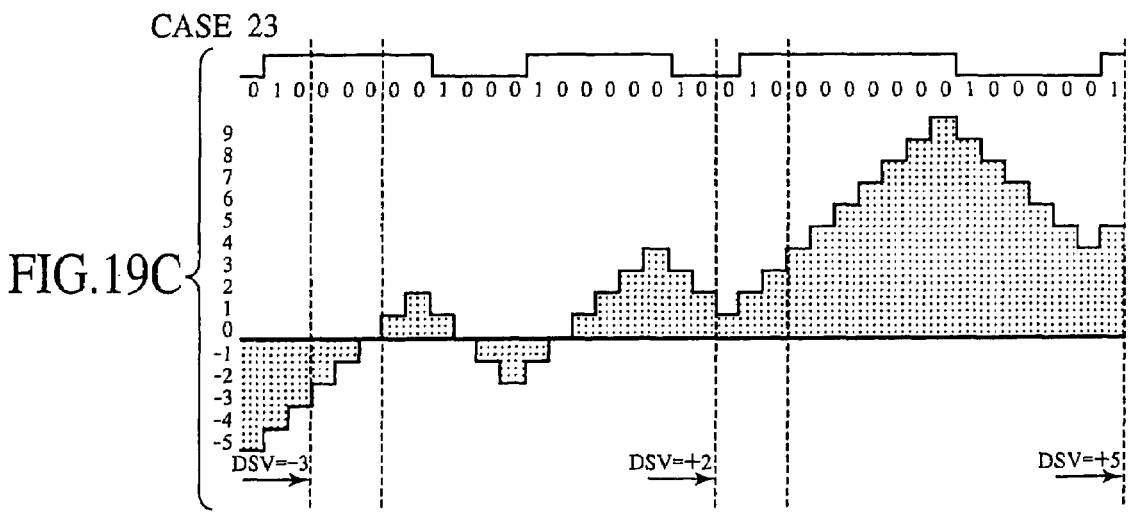
FIG.19C

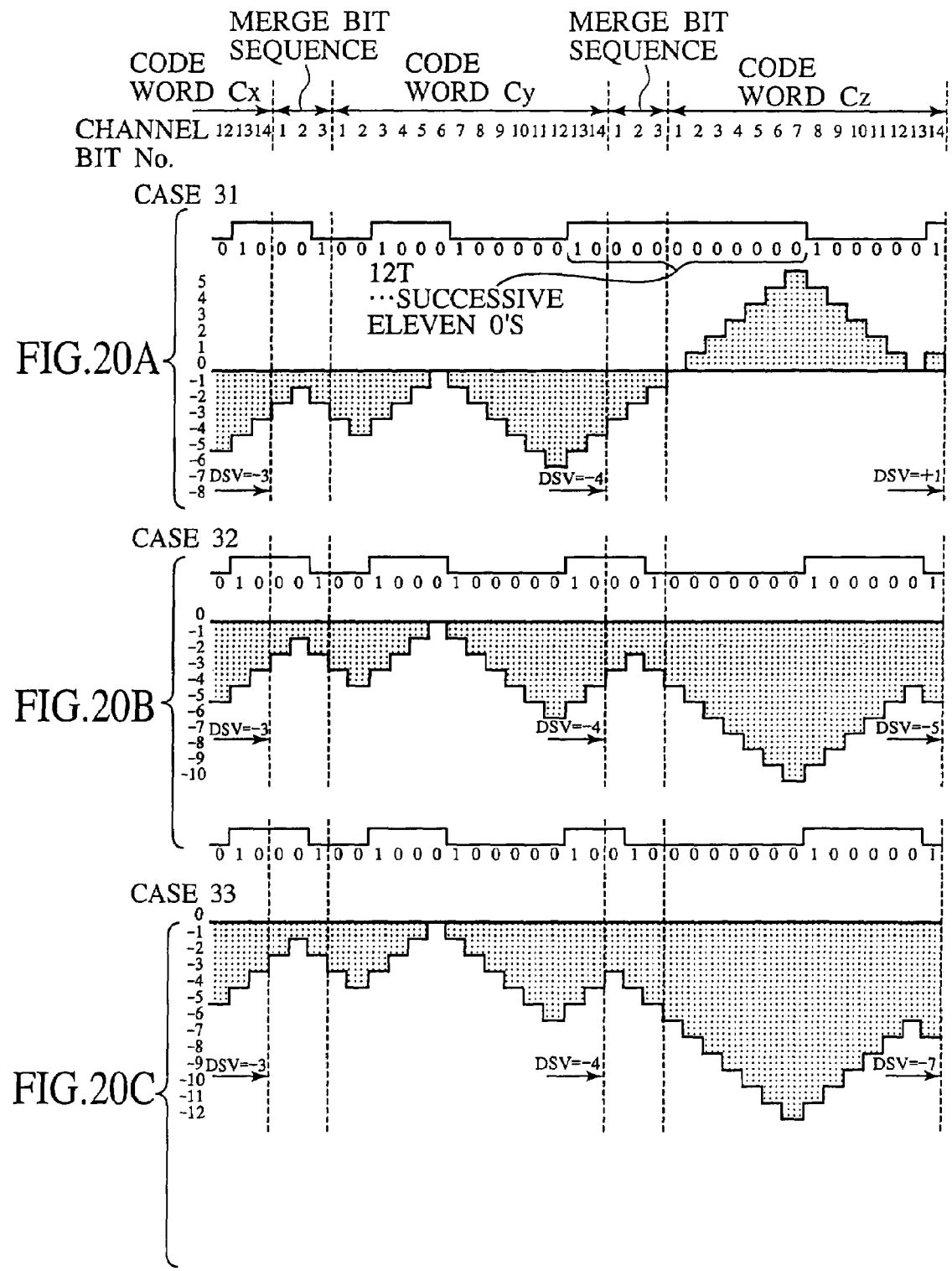

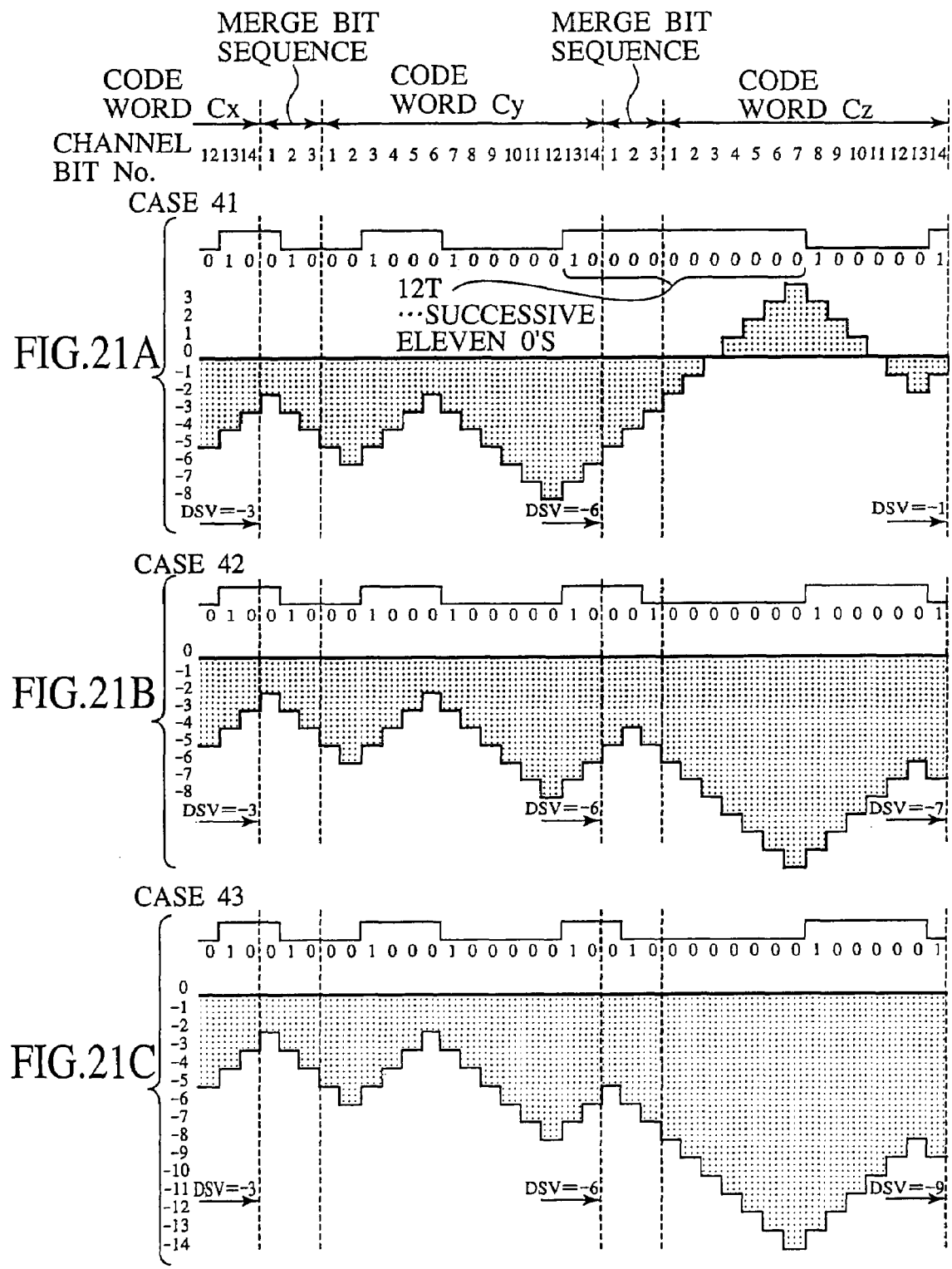

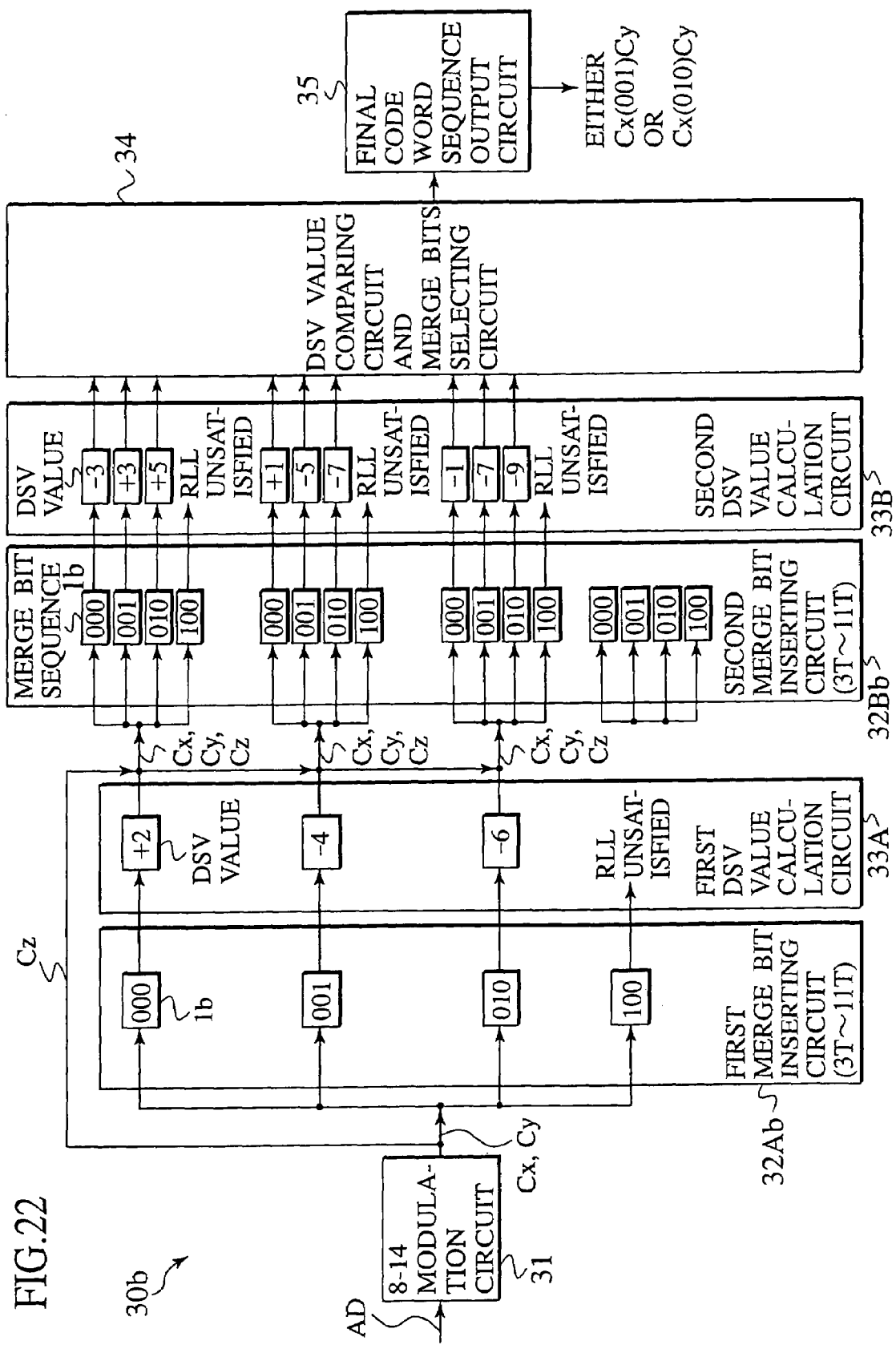

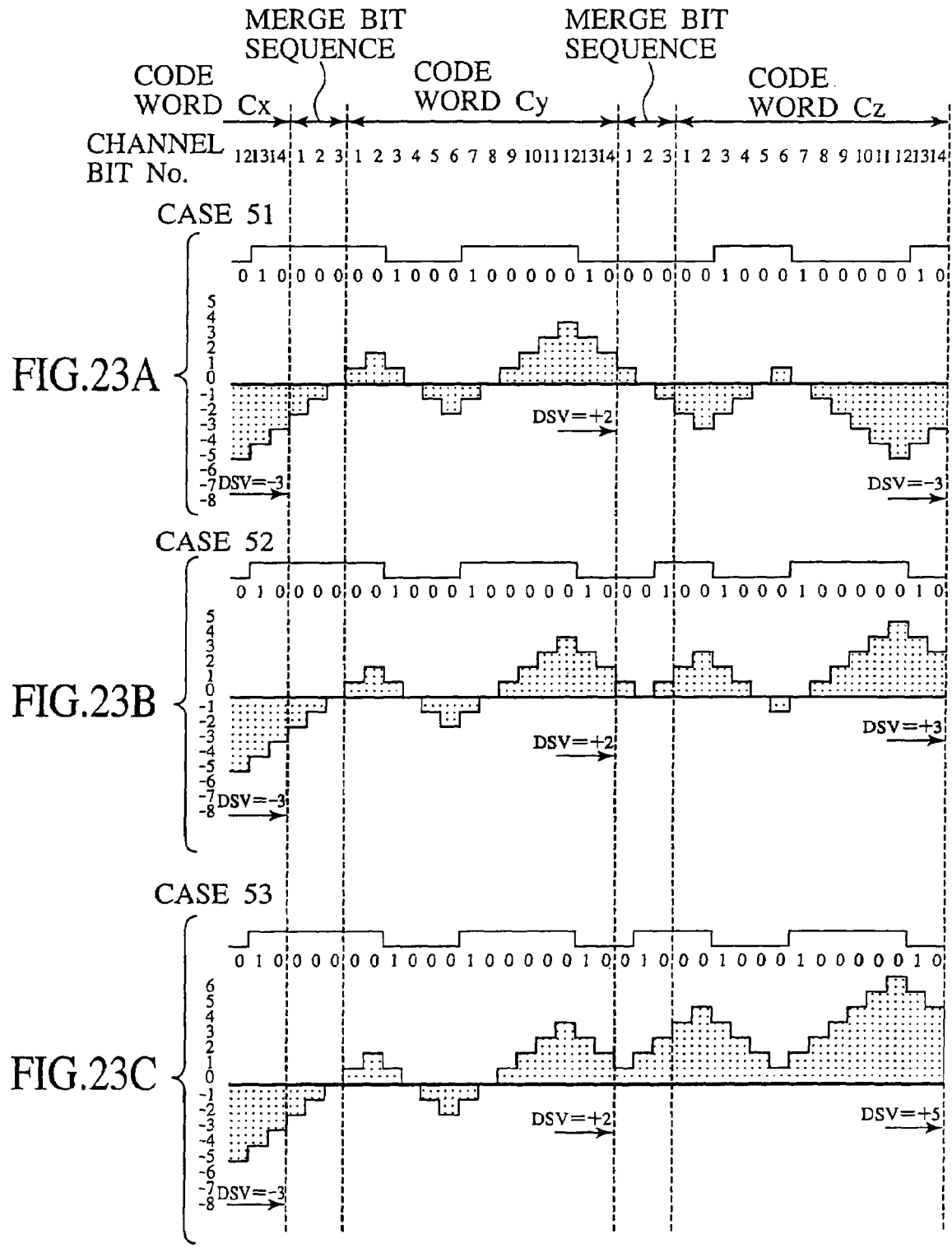

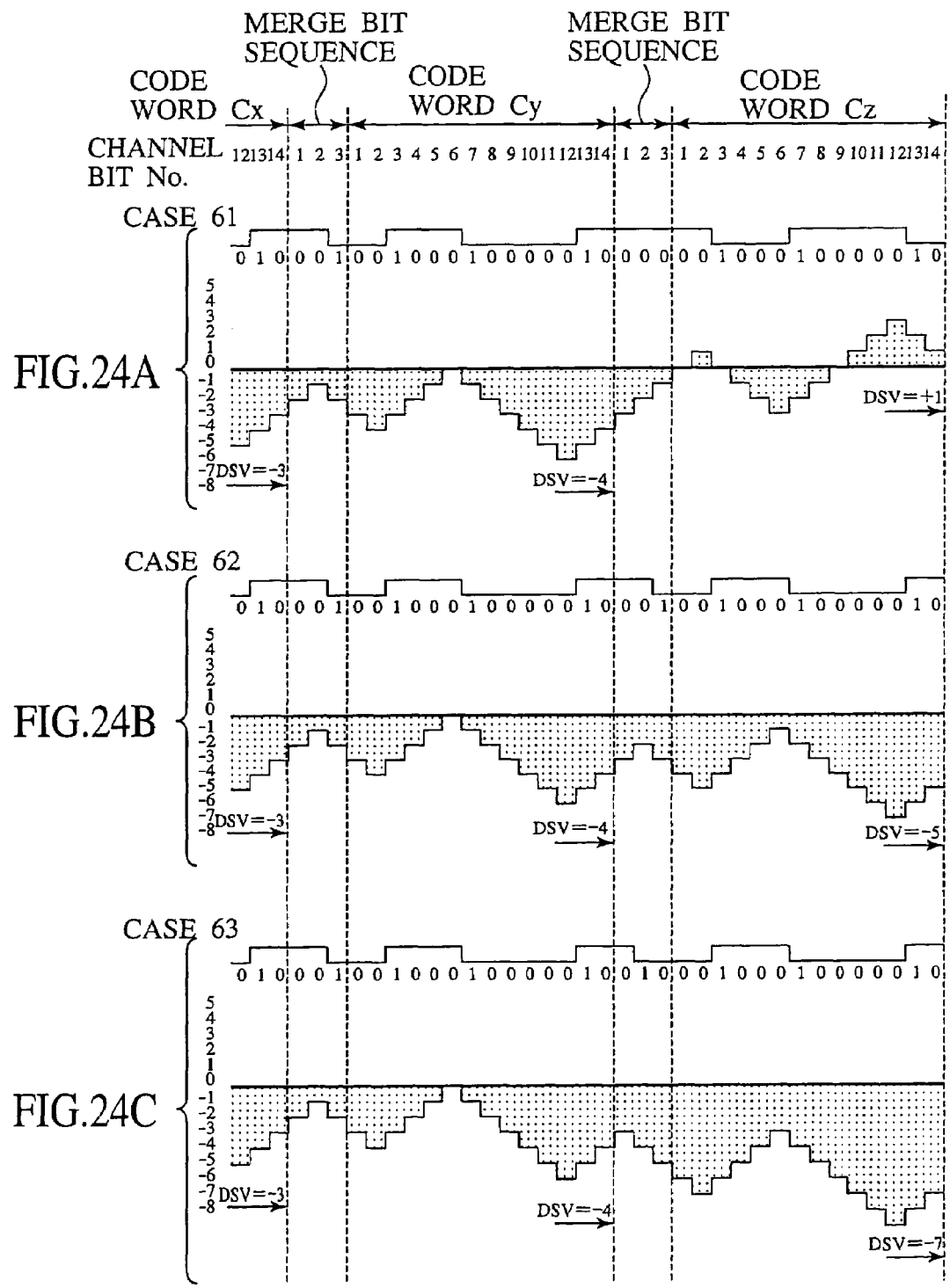

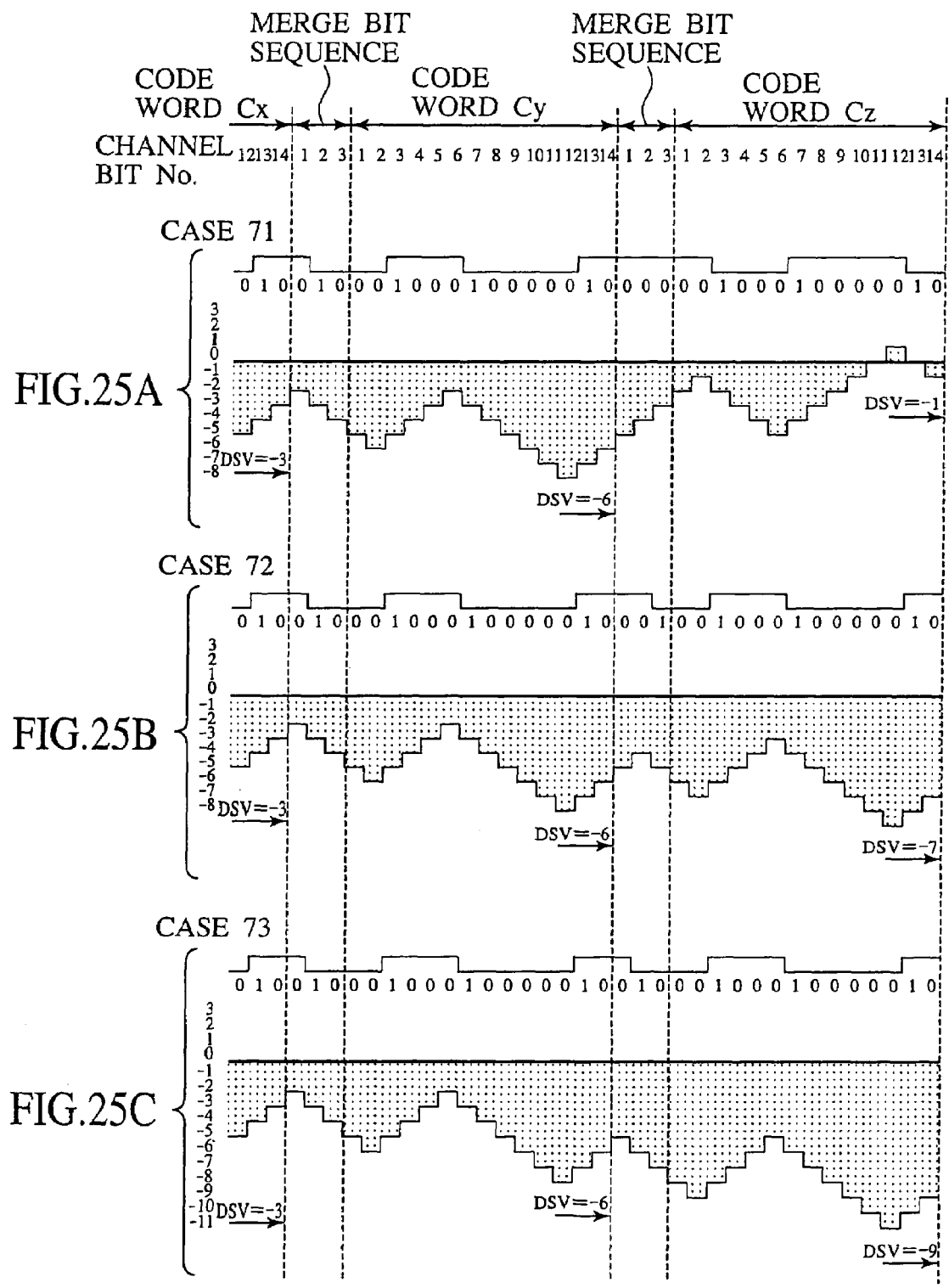

MODULATION DEVICE, MODULATION METHOD AND RECORDING MEDIUM

BACKGROUND OF THE INVENTION

1. Field of the Invention

The present invention is related to a modulation device, a modulation method, and a recording medium for preventing the copy of digital information signals that are recorded on an optical disc, a digital magnetic tape and the like recording medium.

2. Description of the Related Art

With the advent of the digital multimedia age, large amounts of digital information signals are recorded on optical discs, digital magnetic tapes and the like.

For example, a read-only optical disc, such as CD (Compact Disc) for recording music information, CD-ROM (CD-Read Only Memory) for recording computer data, comprises a disc substrate in the form of a platter in which spiral or concentric tracks are defined. A variety of digital information signals can be recorded on the tracks and quickly accessed from the tracks, while the discs are suited to mass-production at a low price, and therefore, such discs have been heavily used.

On the other hand, digital magnetic tapes for recording PCM music information are heavily utilized since these tapes can be played back for a longer time than optical discs.

Meanwhile, the recording medium illustrated in the following explanation as a medium for recording digital information signals is an optical disc on which digital information signals are recorded or from which digital information signals are reproduced by the use of an optical pickup. However, digital magnetic tapes are substantially different from optical discs only in that a magnetic head is used for reproducing digital information signals, and therefore the explanation of the case making use of a digital magnetic tape is dispensed with.

The optical disc such as CD, CD-ROM as described above is formed by converting digital information signals into a digital bit sequence in the form of concave pits and convex lands, engraving the bit sequence on spiral or concentric recording tracks of a stamper disc, placing the stamper disc formed with the recording tracks in an injection molding device, transferring the recording surface of the stamper disc having the recording tracks onto a transparent disc substrate in the form of a platter made of a transparent resin having an outer diameter of 120 mm or 80 mm, a central bore diameter of 15 mm and a thickness of 1.2 mm, and further forming a reflective film and a protection film, in this order, on the recording surface to provide a read only disc.

Then, during the readout operation from a read-only type optical disc, a laser beam for reading data is emitted from an optical pickup movably provided in an optical disc drive, projected onto the recording surface through the transparent optical disc substrate on the recording surface, reflected by the reflective film of the recording surface, and received by the optical disc drive for reproducing the signals of the recording surface carried by the laser beam as reflected.

Incidentally, the music information recorded on a CD and the computer data recorded on a CD-ROM are protected by a copyright law. However, since the information and the data are digital information, it is possible to copy the information in a CD-R (Compact Disc-Recordable) which can be written to once, CD-RW (Compact Disc-ReWritable) which can be written and rewritten several times and the like writable type optical disc.

While having the similar external appearance as a read-only type optical disc such as a CD, a CD-ROM or the like, a writable type optical disc such as a CD-R, a CD-RW is formed by forming concave grooves in the form of a spiral or concentric circles on a transparent optical disc, spin-coating an organic dye to form a recording layer on the concave groove, and further forming a reflective film and a protection film, in this order, on the organic dye, and is available at a low price on the market.

In this situation, when the music information recorded on a CD or the computer data recorded on a CD-ROM is recorded on a CD-R or a CD-RW, the signal format of the CD-R or the CD-RW is the same as the signal format of the CD or the CD-ROM, and therefore the infringement of a copyright occurs.

In what follows, the code word sequence recorded on a known CD will be explained.

FIG. 1 is a view for explaining the format of EFM signals of the music information recorded on a CD. FIG. 2 is a table for use in an 8–14 modulation. FIGS. 3A and 3B are views for explaining a DSV control scheme applied after the 8–14 modulation.

First, music information is recorded on a CD in a signal format in conformity with the CD format "Red Book standards", or the IEC (International Electrotechnical Commission) 908 standard.

In this case, generally speaking, the pit lengths of an optical disc have to satisfy a minimum run-length (a shortest pit length or a shortest land length) required under the physical restriction relating to the pit generation and the optical transmission characteristics for read/write operations, a maximum run-length (a longest pit length or a longest land length) required in order to facilitate clock regeneration, and further have to satisfy the modulation scheme requirement that the DC component and the low frequency components of recording signals as modulated are sufficiently suppressed for the purpose of securing the servo bandwidth and so forth.

The EFM (Eight to Fourteen Modulation: 8–14 modulation) scheme used for CDs is one of the modulation schemes conforming to the above restrictions and has a minimum run-length of 3T (T is the length of a channel bit) and a maximum run-length of 11T.

Namely, music original data AD to be recorded on a CD is digital data composed of a plurality of successive data units each of which comprises upper eight bits (one byte) plus lower eight bits (one byte) totaling to 16 bits (two bytes).

When the music original data AD is recorded on a glass master disc for mastering, the music original data AD is converted into a signal sequence suitable for recording in a signal format according to the EFM scheme. The EFM signals 1 are recorded on the glass master disc in the signal sequence as shown in FIG. 1. Then, a metallic master disc, a mother disc and a stamper disc are formed from the glass master disc in this order by electroforming, followed by placing the stamper disc in an injection molding device and transferring the recording surface of the stamper disc to a transparent optical disc to obtain a CD. Accordingly, the recording surface of the CD is equivalent to the recording surface of the glass master disc.

In this case, in accordance with the format of the EFM signals 1 as described above, the EFM signals 1 are prepared in the form of first and second code word sequences 1*d* and 1*f* as shown in FIG. 2 by dividing the input music original data AD into an input data word D of the upper eight bits and an input data word D of the lower eight bits, converting each of the respective input data words D of p bits (=eight bits) into run-length limited code of q bits (=eleven bits) (referred to as a code word C in the following description) while conforming to the run-length limiting rule of the minimum run-length of 3T and the maximum run-length of 11T with reference to a coding table as shown in FIG. 2, and concatenating each adjacent code words C converted as shown in FIG. 1 with an intervening merge bit sequence 1*b* of r bits (=three bits) for controlling the DSV (Digital Sum Value) while conforming to the run-length limiting rule.

At this time, when the predetermined run-length limiting rule is observed, the minimum number of successive 0's occurring between adjacent logic 1's is d (=2) according to the minimum run-length of 3T while the maximum number of successive 0's occurring between adjacent logic 1's is k (=10) according to the maximum run-length of 11T. In other words, when the run-length limiting rule RLL(d, k) (=RLL (2, 10)) is observed, the minimum run-length is set as (d+1)T=3T while the maximum run-length is set as (k+1) T=11T. The restriction of the minimum run-length of (d+1) T=3T and the maximum run-length of (k+1)T=11T is satisfied in the first and second code word sequences 1*d* and 1*f* which are obtained by concatenating adjacent code words C and C with an intervening merge bit sequence 1*b* of three bits. When the first and second code word sequences 1*d* and 1*f* are NRZI-converted, the minimum run-length 3T corresponds to the minimum inversion interval of the NRZI converted sequence while the maximum run-length 11T corresponds to the maximum inversion interval of the NRZI converted sequence.

Then, the EFM signals 1 as p-q modulated (=8–14 modulation) are arranged in order to decrease the DC component and the low frequency components of the EFM signals 1 while conforming to the run-length limiting rule RLL(d, k) (=RLL(2, 10)) of the minimum run-length 3T and the maximum run-length 11T.

As is well known in the art, the NRZI conversion provides a modulation scheme which inverts the signal in a "1" and leaves the signal unchanged for a "0". Since NRZI (Non Return to Zero Inverted) conversion is performed on the EFM signals 1 including the first and second code word sequences 1*d* and 1*f*, the waveform after the NRZI conversion is the waveform of the recording signals R on the glass master disc in which, for example, each L (low) level zone of the recording signals R is represented by a concave pit (or a convex land) while each H (high) level zone of the recording signals R is represented by a convex land (or a concave pit) to provide a bit sequence in combination.

Also, as illustrated in FIGS. 3A and 3B, the above described DSV is the integral of the EFM signals 1 from the start time point of the code word sequence to the current time point in which the H (high) level of the waveform of the EFM signals 1 as NRZI converted is calculated as "1" (positive sense) while the L (low) level thereof is calculated as "−1" (negative sense). At this time, since the polarity is inverted with a data bit of "1" in accordance with the NRZI conversion, a code word generates either of two DSV values dependent upon the state of the waveform obtained by NRZI-converting a code word immediately before the code word to be connected. For example, in the case where the input data word="002", the DSV value is inverted when the previous level is the L (low) level shown in FIG. 3A as compared with the DSV value when the previous level is the H (high) level shown in FIG. 3B. Namely, the absolute values of the DSV values as illustrated in FIGS. 3A and 3B are equal to each other in which an input data word (=002) and an input data word (=253) are concatenated with a merge bit sequence.

In this case, a merge bit sequence 1*b* of three bits is selected from among bit sequences of (000), (001), (010) and (100) in order that the absolute value of the DSV value approaches zero while conforming to the run-length limiting rule RLL(d, k) (=RLL(2, 10)). By such selection, H (high) level zones and L (low) level zones appear in the recording signals R approximately at the same frequency over a long period, while restricting to a low level the DC component of the waveform of the recording signals R. Accordingly, the DSV value is also controlled in order that concave pits and convex lands appear in the disc approximately at the same frequency.

Returning to FIG. 1, one frame of the EFM signals 1 as described above is composed of a synchronization signal 1*a*, a merge bit sequence 1*b*, a subcode 1*c*, a merge bit sequence 1*b*, a first code word sequence 1*d*, a merge bit sequence 1*b*, a C2 error correction code 1*e*, a merge bit sequence 1*b*, a second code word sequence 1*f*, a merge bit sequence 1*b*, a C1 error correction code 1*g* and a merge bit sequence 1*b* arranged in this order from the head, and therefore totals 588 channel bits.

In this case, the synchronization signal 1*a* arranged in the head is a 24 bit signal including three transitions of 11T, 11T and 2T indicative of the start of a frame and distinctive from the respective signals 1*b* to 1*g* as described above.

The subcode 1*c* arranged after the synchronization signal 1*a* with the intervening merge bit sequence 1*b* of three bits is a signal for controlling the playback operation of a CD.

The first code word sequence 1*d* arranged after the subcode 1*c* with the intervening merge bit sequence 1*b* of three bits is prepared by converting each input data word D (each music original data) of p bits (=8 bits) into a corresponding code word C with reference to the coding table as shown in FIG. 2 and concatenating adjacent code words C and C with an intervening merge bit sequence 1*b* of three bits, and therefore composed of 12 code words C (12 symbols) and 11 merge bit sequences 1*b*.

The C2 error correction code 1*e* arranged after the first code word sequence 1*d* with the intervening merge bit sequence 1*b* of three bits is used to perform error correction of the first code word sequence 1*d* and the second code word sequence 1*f* of the EFM signals 1 during the playback of a CD.

Further, the second code word sequence 1*f* arranged after the C2 error correction code 1*e* with the intervening merge bit sequence 1*b* of three bits is composed of 12 code words C (12 symbols) and 11 merge bit sequences 1*b* of three bits in the same manner as the first code word sequence 1*d* as described above.

Furthermore, the C1 error correction code 1*g* arranged after the second code word sequence 1*f* with the intervening merge bit sequence 1*b* of three bits is used to perform error correction of the first code word sequence 1*d*, the second code word sequence 1*f* and the C2 error correction code 1*e* of the EFM signals 1 during the playback of a CD.

One block as a unit of music corresponding to a 1/75 second is then composed of successive 98 frames each of which is formed by NRZI-converting one frame of the EFM signals 1 as described above.

Incidentally, the above explanation is applicable to the case of a CD-ROM for storing computer data only by replacing the music original data as shown in FIG. 1 with computer original data, and therefore redundant explanation is not repeated.

Next, a conventional modulation device will be explained with reference to FIG. 4 and FIGS. 5A through 5C.

FIG. 4 is a block diagram schematically showing a conventional modulation device. FIGS. 5A through 5C are views for explaining the calculation of the DSV values for a plurality of the code word sequences temporarily prepared. Each code word sequence is generated in the conventional modulation device by inserting one of the merge bit sequences (000), (001), (010) and (100) between a current code word and the next code word while conforming to a predetermined run-length limiting rule.

The conventional modulation device 20 as shown in FIG. 4 is included in a glass master disc recording apparatus (not shown in the figure) or a CD-R drive which can be used for copying the music information of a CD to a CD-R disc, and composed generally of an 8–14 modulation circuit 21, a merge bit inserting circuit 22, a DSV value calculation circuit 23, a DSV value comparing circuit and merge bit sequence selecting circuit 24.

The conventional modulation device 20 divides music original data AD of 16 bits into upper eight bits and lower eight bits as input data words and then converts the respective input data words D of eight bits into the respective code words C of 14 bits. Then, the conventional modulation device 20 temporarily concatenates, for example, a current code word Cx and a next code word Cy just subsequent thereto with all the intervening merge bit sequences of three bits $1b$ that satisfy the run-length limiting rule RLL(2, 10) to generate a plurality of code word sequences. Then, the conventional modulation device 20 selects one sequence, whose absolute DSV value is closest to zero, from among the plurality of code word sequences as the final single code word sequence.

More specifically explaining, in the case of the conventional modulation device 20, the music original data AD of 16 bits is input to the 8–14 modulation circuit 21 in chronological order.

In the 8–14 modulation circuit 21 described above, the music original data AD as input is divided into an input data word D of upper eight bits and an input data word D of lower eight bits to generate a series of input data words D of eight bits in chronological order, as explained with reference to FIG. 1, followed by successively converting the respective input data words D of eight bits into code words C of 14 bits with reference to the coding table as shown in FIG. 2, in which for example a current code word Cx and a next code word Cy just subsequent thereto are read in sequence. Then, the current code word Cx and the next code word Cy are input to the merge bit inserting circuit 22 from the 8–14 modulation circuit 21.

Next, the merge bit inserting circuit 22 serves to insert a merge bit sequence of three bits $1b$ between adjacent code words C and C while conforming to the restriction of the minimum run-length 3T and the maximum run-length 11T in accordance with the run-length limiting rule RLL(2, 10) of the CD standards. Four bit sequences of (000), (001), (010) and (100) are prepared in this merge bit inserting circuit 22 as candidates of the merge bit sequence of three bits $1b$. Incidentally, while there are eight sequences of three bits as combinations of "0" and "1", the remaining four sequences, i.e., (011), (101), (110) and (111) can not satisfy the run-length limiting rule RLL(2, 10) because two or more 1's appear successively or with an intervening "0", and therefore are not available.

Then, the four merge bit sequences (000), (001), (010) and (100) are temporarily inserted respectively between the code words Cx and Cy as successively input to the merge bit inserting circuit 22 to generate a plurality of code word sequences.

In this case, as illustrated in FIGS. 5A to 5B, for example, the current code word Cx has "010" from the 12th bit to the 14th bit thereof while the next code word Cy is "00100010000010". On the other hand, the current code word Cx has "1" at the 13th bit position while the next code word Cy has "1" at the third bit position. Thereby, out of the four merge bit sequences as described above, the fourth merge bit sequence (100) does not conform to the run-length limiting rule RLL(2, 10), while the first to third merge bit sequences (000), (001) and (010) conform to the run-length limiting rule RLL(2, 10), and therefore the fourth merge bit sequence (100) is determined not to be inserted.

After inserting the three merge bit sequences (000), (001) and (010) respectively between the code words Cx and Cy, the resultant three code word sequences {Cx(000)Cy}, {Cx(001)Cy} and {Cx(010)Cy} are input to the DSV value calculation circuit 23 to calculate the respective DSV values of the three code word sequences. In the case 1 as shown in FIG. 5A in which the merge bit sequence (000) is inserted between the code words Cx and Cy, the DSV value of the code word sequence {Cx(001)Cy} is +2. Also, in the case 2 as shown in FIG. 5B in which the merge bit sequence (001) is inserted between the code words Cx and Cy, the DSV value of the code word sequence {Cx(001)Cy} is −4. Similarly, in the case 3 as shown in FIG. 5C in which the merge bit sequence (010) is inserted between the code words Cx and Cy, the DSV value of the code word sequence {Cx(010)Cy} is −6.

Thereafter, the respective DSV values of the three code word sequences are input to the DSV value comparing circuit and merge bit selecting circuit 24 from the DSV value calculation circuit 23. The code word sequence {Cx(000)Cy} is then selected by and output from the DSV value comparing circuit and merge bit selecting circuit 24 as a final single code word sequence having the DSV value (=+2) closest to zero from among the three code word sequences. In other words, the DSV value comparing circuit and merge bit selecting circuit 24 serves to select the merge bit sequence (000) corresponding to the final single code word sequence {Cx(000)Cy} having the DSV value closest to zero. The above described procedure is repeated with the next code word Cy as the next current code word and the code word just after the code word Cy as the next next code word to obtain a final single code word sequence {Cx(000)Cy . . . }.

Thereafter, the recording signals R (FIG. 1) suitable for recording is generated from the final single code word sequence {Cx(000)Cy . . . } of which the DSV value is controlled. Then, the generated recording signals R is recorded on a glass master disc for CD or a CD-R by a laser beam.

The glass master disc for CD is used to prepare a stamper disc (not shown in the figure) which in turn is used to produce a CD.

In view of the above, utilizing a software for copy stored in a hard disk (not shown) in a personal computer (not shown), a user can play back a CD on which music information that is desired to be copied by the user is recorded, with a CD drive (not shown) and then input the music information that is outputted from the CD drive and is desired to be copied on a CD-R, into a CD-R drive (not shown), and accordingly can copy the music information desired to be copied, onto the CD-R as it is by means of the conventional modulation apparatus 20 provided in the CD-R drive without authorization of the owner of the copyright.

In other words, when the music original data AD of 16 bits as output from the CD drive is encoded by the conventional modulation device 20 in the CD-R drive, the music information recorded on the CD-R is identical to the music information recorded on the CD in terms of the EFM signals. The CD-R as duplicated can be used to copy the music information onto another CD-R again without the original CD so that the music information is distributed in large quantities in the world.

Taking into consideration the situation, an exemplary copy-protected optical disc is proposed which can be used to prevent the music information recorded on a CD or the computer data recorded on a CD-ROM from being copied onto a recordable CD-R or CD-RW (for example, disclosed in Japanese Patent Application Laid-open No.2001-357536, pages 4–5, FIG. 4).

FIG. 6 is a longitudinal cross sectional view showing an optical disc, in which copy-protection technology is incorporated, as an exemplary conventional technique.

The conventional optical disc 100 as shown in FIG. 6 is one described in the above Japanese Patent Application Laid-open No. 2001-357536. Referring to the same document, in the conventional optical disc 100 designed by incorporating the copy-protection technology in an optical disc such as CD-ROM, DVD-ROM, convex and concave portions are formed with lengths ranging from 3T to 14T (T is 0.133 μm) based on the run-length limiting rule (referred to as the run-length limited encoding scheme in the same publication). However, this technique is characterized in that the sequence of the convex and concave portions further includes convex or concave portions having each length shorter than the minimum run-length based on the run-length limiting rule.

Specifically, as shown in FIG. 6, a pit A is convexly formed with a length of 1T to 2T while a pit B is concavely formed with a length of 1T to 2T located apart from the pit A by X. The lengths of these pits A and B do not satisfy the run-length limiting rule.

Accordingly, the shortest pit length (or the shortest land length) of the conventional optical disc 100 is smaller than the normal value by setting a minimum run-length of 1T to 2T without satisfying the requirement of the minimum run-length 3T out of the run-length limiting rule comprising the minimum run-length 3T and the maximum run-length 14T.

In order to implement the technical concept of the conventional optical disc 100 as described above within a known CD on which convex and concave portions (pit sequence) are formed with lengths between 3T to 11T conforming to the run-length limiting rule RLL (2, 10) included in the CD standards to modify the signal sequence recorded on a CD, a code word C such as "00100110010010" is used as one corresponding an input data word D (=255) to introduce a short convex or concave portion (pit sequence) of 1T instead of "00100000010010" in the coding table shown in FIG. 2.

When playing the modified CD with a commercially available optical disc drive, it is impossible to judge whether or not the optical disc as played is legally-distributed because the verification pit having a length of 1T to 2T in the data as read out is shorter than a normal pit having a pit length (land length) of 3T to 11T and therefore the RF signal as read out by an optical pickup does not reach a sufficient bright level or a sufficient dark level so that the binary signals obtained from the RF signal contains no signal indicative of the verification pit having a length of 1T to 2T. Also, it is possible without trouble to copy the music information recorded on the modified CD by reproducing the music information with a commercially available optical disc drive and inputting the reproduced music information to a CD-R drive.

Accordingly, under the present circumstance in which a number of players and CD-R drives have already been distributed on the market, the above copy-protection mechanism is not effective because of its assumption of the spread of a new player such as the optical disc 100 capable of detecting the verification pit.

Furthermore, in the same manner as optical discs, digital magnetic tapes have the same problem that digital information signals recorded therein are copied.

SUMMARY OF THE INVENTION

Accordingly, it is desired to provide a modulation device, a modulation method and a recording medium capable of preventing in advance, copy of digital information signals recorded in a recording medium such as an optical disc and a digital magnetic tape by generating a code word sequence without conforming to a predetermined run-length limiting rule but ensuring that an original recording medium on which the code word sequence is recorded can be played back by means of a player that has been commercially available while disabling a copied recording medium, into which the digital information signals are copied, from being played back.

On the other hand, it is also desired to provide a modulation device, a modulation method and a recording medium capable of preventing in advance, copy of digital information signals recorded in a recording medium such as an optical disc and a digital magnetic tape by ensuring that an original recording medium on which a code word sequence is recorded can be played back by means of a player that has been commercially available while disabling a copied recording medium, into which the digital information signals are copied, from being played back even when the code word sequence is generated with the predetermined run-length limiting rule conformed.

In order to accomplish the above described objects, there is provided a modulation device for converting input data words of p bits into code words of q bits, concatenating adjacent ones of the code words with a merge bit sequence of r bits to form a code word sequence, and outputting the code word sequence, wherein when the code word sequence is generated, the DSV of the code word sequence is controlled by inserting the merge bit sequence of r bits between the adjacent code words without conforming to at least one of a minimum run-length (d+1)T and a maximum run-length (k+1)T which are set on the basis of a run-length limiting rule RLL(d, k).

In accordance with a preferred embodiment of the present invention, the DSV of the code word sequence is controlled by inserting the merge bit sequence of r bits between the adjacent code words without conforming to the maximum run-length (k+1)T on the basis of the run-length limiting rule RLL(d, k) but permitting a maximum run-length of (k+2)T.

In accordance with another preferred embodiment of the present invention, the code word sequence is output not to conform to the run-length limiting rule RLL(d, k) for a predetermined period during which is input specific data as the input data word with which particular frequency components would appear in a code word sequence if outputting to conform to the run-length limiting rule RLL(d, k).

In accordance with a further preferred embodiment of the present invention, the specific data comprises alternating current signals or direct current signals which are not distinctively audible.

In accordance with a still further preferred embodiment of the present invention, when the specific data which is not distinctively audible is input for a predetermined period while the input data words comprise music information, the specific data is inserted to the gap of silence between adjacent performances of music.

In accordance with a still further preferred embodiment of the present invention, when the specific data which is not distinctively audible is input for a predetermined period while the input data words comprise music information, the specific data is inserted to an area located within the gap of silence between adjacent performances of music but located outside of the area given the index number 00.

In order to accomplish the above described objects, there is provided a recording medium on which is recorded the code word sequence encoded by the modulation device as recited the above.

In order to accomplish the above described objects, there is provided a modulation method for converting input data words of p bits into code words of q bits, concatenating adjacent ones of the code words with a merge bit sequence of r bits to form a code word sequence, and outputting the code word sequence, wherein when the code word sequence is generated, the DSV of the code word sequence is controlled by inserting the merge bit sequence of r bits between the adjacent code words without conforming to at least one of a minimum run-length (d+1)T and a maximum run-length (k+1)T which are set on the basis of a run-length limiting rule RLL(d, k).

In accordance with a preferred embodiment of the present invention, the DSV of the code word sequence is controlled by inserting the merge bit sequence of r bits between the adjacent code words without conforming to the maximum run-length (k+1)T on the basis of the run-length limiting rule RLL(d, k) but permitting a maximum run-length of (k+2)T.

In accordance with another preferred embodiment of the present invention, the code word sequence is output not to conform to the run-length limiting rule RLL (d, k) for a predetermined period during which is input specific data as the input data word with which particular frequency components would appear in a code word sequence if outputting to conform to the run-length limiting rule RLL(d, k).

In accordance with a further preferred embodiment of the present invention, the specific data comprises alternating current signals or direct current signals which are not distinctively audible.

In accordance with a still further preferred embodiment of the present invention, when the specific data which is not distinctively audible is input for a predetermined period while the input data words comprise music information, the specific data is inserted to the gap of silence between adjacent performances of music.

In accordance with a still further preferred embodiment of the present invention, when the specific data which is not distinctively audible is input for a predetermined period while the input data words comprise music information, the specific data is inserted to an area located within the gap of silence between adjacent performances of music but located outside of the area given the index number 00.

In order to accomplish the above described objects, there is provided a recording medium on which is recorded the code word sequence encoded by the modulation method as recited the above.

In order to accomplish the above described objects, there is provided a modulation device for converting input data words of p bits into code words of q bits, concatenating adjacent ones of the code words with a merge bit sequence of r bits to form a code word sequence, and outputting the code word sequence, the modulation device comprising: a modulation means for converting the input data words of p bits into the code words of q bits while prefetching at least a current code word, a next code word, and a further next code word; a merge bit inserting means for generating a plurality of code word sequences by temporarily concatenating the current code word and the next code word with each of a plurality of merge bit sequences of the r bits respectively to prepare a plurality of code word sequences without conforming to the run-length limiting rule, and then temporarily concatenating at least the further next code word and the next code word of each code word sequence with each of the plurality of merge bit sequences of the r bits to prepare a large number of code word sequences from the current code word to the further next code word without conforming to the run-length limiting rule; a DSV value calculation means for calculating the DSV value of each of the large number of code word sequences as generated by the merge bit inserting means; a comparing and selecting means for selecting one code word sequence having an absolute DSV value as calculated by the DSV value calculation means closest to zero among the large number of code word sequences; and a final code word sequence output means for outputting a final code word sequence finally determined by concatenating the current code word and the next code word with the merge bit sequence which is inserted between the current code word and the next code word of the one code word sequence as selected by the comparing and selecting means.

In order to accomplish the above described objects, there is provided a recording medium on which is recorded the code word sequence encoded by the modulation device as recited the above.

In order to accomplish the above described objects, there is provided a modulation method for converting input data words of p bits into code words of q bits, concatenating adjacent ones of the code words with a merge bit sequence of r bits to form a code word sequence, and outputting the code word sequence, the modulation method comprising: a first step of converting the input data words of p bits into the code words of q bits while prefetching at least a current code word, a next code word, and a further next code word; a second step of generating a plurality of code word sequences by temporarily concatenating the current code word and the next code word with each of a plurality of merge bit sequences of the r bits respectively to prepare a plurality of code word sequences without conforming to the run-length limiting rule RLL(d, k), and then temporarily concatenating at least the further next code word and the next code word of each code word sequence with each of the plurality of merge bit sequences of the r bits to prepare a large number of code word sequences from the current code word to the further next code word without conforming to the run-length limiting rule RLL(d, k); a third step of calculating the DSV value of each of the large number of code word sequences as generated in the second step; a fourth step of selecting one code word sequence having an absolute DSV value as calculated in the third step closest to zero among the large number of code word sequences; and a fifth step of outputting a final code word sequence finally determined by concatenating the current code word and the next code word with the merge bit sequence which is inserted between the current code word and the next code word of the one code word sequence as selected in the fourth step.

In order to accomplish the above described objects, there is provided a recording medium on which is recorded the code word sequence encoded by the modulation method as recited the above.

In order to accomplish the above described objects, there is provided a modulation device for converting input data words of p bits into code words of q bits, concatenating adjacent ones of the code words with a merge bit sequence of r bits to form a code word sequence, and outputting the code word sequence, the modulation device comprising: a modulation means for converting the input data words of p bits into the code words of q bits while prefetching at least a current code word, a next code word, and a further next code word; a merge bit inserting means for generating a plurality of code word sequences by temporarily concatenating the current code word and the next code word with each of a plurality of merge bit sequences of the r bits respectively to prepare a plurality of code word sequences with the run-length limiting rule conformed, and then temporarily concatenating at least the further next code word and the next code word of each code word sequence with each of the plurality of merge bit sequences of the r bits to prepare a large number of code word sequences from the current code word to the further next code word with the run-length limiting rule conformed; a DSV value calculation means for calculating the DSV value of each of the large number of code word sequences as generated by the merge bit inserting means; a comparing and selecting means for selecting one code word sequence having an absolute DSV value as calculated by the DSV value calculation means closest to zero among the large number of code word sequences; and a final code word sequence output means for outputting a final code word sequence finally determined by concatenating the current code word and the next code word with the merge bit sequence which is inserted between the current code word and the next code word of the one code word sequence as selected by the comparing and selecting means, wherein specific data is input for a predetermined period as the input data and the input data word is encoded by the p-q modulation scheme, the specific data comprising alternating current signals or direct current signals which would cause a modulation device that prefetches only the next code word to output a code word sequence which includes particular frequency components.

In accordance with a still further preferred embodiment of the present invention, when the specific data which is not distinctively audible is input for the predetermined period while the input data words comprise music information, the specific data is inserted to the gap of silence between adjacent performances of music.

In accordance with an embodiment of the present invention, when the specific data which is not distinctively audible is input for the predetermined period while the input data words comprise music information, the specific data is inserted to an area located within the gap of silence between adjacent performances of music but located outside of the area given the index number 00.

In order to accomplish the above described objects, there is provided a recording medium on which is recorded the code word sequence encoded by the modulation device as recited the above.

In order to accomplish the above described objects, there is provided a modulation method for converting input data words of p bits into code words of q bits, concatenating adjacent ones of the code words with a merge bit sequence of r bits to form a code word sequence, and outputting the code word sequence, the modulation method comprising: a first step of converting the input data words of p bits into the code words of q bits while prefetching at least a current code word, a next code word, and a further next code word; a second step of generating a plurality of code word sequences by temporarily concatenating the current code word and the next code word with each of a plurality of merge bit sequences of the r bits respectively to prepare a plurality of code word sequences with the run-length limiting rule conformed, and then temporarily concatenating at least the further next code word and the next code word of each code word sequence with each of the plurality of merge bit sequences of the r bits to prepare a large number of code word sequences from the current code word to the further next code word with the run-length limiting rule RLL conformed; a third step of calculating the DSV value of each of the large number of code word sequences as generated in the second step; a fourth step of selecting one code word sequence having an absolute DSV value as calculated in the third step closest to zero among the large number of code word sequences; and a fifth step of outputting a final code word sequence finally determined by concatenating the current code word and the next code word with the merge bit sequence which is inserted between the current code word and the next code word of the one code word sequence as selected in the fourth step, wherein specific data is input for a predetermined period as the input data and the input data word is encoded by the p-q modulation scheme, the specific data comprising alternating current signals or direct current signals which would cause a modulation device that prefetches only the next code word to output a code word sequence which includes particular frequency components.

In accordance with a preferred embodiment of the present invention, when the specific data which is not distinctively audible is input for the predetermined period while the input data words comprise music information, the specific data is inserted to the gap of silence between adjacent performances of music.

In accordance with another preferred embodiment of the present invention, when the specific data which is not distinctively audible is input for the predetermined period while the input data words comprise music information, the specific data is inserted to an area located within the gap of silence between adjacent performances of music but located outside of the area given the index number 00.

In order to accomplish the above described objects, there is provided a recording medium on which is recorded the code word sequence encoded by the modulation method as recited the above.

The nature, principle and utility of the invention will become more apparent from the following detailed description when read in conjunction with the accompanying drawings.

BRIEF DESCRIPTION OF THE DRAWINGS

In the accompanying drawings:

FIG. 2 is a table for use in an 8–14 modulation;

FIGS. 8A and 8B are schematic diagrams for explaining an encoding scheme in the modulation device permitting a maximum run-length which does not satisfy the run-length limiting rule included in the CD standards according to the first embodiment of the present invention;

FIGS. 19A through 19C are views for explaining the calculation of the DSV values for a large number of code word sequences prepared, when a current code word and a next code word are concatenated with respective one of merge bit sequences without conforming to the run-length limiting rule included in the CD standards, by prefetching the current code word and the next code word together with a further next code word, temporarily concatenating the current code word and the next code word with a merge bit sequence (000) and further temporarily concatenating the next code word and the further next code word with each of three merge bit sequences (000), (001) and (010);

FIGS. 20A through 20C are views for explaining the calculation of the DSV values for a large number of code word sequences prepared, when a current code word and a next code word are concatenated with respective one of merge bit sequences without conforming to the run-length limiting rule included in the CD standards, by prefetching the current code word and the next code word together with a further next code word, temporarily concatenating the current code word and the next code word with a merge bit sequence (001) and further temporarily concatenating the next code word and the further next code word with each of three merge bit sequences (000), (001) and (010);

FIGS. 21A through 21C are views for explaining the calculation of the DSV values for a large number of code word sequences prepared, when a current code word and a next code word are concatenated with respective one of merge bit sequences without conforming to the run-length limiting rule included in the CD standards, by prefetching the current code word and the next code word together with a further next code word, temporarily concatenating the current code word and the next code word with a merge bit sequence (010) and further temporarily concatenating the next code word and the further next code word with each of three merge bit sequences (000), (001) and (010);

FIG. 22 is a block diagram schematically explaining the modulation device and the modulation method according to a third embodiment of the present invention;

FIGS. 23A through 23C are views for explaining the calculation of the DSV values for a large number of code word sequences prepared, when a current code word and a next code word are concatenated with respective one of merge bit sequences while conforming to the run-length limiting rule included in the CD standards, by prefetching the current code word and the next code word together with a further next code word, temporarily concatenating the current code word and the next code word with a merge bit sequence (000) and further temporarily concatenating the next code word and the further next code word with each of three merge bit sequences (000), (001) and (010);

FIGS. 24A through 24C are views for explaining the calculation of the DSV values for a large number of code word sequences prepared, when a current code word and a next code word are concatenated with respective one of merge bit sequences while conforming to the run-length limiting rule included in the CD standards, by prefetching the current code word and the next code word together with a further next code word, temporarily concatenating the current code word and the next code word with a merge bit sequence (001) and further temporarily concatenating the next code word and the further next code word with each of three merge bit sequences (000), (001) and (010); and FIGS. 25A through 25C are views for explaining the calculation of the DSV values for a large number of code word sequences prepared, when a current code word and a next code word are concatenated with respective one of merge bit sequences while conforming to the run-length limiting rule included in the CD standards, by prefetching the current code word and the next code word together with a further next code word, temporarily concatenating the current code word and the next code word with a merge bit sequence (010) and further temporarily concatenating the next code word and the further next code word with each of three merge bit sequences (000), (001) and (010).

DESCRIPTION OF THE PREFERRED EMBODIMENS

Figure 1:
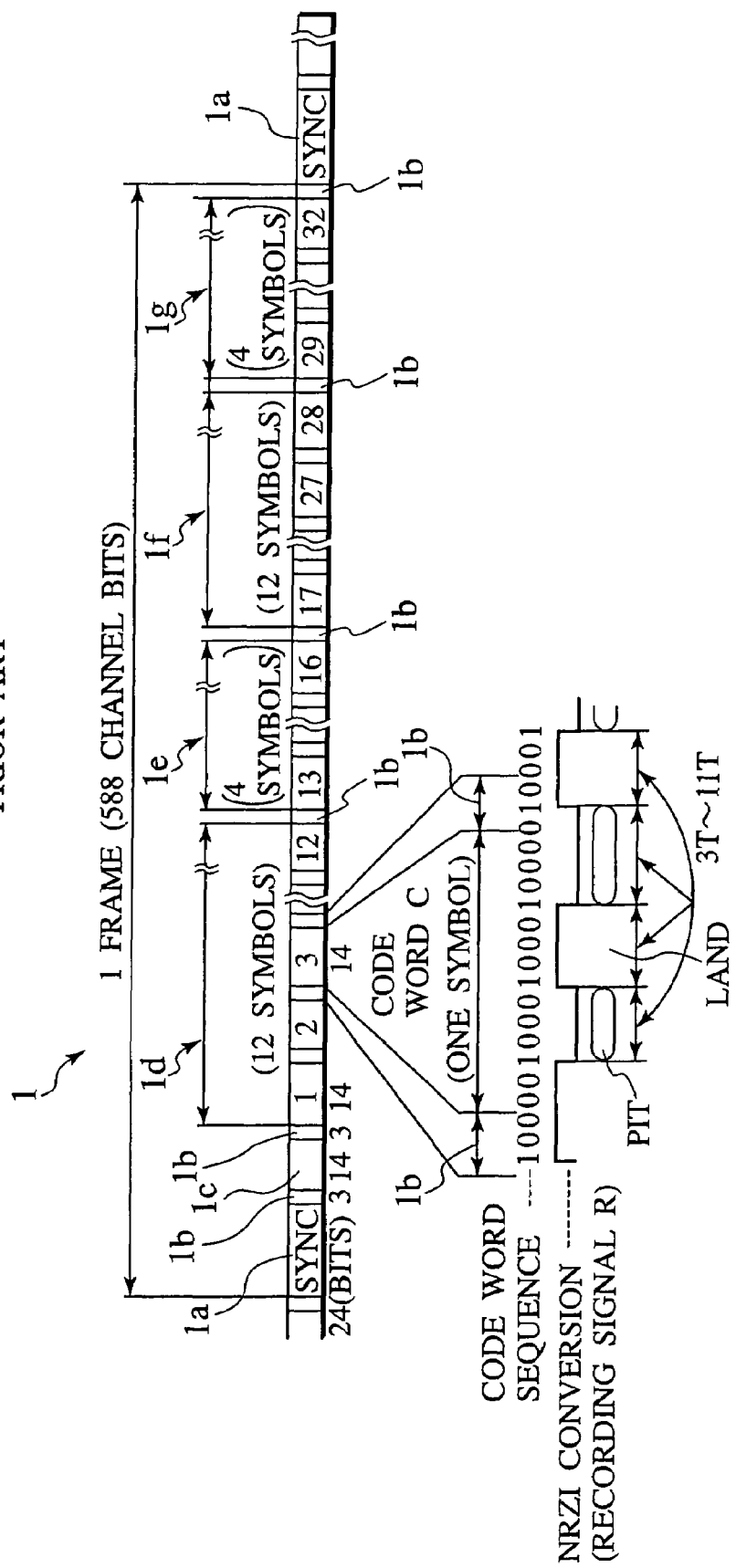
FIG. 1 is a view for explaining the format of EFM signals of music information recorded on a CD.
Figures 3A, 3B:
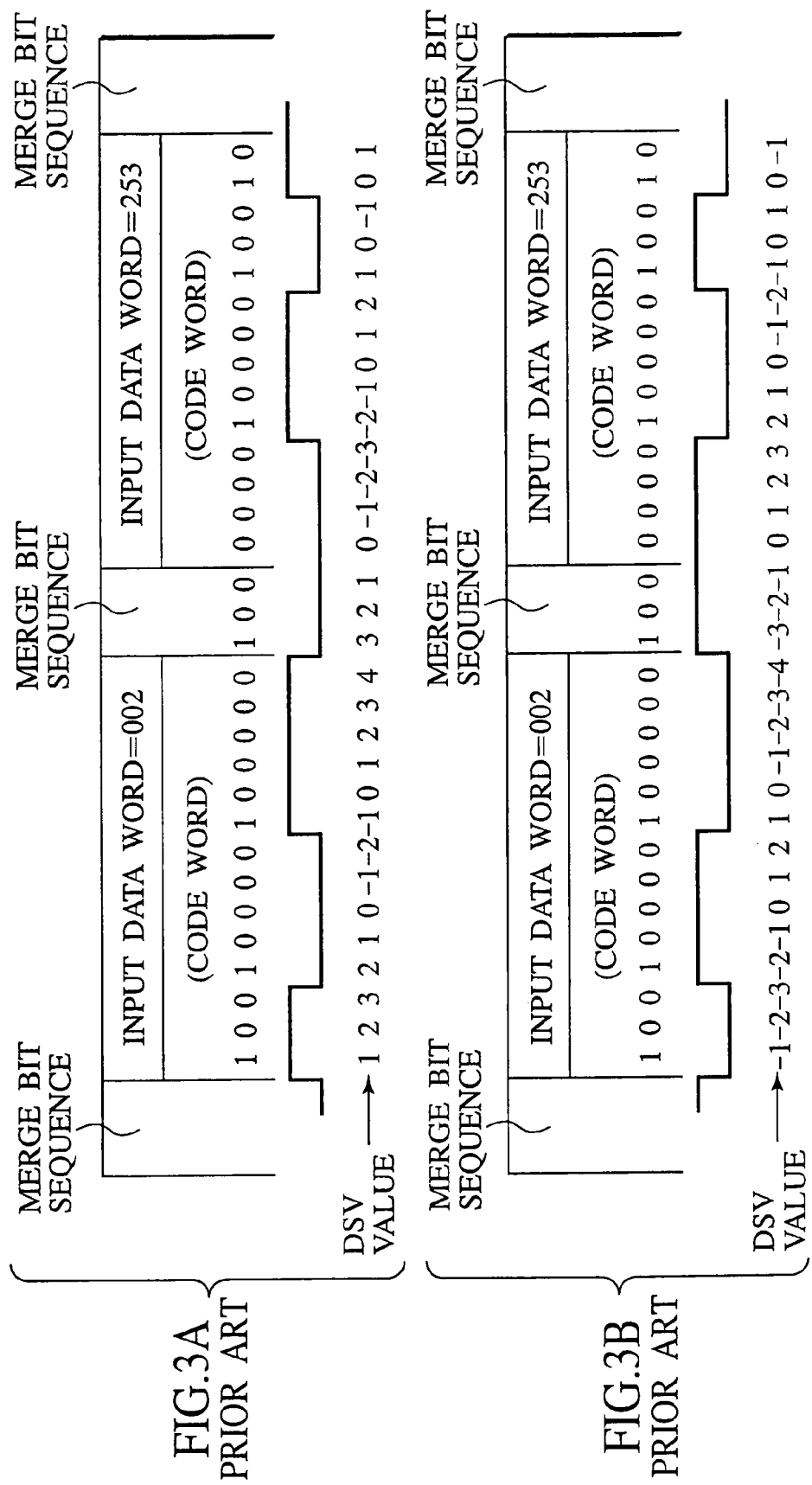
FIGS. 3A and 3B are views for explaining a DSV control scheme applied after the 8–14 modulation.

Hereinafter, with reference to the drawings of FIG. 7 through FIG. 25C, embodiments of the modulation device, the modulation method and the recording medium of the present invention will be explained in detail.

<First Embodiment>

Described first is the first embodiment of the present invention, i.e., a modulation device, a modulation method and a recording medium capable of preventing in advance, copy of digital information signals recorded in a recording medium such as an optical disc and a digital magnetic tape by generating a code word sequence without conforming to a predetermined run-length limiting rule but ensuring that an original recording medium on which the code word sequence is recorded can be played back by means of a player that has been commercially available while disabling a copied recording medium, into which the digital information signals are copied, from being played back.

According to the modulation device, the modulation method and the recording medium of the first embodiment of the present invention applied in conformity with the CD standards for example, EFM signals 1 are generated by converting each input data word of p bits (=8 bits) into a code word C of q bits (=14 bits) and concatenating adjacent code words C and C with a merge bit sequence 1$b$ of three bits. Particularly, the first embodiment is characterized in that the EFM signals 1 are generated by inserting between adjacent code words C and C with a merge bit sequence 1$b$ of r bits free from the restriction of the minimum run-length of $(d+1)T=3T$ and the maximum run-length of $(k+1)T=11T$ based on the run-length limiting rule RLL (2, 10) included in the CD standards but permitting the minimum run-length of $(d+1)T=3T$ and the maximum run-length of $(k+2)T=12T$. The first embodiment is characterized further in that, the playback operation is normally performed with an original recording medium on which are recorded first and second code word sequences 1$d$ and 1$f$ including specific data to be hereinafter described, while during the playback operation of a copied recording medium, as a copy of the original recording medium, the reproduced signals of the first and second code word sequences 1$d$ and 1$f$ include particular frequency components which are increased to hinder the normal playback operation.

It is to be noted that, even though the original recording medium includes the first and second code word sequences 1$d$ and 1$f$ as specific data in the form of a pit sequence (or land sequence) of the maximum run-length 12T that does not satisfy the conventional CD standards, the code word C itself is not influenced so that no read errors occur.

Meanwhile, in the first embodiment to be hereinafter described, the recording medium illustrated as an exemplary medium for recording digital information signals is an optical disc such as CD, CD-ROM. However, the technical concept of the first embodiment is applicable to a digital magnetic tape for recording digital information signals as explained above.

Figure 7:
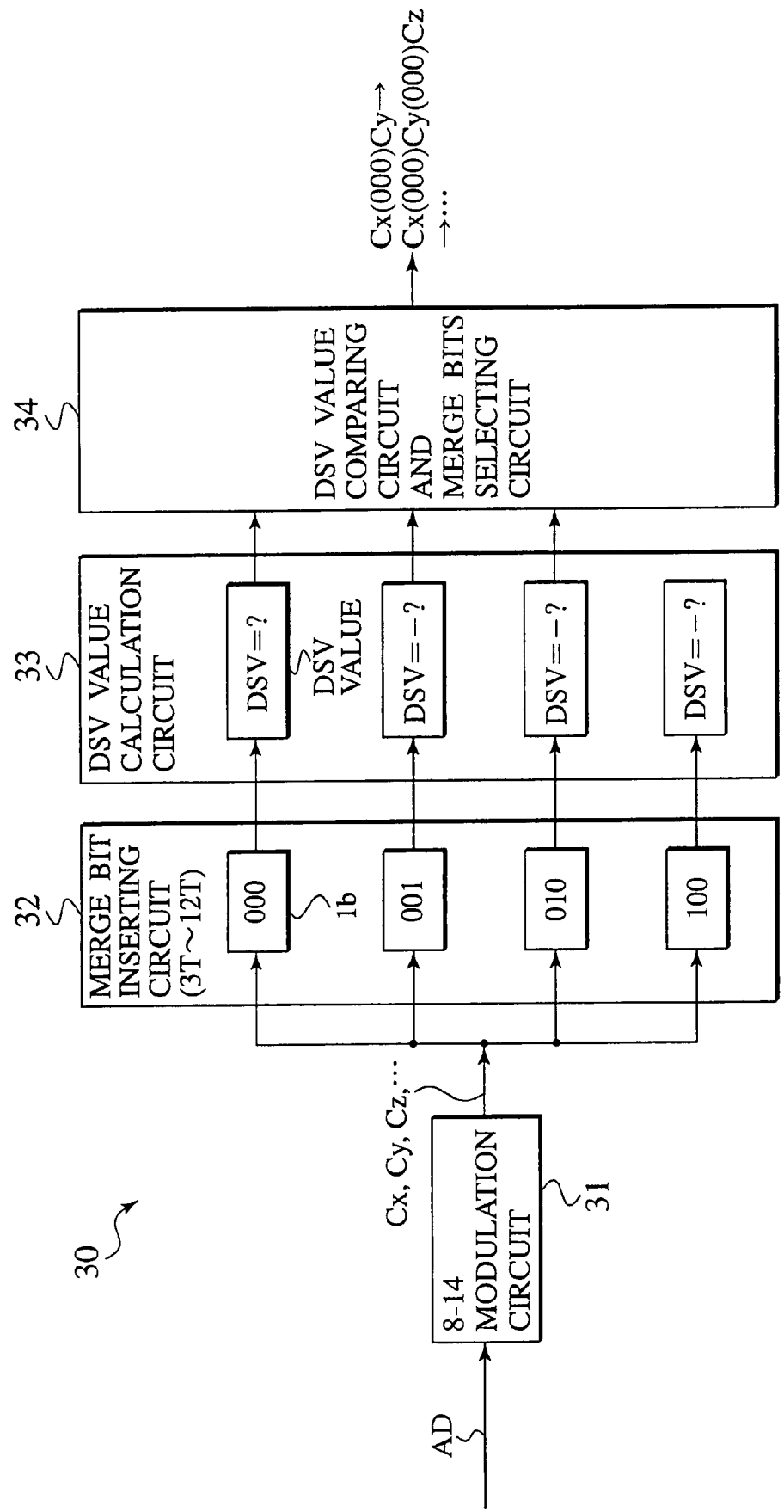
FIG. 7 is a block diagram schematically explaining the modulation device and the modulation method according to a first embodiment of the present invention.
Figure 9:
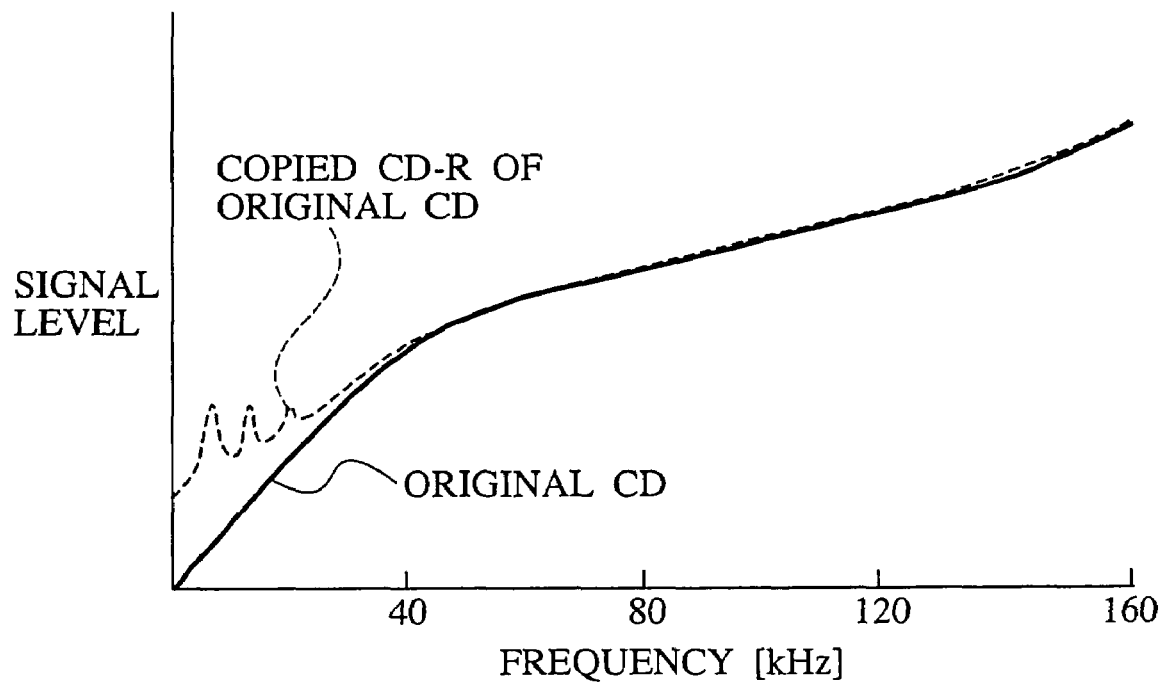
FIG. 9 is a graphic diagram showing the difference in frequency spectrum associated with the fluctuation of the DSV value between when code word sequences on an original CD according to the first embodiment of the present invention are reproduced and when code word sequences on a CD-R, to which the original CD is copied, are reproduced.

FIG. 7 is a block diagram schematically explaining the modulation device and the modulation method according to the first embodiment of the present invention. FIGS. 8A and 8B are schematic diagrams for explaining an encoding scheme in the modulation device permitting a maximum run-length which does not satisfy the run-length limiting rule included in the CD standards according to the first embodiment of the present invention. FIG. 9 is a graphic diagram showing the difference in frequency spectrum associated with the fluctuation of the DSV value between when code word sequences on an original CD according to the first embodiment of the present invention are reproduced and when code word sequences on a CD-R, to which the original CD is copied, are reproduced.

A modulation device 30 according to the first embodiment of the present invention as shown in FIG. 7 is applicable to a glass master disc recording apparatus (not shown in the figure) for producing CDs and generally composed of an 8–14 modulation circuit 31, a merge bit inserting circuit 32, a DSV value calculation circuit 33, and a DSV value comparing circuit and merge bit selecting circuit 34.

The modulation device 30 according to the first embodiment serves to output a final single code word sequence which is generated by dividing music original data AD of 16 bits into upper eight bits and lower eight bits as input data words, converting the respective input data words D of eight bits into the respective code words C of 14 bits, temporarily concatenating the respective code words with intervening merge bit sequences of three bits to generate a plurality of code word sequences, selecting one sequence, whose absolute DSV value is closest to zero, from among the plurality of code word sequence as the final single code word sequence. The merge bit sequences are inserted, for example, between each adjacent code words of a current code word Cx, a next code word Cy next to the code word Cx, a further next code word Cz next to the code word Cy . . . . In the concatenating step, the plurality of code word sequences are generated by the use of all the valid combinations of three bits, as valid merge bit sequences which are selected free from the restriction of the minimum run-length of $(d+1)T=3T$ and the maximum run-length of $(k+1)T=11T$ based on the run-length limiting rule RLL(d, k) (=RLL(2, 10)) included in the CD standards but permitting the minimum run-length of $(d+1)T=3T$ and the maximum run-length of $(k+1)T=11T$.

More specifically explaining, in the case of the modulation device 30 according to the first embodiment, the music original data AD of 16 bits is input to the 8–14 modulation circuit 31 in chronological order.

In the 8–14 modulation circuit 31 as described above, the music original data AD as input is divided into an input data word D of upper eight bits and an input data word D of lower eight bits to generate a series of input data words D of eight bits in chronological order, followed by successively converting the respective input data words D of eight bits into code words C of 14 bits with reference to the coding table as shown in FIG. 2, in which for example a current code word Cx, a next code word Cy next to the code word Cx, a further next code word Cz next to the code word Cy, . . . are read in sequence.

Then, while the current code word Cx and the next code word Cy are input to the merge bit inserting circuit 32 from the 8–14 modulation circuit 31, the code word Cz is input to the merge bit inserting circuit 32 from the 8–14 modulation circuit 31 after concatenating the code word Cx and the code word Cy with a merge bit sequence 1$b$ which is selected in order to have the best DSV value.

Unlike the conventional modulation device 20 as described above with reference to FIG. 4, the merge bit inserting circuit 32 serves to insert a merge bit sequence of three bits 1b between adjacent code words C and C free from the restriction of the minimum run-length 3T and the maximum run-length 11T based on the run-length limiting rule RLL (2, 10) included in the CD standards, but instead permitting the minimum run-length of 3T and the maximum run-length of 12T. Four bit sequences of (000), (001), (010) and (100) are prepared in this merge bit inserting circuit 32 as candidates of the merge bit sequence of three bits 1b. Also, in this first embodiment, like the conventional example, the remaining four sequences, i.e., (011), (101), (110) and (111) cannot satisfy the minimum run-length 3T and therefore are removed from consideration because two or more 1's appear successively or with an intervening "0".

In this case, while the merge bit sequence is selected free from the restriction of the minimum run-length 3T and the maximum run-length 11T based on the run-length limiting rule RLL(2, 10) included in the CD standards, but instead permitting the minimum run-length of 3T and the maximum run-length of 12T, the minimum number of successive 0's occurring between adjacent logic 1's is d (=2) conforming to the minimum run-length of (d+1)T=3T while the maximum number of successive 0's occurring between adjacent logic 1's is k+1 (=11) conforming to the maximum (k+2)T (=12T).

Then, the four merge bit sequences (000), (001), (010) and (100) are temporarily inserted, respectively between the current code word Cx and next code word Cy which are input to the merge bit inserting circuit 32 to generate a plurality of code word sequences.

In this situation, the following characteristics are obtained by permitting the maximum run-length 12T not conforming to the maximum run-length 11T included in the CD standards. As illustrated in FIGS. 8A and 8B, for example, the current code word Cx has "010" from the 12th bit to the 14th bit. The code word Cy is input as a code word of "10000100000000" which is obtained by converting the input data word "001" into the 14 bit data. The current code word Cx has "1" at the 13th bit position while the next code word Cy has "1" at the first bit position. Thereby, out of the four merge bit sequences as described above, the first merge bit sequence (000) satisfies the restriction of the minimum run-length 3T and the maximum run-length 11T while the other three merge bit sequences (001), (010) and (100) don't conform to the minimum run-length 3T and therefore are determined not to be inserted.

Then, after inserting the first merge bit sequence (000) between the code words Cx and Cy, the resultant code word sequence {Cx(000)Cy} is input to the DSV value calculation circuit 33 to calculate the DSV value thereof, as in cases 11 and 12 illustrated in FIGS. 8A and 8B. The first code word sequence {Cx(000)Cy} and the corresponding DSV value thereof (=+4) are input to the DSV value comparing circuit and merge bit selecting circuit 34.

Thereafter, since only one code word sequence is input to the DSV value comparing circuit and merge bit selecting circuit 34, the DSV value comparing circuit and merge bit selecting circuit 34 immediately outputs the code word sequence {Cx(000)Cy} as a final single code word sequence, without performing particular comparison of DSV values or particular selection of a merge bit sequence 1b corresponding to the best DSV value.

Next, after obtaining the final single code word sequence {Cx(000)Cy}, the merge bit inserting circuit 32 receives the code word Cz from the 8–14 modulation circuit 31 in order to insert a merge bit sequence 1b for obtaining the best DSV value between the code word Cy in the final single code word sequence {Cx(000)Cy} and the code word Cz.

In this case, as illustrated in FIGS. 8A and 8B, the code word Cz is input, for example, as "10000000010010" which is obtained by converting the input data word "249" into the 14 bit data.

In the merge bit inserting circuit 32 as described above, the code word Cy in the final single code word sequence {Cx(000)Cy} and the code word Cz are temporarily concatenated with each of four the merge bit sequences (000), (001), (010) and (100) in order to generate a plurality of code word sequences.

At this time, since the 6th bit of the code word Cy is "1" while the first bit of the code word Cz is "1", the two merge bit sequences (000) and (100) satisfies the restriction of the minimum run-length 3T and the maximum run-length 11T while the other two merge bit sequences (001) and (010) don't conform to the minimum run-length 3T and therefore are determined not to be inserted.

Then, in the case 11 as illustrated in FIG. 8A, the code word Cy in the previous final single code word sequence {Cx(000)Cy} and the code word Cz is concatenated with the merge bit sequence (000) to obtain the code word sequence {Cx(000)Cy(000)Cz} in which eleven 0's appears successively from the 7th bit of the code word Cy to the third bit of the merge bit sequence (000). The code word sequence {Cx(000)Cy(000)Cz} therefore includes the maximum run-length 12T.

On the other hand, in the case 12 as illustrated in FIG. 8B, the code word Cy in the previous final single code word sequence {Cx(000)Cy} and the code word Cz is concatenated with the merge bit sequence (100) to obtain the code word sequence {Cx(000)Cy(100)Cz} in which eight 0's appears successively from the 7th bit of the code word Cy to the first bit of the merge bit sequence (100). The code word sequence {Cx(000)Cy(100)Cz} therefore includes the maximum run-length 9T which satisfies the maximum run-length 12T as well as the maximum run-length 11T included in the CD standards like in the conventional example.

Thereafter, the DSV value calculation circuit 33 receives the two code word sequences {Cx(000)Cy(000)Cz} and {Cx(000)Cy(100)Cz} which are obtained by the merge bit inserting circuit 32 in order to calculate the respective DSV values of the code word sequences. In the case 11 as shown in FIG. 8A, the DSV value of the code word sequence {Cx(000)Cy(000)Cz} is −1. On the other hand, in the case 12 as shown in FIG. 8B, the DSV value of the code word sequence {Cx(000)Cy(100)Cz} is +9. The two code word sequences {Cx(000)Cy(000)Cz} and {Cx(000) are input to the DSV value comparing circuit and merge bit selecting circuit 34 together with the corresponding DSV values.

Next, the DSV value comparing circuit and merge bit selecting circuit 34 selects the code word sequence {Cx(000)Cy(000)Cz} from among the two code word sequences {Cx(000)Cy(000)Cz} and {Cx(000)Cy(100)Cz} as a final single code word sequence {Cx(000)Cy(000)Cz} having the DSV value (=−1) that is closest to zero among the respective DSV values. The above described procedure is repeated, for example, with the final single code word sequence {Cx(000)Cy(000)Cz} as the next previous final single code word sequence to be concatenated with the next code word and an intervening merge bit sequence, in order to obtain the final single code word sequence {Cx(000)Cy(000)Cz . . . }.

Meanwhile, for the purpose of generating the maximum run-length 12T in the combination of adjacent code words C and a merge bit sequence 1b, the merge bit sequence 1b is selected in order that the bit sequence made of the adjacent code words concatenated with the merge bit sequence $1b$ includes successive eleven 0's like as "the code word Cy and the code word Cz" shown in FIG. 8A.

The basic operation of the modulation device and the modulation method according to the first embodiment of the present invention have been explained thus far with reference to the specific examples. However, for the purpose of facilitating the understanding, the calculation of the DSV value is explained here with the expressions such as the code word sequences {Cx(000)Cy}, {Cx(000)Cy(000)}, {Cx(000)Cy(000)Cz} and {Cx(000)Cy(000)Cz . . . }, giving the impression that the DSV value of the code word sequence having been already determined is calculated again together with the subsequent word. As a result, the reception of all the code words Cx, Cy, Cz . . . might be mistaken as indispensable to start the calculation of the DSV value and also to output a final code word sequence. However, in the actual implementation, a DSV value storage circuit (not shown in the figure) is provided in the DSV value calculation circuit 33 or the merge bit selecting circuit 34 to save the DSV value for avoiding redundant calculation of the DSV value, and able to obtain a final single code word sequence when at least two code words are input.

Thereafter, the final code word sequence {Cx(000)Cy(000)Cz . . . } arranged for obtaining the best DSV value is converted into the recording signals R (FIG. 1) suitable for recording and recorded on a glass master disc for CD (not shown in the figure) by a laser beam. Then, the glass master disc for CD is used to prepare a stamper disc (not shown in the figure) which in turn is used to produce an optical disc (CD) 10 to be hereinafter described with reference to FIGS. 10A and 10B as the recording medium according to the first embodiment of the present invention.

When adjacent code words C and C are concatenated with a merge bit sequence $1b$ of three bits which is selected for obtaining the best DSV value, the modulation device 30 according to the present invention capable of generating the maximum run-length 12T is used to obtain a code word sequence having the smallest absolute DSV value among the code word sequences satisfying the maximum run-length 12T, as in the case 11 illustrated in FIG. 8A.

Contrary to this, it is easily understood from the above description that, when the conventional modulation device 20 (FIG. 4) excluding the maximum run-length 12T is used in the same manner as the case 12 illustrated in FIG. 8B, the DSV value is larger than that including the maximum run-length 12T. In this description, the maximum run-length 12T is explained as an example not conforming to the run-length limiting rule included in the CD standards. However, a longer maximum run-length such as 13T or longer, or a shorter maximum run-length of 2T or shorter can be used for the same purpose in the modulation device 30 according to the first embodiment. Also in this case, the DSV values of code word sequences can be further decreased as compared to the case with the conventional modulation device 20. However, from the view point of the optical transmission characteristics as explained in the above section of Related Art, it is undesirable to permit an extremely short run-length or an extremely long run-length.

Incidentally, in the case where there are successive code words to which the above described maximum run-length 12T is applicable for a certain period, the DSV value sometimes widely and periodically fluctuates for the period if code word sequences are generated by the conventional modulation device 20 because the DSV value of the code word sequence is increased recurrently in the same manner as shown in FIG. 8B. This is because, while the DSV value is upward sloping, i.e., positively glowing in the case as illustrated in FIG. 8B, the DSV value of the same code words Cx, Cy, Cz . . . is downward sloping, i.e., negatively glowing in the case where the polarity of the previous final code word sequence just before the first code word Cx is opposite. As a result, when reproducing signals recorded by the conventional modulation device 20, the reproduced signals of code word sequences include particular frequency components which are increased to hinder the normal playback operation. On the other hand, as apparent from the above explanation, a normal playback operation is possible when the recording is performed by the modulation device 30 according to the first embodiment. Input data corresponding to the particular code words which make such differences is referred to as specific data hereinbelow.

Even when an original recording medium is produced with a code word sequence which is generated permitting the minimum run-length 3T and the maximum run-length 12T in accordance with this technical concept, a copied recording medium, to which the original digital information on the original recording medium is copied, is created by concatenating adjacent code words C and C with the merge bit sequence of three bits $1b$ while conforming to the restriction of the minimum run-length 3T and the maximum run-length 11T based on the run-length limiting rule RLL(2, 10) included in the CD standards. And therefore, as apparent from the above explanation, particular frequency components are increased in the reproduced signals of the copied recording medium due to the fluctuation of the DSV value corresponding to the specific data including the maximum run-length 12T.

This fact is illustrated in FIG. 9. As shown in FIG. 9, a gentle downward slope is formed in the low frequency region of the reproducing frequency spectrum of the code word sequences corresponding to the specific data including the maximum run-length 12T as recorded on the original recording medium (CD). Contrary to this, particular frequency components are increased in the low frequency region of the reproducing frequency spectrum of the code word sequences reproduced from the copied recording medium (CD-R), to which the original digital information on the original recording medium is copied by the conventional modulation device 20.

Incidentally, in the case where the technical concept of the first embodiment is applied to CD-ROMs for recording computer data, the above explanation is applicable by replacing the music original data AD as shown in FIG. 7 with computer original data, and therefore redundant explanation is not repeated.

Figure 10A:
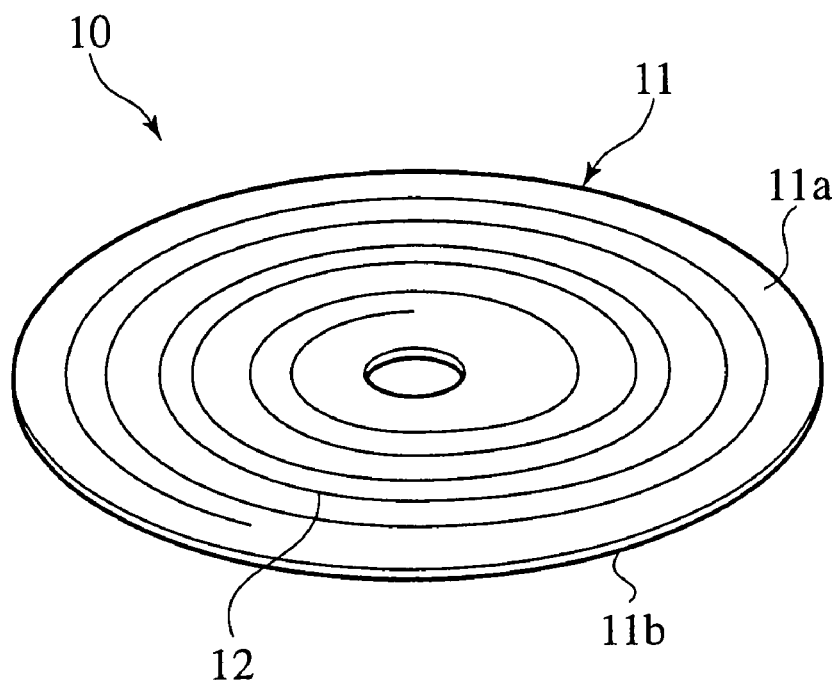
FIGS. 10A and 10B are a perspective view and a longitudinal cross sectional view for explaining the optical disc as a recording medium according to the first embodiment of the present invention.
Figure 10B:
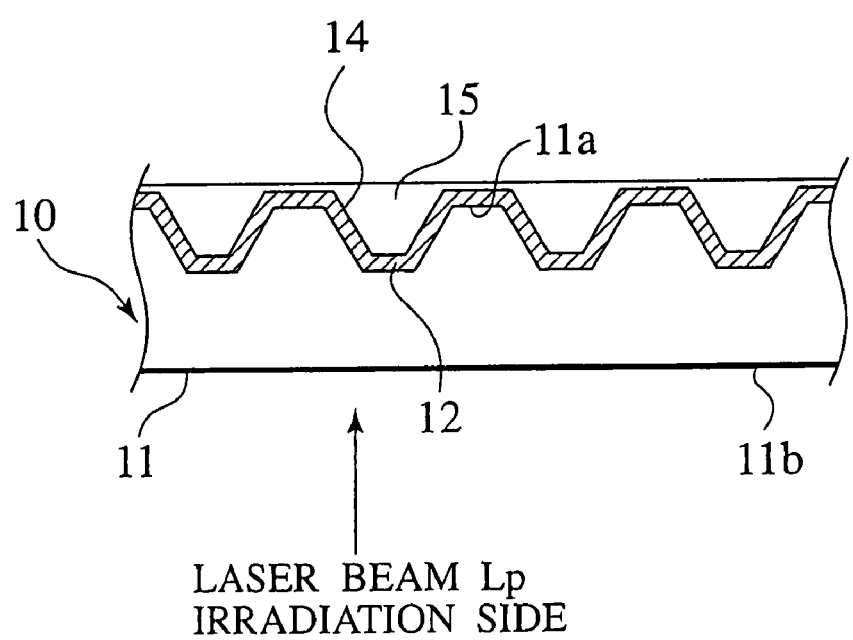

Next, the optical disc as a recording medium according to the first embodiment of the present invention will be explained with reference to FIGS. 10A and 10B. FIGS. 10A and 10B are a perspective view and a longitudinal cross sectional view for explaining the optical disc as a recording medium according to the first embodiment of the present invention.

As shown in FIGS. 10A and 10B, the optical disc 10 as a recording medium according to the first embodiment of the present invention (referred to as the original CD in the following explanation) is a read-only optical disc, such as CD for recording music information, CD-ROM for recording computer data. The digital information signals recorded on this original CD 10 is encoded by the modulation device 30 according to the first embodiment under the 8–14 modulation scheme in order that the minimum run-length of 3T and the maximum run-length of 12T are given the highest priority.

The original CD 10 as described above is produced as a transparent disc substrate in the form of a platter having an outer diameter of 120 mm or 80 mm, a central bore diameter of 15 mm and a thickness of 1.2 mm, on whose one side 11a a recording surface is formed by converting digital information signals into a digital bit sequence in the form of concave pits and convex lands, and engraving the bit sequence on spiral or concentric recording tracks 12.

In this case, convex and concave pits are formed over the entirety of the recording tracks 12 in accordance with a final single code word sequence which is generated, with the modulation device 30 according to the first embodiment as described above, by concatenating code words Cx, Cy and Cz . . . with merge bit sequences of three bits 1b that satisfies the minimum run-length 3T and the maximum run-length 12T and minimizes the absolute value of the DSV value. Furthermore, a reflective metallic film 14 and a protection film 15 are formed on the recording surface of the original CD 10 in this order to provide a read only disc as the original CD 10. During playback, a laser beam Lp is projected onto the surface 11b opposite the surface 11a of the transparent disc substrate 11.

The code word C of 14 bits itself recorded on the original CD 10 is in conformity with the CD standards so that, even if the maximum run-length 12T that does not conform to the CD standards is included, the data reproduced from the recording tracks 12 of the original CD 10 by a commercially available CD player agrees with the original data. On the other hand, when the input data words D include specific data for a certain period in which large DSV values are calculated under the run-length limiting rule included in the CD standards as illustrated in FIG. 8B, there are great fluctuation of the DSV value of the code word sequence generated from a optical disc copied by the conventional modulation device 20, while the fluctuation has a cycle corresponding to one frame or two frames of the code word sequence, and therefore the playback operation of the copied CD is unstable. Contrary to this, according to the first embodiment, the fluctuation of the DSV value of the code word sequence is improved by permitting the maximum run-length 12T which does not conform to the CD standards.

In the same manner, when a user create a copy of music original data AD (FIG. 7) including specific data as described above from an original CD 10 by means of a CD-R drive (not shown in the figure), since the CD-R drive is equipped with the conventional modulation device 20 (FIG. 4) as described above, a code word sequence is generated by concatenating adjacent code words C and C with the merge bit sequence of three bits 1b while conforming to the restriction of the minimum run-length of (d+1)T=3T and the maximum run-length of (k+1)T=11T based on the run-length limiting rule RLL(d, k)(=RLL (2, 10)) included in the CD standards. Therefore, the fluctuation of the DSV value of the code word sequence as generated from the CD-R is wider than that of the modulation device 30 according to the first embodiment, while the fluctuation has a cycle corresponding to one frame or two frames of the code word sequence. Accordingly, when this copied recording medium (CD-R) is played back by means of a commercially available CD player or CD-ROM drive, the reproduced signals generated therefrom include particular frequency components which are increased to hinder the normal operation of a binarization circuit, tracking servo, focusing servo, and so forth, and therefore the playback operation is unstable or impossible. By this configuration, even if the original CD 10 is copied to a recording medium (CD-R), it is therefore possible to forestall the infringement of copyright to the digital information signals. Meanwhile, if the fluctuation of the DSV value of the above described code word sequence is too wide, the stability of the operation of a player is adversely effected as explained in the section of Prior Art of Japanese Patent Application Laid-open No. Hei 6-197024, with which publication the description of the details of this known fact is dispensed with.

It is furthermore effective as copy protection measures to make use of specific data as encoded with alternating current signals or direct current signals which are not distinctively audible. In what follows, this case will be explained with reference to FIGS. 11A and 11B.

Figure 11A:
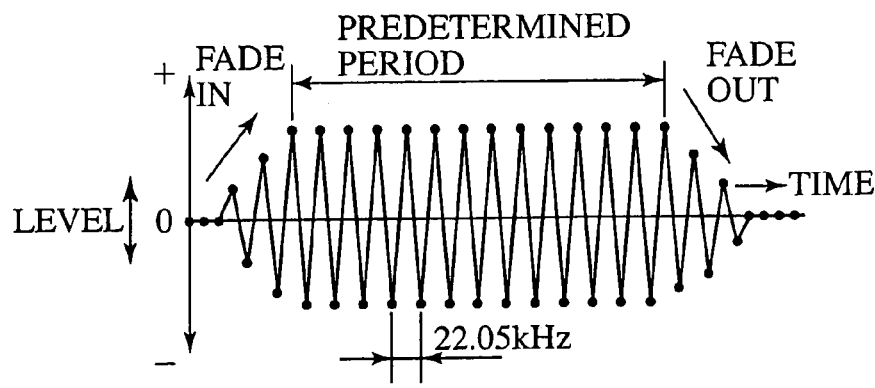
FIG. 11A is a graphic diagram showing the playback operation of an original CD according to the present invention produced by encoding specific data with alternating current signals which are not distinctively audible as music original data AD.
Figure 11B:
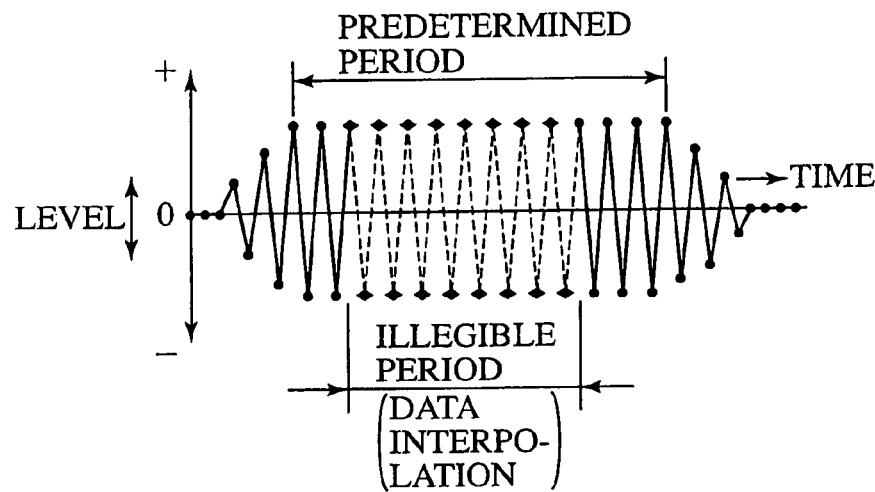
FIG. 11B is a graphic diagram showing the playback operation of a CD-R which is a copy of the original CD according to the present invention.
Figure 12A:
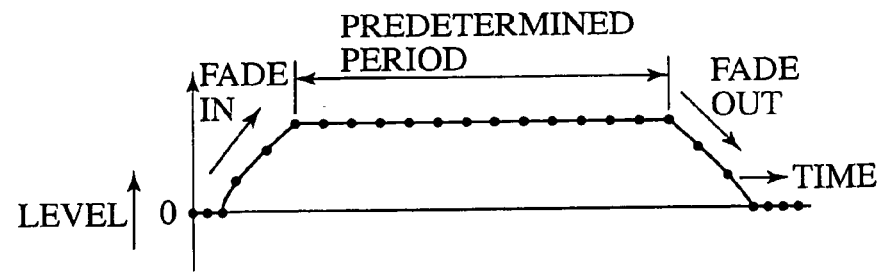
FIG. 12A is a graphic diagram showing the playback operation of an original CD according to the present invention produced by encoding specific data with direct current signals which are not distinctively audible as music original data AD.
Figure 12B:
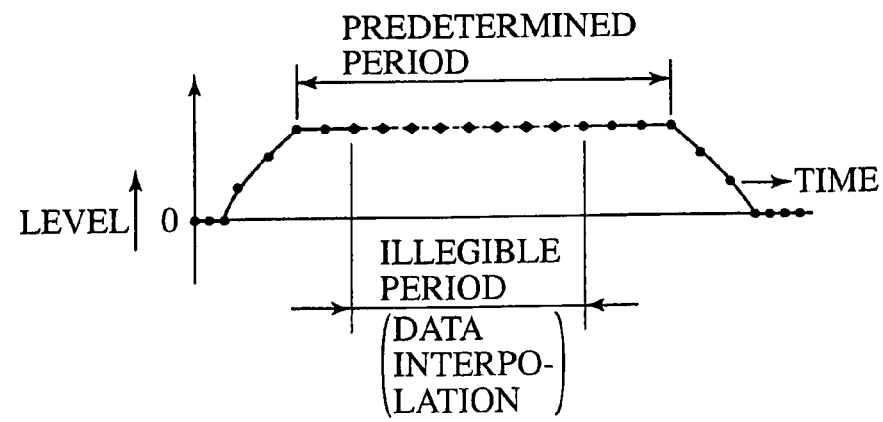
FIG. 12B is a graphic diagram showing the playback operation of a CD-R which is a copy of the original CD according to the present invention.

FIG. 11A is a graphic diagram showing the playback operation of an original CD according to the present invention produced by encoding specific data with alternating current signals which are not distinctively audible as music original data AD. FIG. 11B is a graphic diagram showing the playback operation of a CD-R which is a copy of the original CD according to the present invention. FIG. 12A is a graphic diagram showing the playback operation of an original CD according to the present invention produced by encoding specific data with direct current signals which are not distinctively audible as music original data AD. FIG. 12B is a graphic diagram showing the playback operation of a CD-R which is a copy of the original CD according to the present invention.

First, as illustrated in FIG. 11A, specific data is input, as music original data AD, to the 8–14 modulation circuit 31 provided within the modulation device 30 according to the first embodiment as shown in FIG. 7 for a predetermined period. The specific data is signals which are not distinctively audible, for example, alternating current signals of 22.05 KHz or the like. Then, the specific data comprising alternating current signals of 22.05 KHz or the like is converted into code words C of 14 bits to generate a final single code word sequence by concatenating a current code word Cx and a next code word Cy with a merge bit sequence 1b which is selected, free from the run-length limiting rule included in the CD standards but permitting the minimum run-length 3T and the maximum run-length 12T, in order to minimize the absolute value of the DSV value. The final single code word sequence is recorded on the original CD 10 (FIG. 10). When this original CD 10 is played back, the particular frequency components are not increased in the reproduced signals of the code word sequence. Accordingly, the playback operation is possible without trouble while the alternating current signals are not distinctively audible so that users don't notice the alternating current signals. Meanwhile, the specific data comprising the alternating current signals is introduced to fade in before the predetermined period and fade out after the predetermined period as shown in FIG. 11A for the purpose of avoiding the generation of noise before and after the specific data. This is one of the characteristics. In the case of music data, the gap of silence between adjacent performances of music is suitable for the predetermined period in which the specific data of the alternating current signals is inserted as described above.

On the other hand, if the original CD 10 is copied to a CD-R which is then played back, the particular frequency components are increased in the reproduced signals of a code word sequence during the predetermined period as described above and therefore an illegible period appears. Because of this, low frequency components are generated as noise due to the data interpolation in the player. For example, a user hears unpleasant sound such as "beep" and notices that this CD-R is not a normal optical disc. It is therefore possible to forestall the infringement of copyright to the digital information signals copied to the CD-R.

Next, FIG. 12A shows an example of replacing the alternating current signals as shown in FIG. 11A with specific data comprising direct current signals which are not distinctively audible as music original data AD. When the specific data is recorded on the original CD 10 (FIG. 10) as the recording medium according to the present invention, the particular frequency components are not increased in the reproduced signals of the code word sequence. Accordingly, the playback operation is possible without trouble while the alternating current signals are not distinctively audible so that users don't notice the alternating current signals. Incidentally, the specific data comprising the direct current signals is introduced to fade in before the predetermined period and fade out after the predetermined period as shown in FIG. 12A for the purpose of avoiding the generation of noise before and after the specific data. This is one of the characteristics. In the case of music data, the gap of silence between adjacent performances of music is suitable for the predetermined period in which the specific data of the direct current signals is inserted as described above.

On the other hand, also in the case where the original CD 10 including the specific data of the direct current signals is copied to a CD-R, an illegible period appears in the same manner as described above. Accordingly, also in this case, the copied CD-R cannot normally be played back and it is therefore possible to forestall the infringement of copyright to the digital information signals copied to the CD-R.

More specifically explained with reference to FIG. 13 through FIG. 17 is the case where a final single code word sequence is generated from input data words D to be p-q modulated as music information by converting the input data words D of p bits into code words C of q bits, concatenating a current code word Cx and a next code word Cy with a merge bit sequence 1b which is selected, free from the run-length limiting rule included in the CD standards but permitting the minimum run-length 3T and the maximum run-length 12T, in order to minimize the absolute value of the DSV value, while alternating current signals or direct current signals which are not distinctively audible are inserted to the gap of silence between adjacent performances of music.

Figure 13:
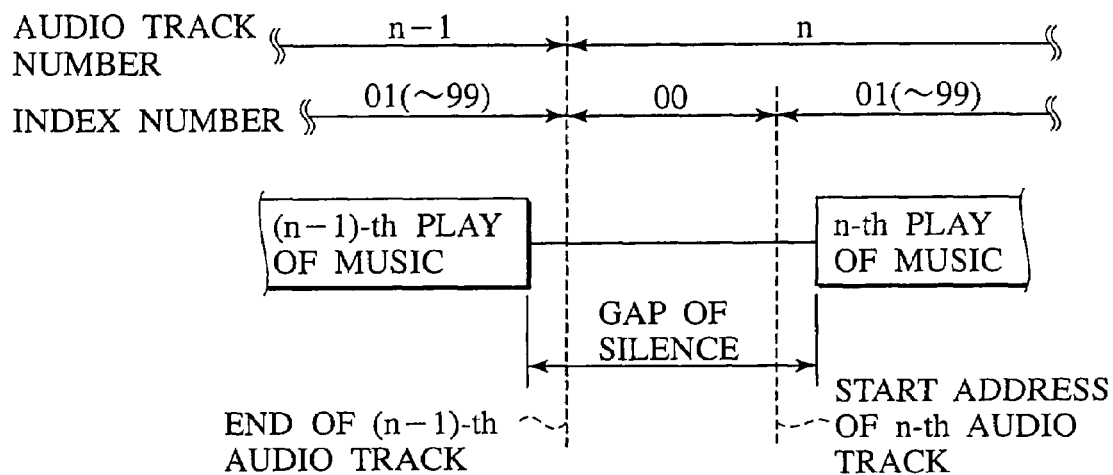
FIG. 13 is a schematic diagram for explaining the gap of silence between adjacent performances of music in a typical CD.
Figure 14:
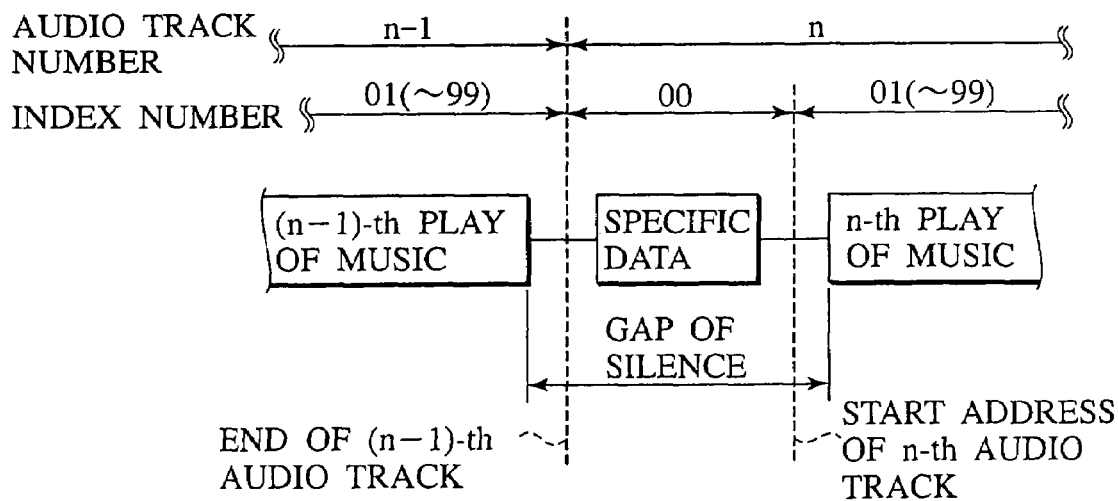
FIG. 14 is a schematic diagram for explaining a specific data insertion scheme 1 under which specific data which is not distinctively audible is inserted to the gap of silence between adjacent performances of music.
Figure 15:
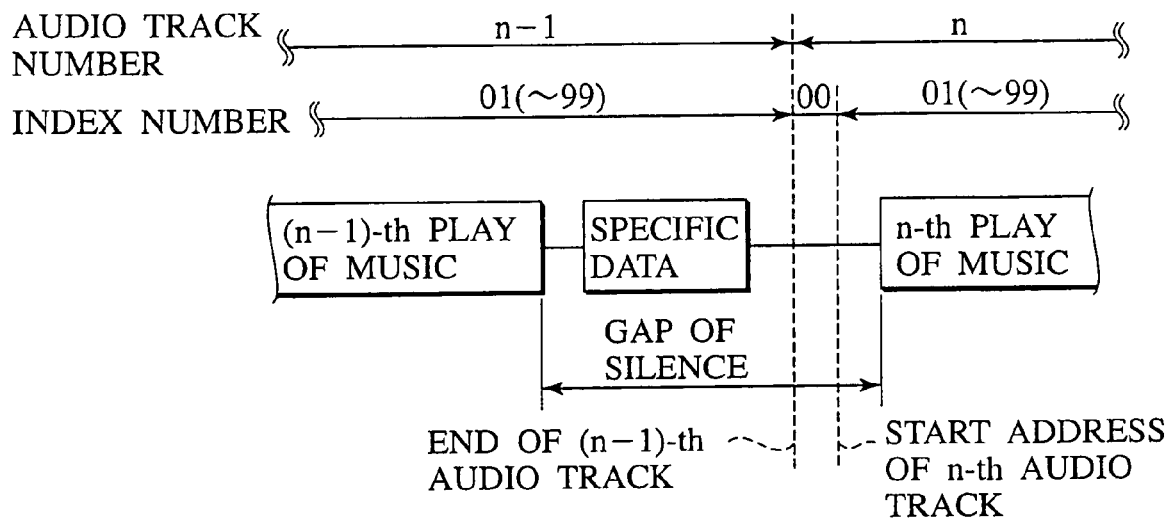
FIG. 15 is a schematic diagram for explaining a specific data insertion scheme 2 under which specific data which is not distinctively audible is inserted to the gap of silence between adjacent performances of music.
Figure 16:
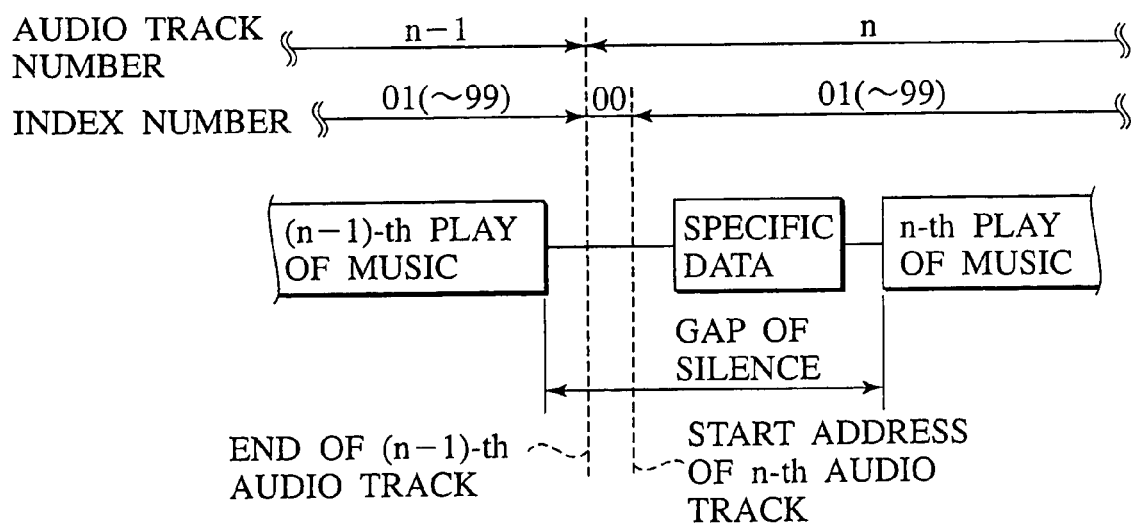
FIG. 16 is a schematic diagram for explaining a specific data insertion scheme 3 under which specific data which is not distinctively audible is inserted to the gap of silence between adjacent performances of music.
Figure 17:
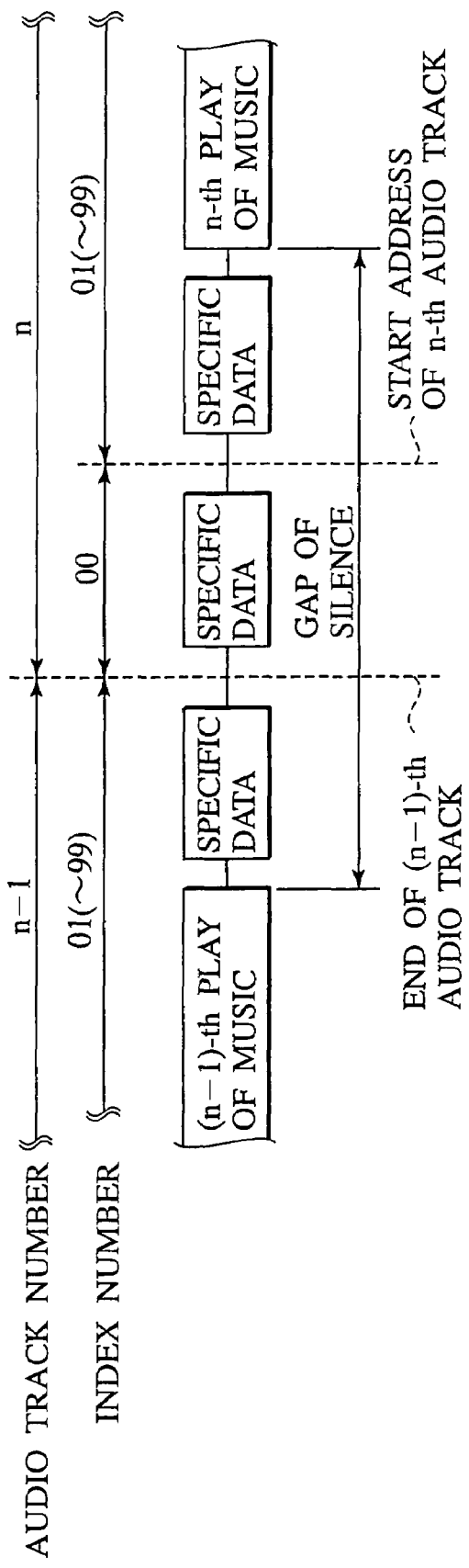
FIG. 17 is a schematic diagram for explaining a specific data insertion scheme 4 under which specific data which is not distinctively audible is inserted to the gap of silence between adjacent performances of music.

FIG. 13 is a schematic diagram for explaining the gap of silence between adjacent performances of music in a typical CD. FIG. 14 is a schematic diagram for explaining a specific data insertion scheme 1 under which specific data which is not distinctively audible is inserted to the gap of silence between adjacent performances of music. FIG. 15 is a schematic diagram for explaining a specific data insertion scheme 2 under which specific data which is not distinctively audible is inserted to the gap of silence between adjacent performances of music. FIG. 16 is a schematic diagram for explaining a specific data insertion scheme 3 under which specific data which is not distinctively audible is inserted to the gap of silence between adjacent performances of music. FIG. 17 is a schematic diagram for explaining a specific data insertion scheme 4 under which specific data which is not distinctively audible is inserted to the gap of silence between adjacent performances of music.

At this time, the gap of silence of a typical music CD is explained, as background information, in advance of explaining the ways of inserting specific data which is not distinctively audible to the gap of silence between adjacent performances of music of an original CD 10 (FIG. 10) as the recording medium according to the present invention.

Namely, in the case of a typical CD containing music information, as shown in FIG. 13, the start addresses of the respective audio tracks are recorded as a list of music contents in TOC (Table of Contents) of the lead-in area (not shown in the figure) which is located in the inside perimeter side in conformity with the CD format "Red Book standards". Furthermore, there are provided an audio track number, an index number, an address for each of the respective audio tracks recorded on the data areas of the audio tracks of a CD as illustrated in the figure.

More specifically speaking, if the number of audio tracks recorded on a CD is "n" (n is an integer no smaller than 2), a gap of silence is inserted, for example, between the (n−1)-th performance of music and n-th performance of music.

Also, while the audio track number n−1 corresponding to the (n−1)-th performance of music is recorded from the end of the audio track positioned just after the (n−2)-th performance of music (not shown in the figure) ends up to the end of the audio track positioned just after the (n−1)-th performance of music ends up, the end of the audio track positioned just after the (n−1)-th performance of music ends up is located within the gap of silence between the (n−1)-th performance of music and the n-th performance of music. Furthermore, the audio track number n corresponding to the n-th performance of music is recorded after the end of the (n−1)-th audio track corresponding to the (n−1)-th performance of music.

On the other hand, index numbers of from 01 to 99 at the maximum can be given to the (n−1)-th audio track and the n-th audio track respectively to indicate the order of the respective movements and the like. The index numbers 01 (to 99) is recorded for the (n−1)-th audio track from the start address (not shown in the figure) of the (n−1)-th audio track to the end of the audio track corresponding to this audio track number n−1, while the index numbers 01 (to 99) is recorded for the n-th audio track from the start address of the n-th audio track to the end of the audio track corresponding to this audio track number n. Generally speaking, the start address (not shown in the figure) of the (n−1)-th audio track and the start address of the n-th audio track fall respectively within the gap of silence between adjacent performances of music and located ahead of the respective performance of music.

In addition to this, there is provided an area given the index number 00 which is not associated with any performance of music. This area is located between the end of the audio track corresponding to the audio track number n−1 and the position pointed by the start address of the n-th audio track.

By this configuration, the (n−1)-th audio track terminates at the end of this audio track. On the other hand, the n-th audio track is started from the start address thereof.

In the case where an audio track number, an index number, a start address are provided for each of the respective audio tracks recorded on the data areas of the audio tracks as in the above described CD, specific data which is not distinctively audible is inserted to the gap of silence, for example, between the (n−1)-th performance of music and the n-th performance of music of an original CD 10 (FIG. 10) as the recording medium according to the present invention in accordance with any of the specific data insertion schemes 1 to 4 as shown in FIG. 14 to FIG. 17.

First, in the case of the specific data insertion scheme 1 on the recording medium according to the present invention, as shown in FIG. 14, the above described specific data is inserted to the gap of silence between the (n−1)-th performance of music and the n-th performance of music of an original CD 10 (FIG. 10) and within the area given the index number 00 as explained above.

By this configuration, when a copied recording medium of a CD-R is created by copying in whole an original CD 10 which is produced by inserting the specific data to the area given the index number 00, the copied CD-R includes the gap of silence between the (n−1)-th performance of music and the n-th performance of music in which the specific data is inserted to the area given the index number 00. The copied CD-R can not be normally played back due to an illegible period occurring in the same manner as described above, and therefore it is possible to forestall the infringement of copyright to the digital information signals copied to the CD-R.

However, when a copied CD-R is created by copying an original CD 10 which is produced by inserting the specific data to the area given the index number 00, a user can copy each audio track of the original CD 10 from the start address thereof by random access bypassing (avoiding) the gap of silence between the respective audio tracks. In this case, since the gap of silence between the respective audio tracks is not copied to the CD-R, no illegible period appears even playing back the copied CD-R and therefore the above copy-protection mechanism by the specific data on the original CD 10 is not effective on the copied CD-R. In order to deal with this shortcoming, the specific data insertion schemes 2 to 4 as shown in FIG. 15 to FIG. 17 are proposed in accordance with the present invention. In accordance with any one of the specific data insertion schemes 2 to 4, the respective specific data is necessarily copied even if the original CD 10 is copied to a CD-R by copying each audio track of the original CD 10 from the start address thereof bypassing the gap of silence between the respective audio tracks. The copy-protection mechanism of the original CD 10 is therefore furthermore effective.

Namely, in the case of the specific data insertion scheme 2 for the recording medium according to the present invention as shown in FIG. 15, within the gap of silence, for example, between the (n−1)-th performance of music and the n-th performance of music of an original CD 10, the end of the audio track corresponding to the audio track number n−1 is elongated toward the start address of the n-th audio track from the end of the audio track corresponding to the audio track number n−1 as shown in FIG. 14. The specific data as described above is inserted between the end of the (n−1)-th performance of music and the end of the audio track corresponding to the audio track number n−1 as elongated. The area given the index number 00 is shortened due to the elongation.

Not illustrated in the figure, the end of the audio track corresponding to the audio track number n−1 can be elongated to be aligned with the start address of the n-th audio track while the specific data is inserted between the end of the (n−1)-th performance of music and the start address of the (n−1)-th audio track. In this case, while the area given the index number 00 is eliminated, the n-th audio track is started from the start address of the n-th audio track which is the same address at which the (n−1)-th audio track terminates, resulting in no trouble.

Accordingly, when an original CD 10 is produced in accordance with the technical concept of the specific data insertion scheme 2 as illustrated in FIG. 15, the specific data which is not distinctively audible is inserted to the gap of silence between adjacent performances of music and within an area other than the area given the index number 00. The specific data is necessarily copied to a CD-R, even if the original CD 10 is copied to the CD-R by copying each audio track of the original CD 10 from the start address thereof bypassing the gap of silence between the respective audio tracks, because the (n−1)-th audio track is necessarily copied from the start address of the (n−1)-th audio track to the end of the (n−1)-th audio track including the gap of silence between the end of the (n−1)-th performance of music and the end of the audio track corresponding to the audio track number n−1. The copied CD-R can therefore not normally be played back because of the specific data. Of course, as apparent from the above explanation, the specific data is copied after the end of the (n−1)-th performance of music, even when a copied recording medium of a CD-R is created by copying in whole the original CD 10 produced in accordance with the technical concept of the specific data insertion scheme 2 as illustrated in FIG. 15.

Next, in the case of the specific data insertion scheme 3 for the recording medium according to the present invention as shown in FIG. 16, within the gap of silence, for example, between the (n−1-th performance of music and the n-th performance of music of an original CD 10, the position of the start address of the audio track corresponding to the audio track number n is moved toward the end of the audio track corresponding to the audio track number n−1 from the start address of the audio track corresponding to the audio track number n as shown in FIG. 14. The specific data as described above is inserted between the start address of the n-th audio track and the start of the n-th performance of music. The area given the index number 00 is shortened due to the movement. Furthermore, in this case, since the location of the start address of the n-th audio track is moved toward the (n−1)-th audio track, a silent condition from the location of the start address of the n-th audio track to the start of the n-th performance of music is extended a little. However, there is no problem if the period from the location of the start address of the n-th audio track to the start of the n-th performance of music is determined within the tolerable range of users.

Although not illustrated in the figure, the start address of the n-th audio track can be moved to be aligned with the end of the audio track corresponding to the audio track number n−1 while the specific data is inserted between the start address of the n-th audio track and the start of the n-th performance of music. Also in this case, while the area given the index number 00 is eliminated, the n-th audio track is started from the start address of the n-th audio track which is the same address at which the (n−1)-th audio track terminates, resulting in no trouble.

Accordingly, when an original CD 10 is produced in accordance with the technical concept of the specific data insertion scheme 3 as illustrated in FIG. 16, the specific data which is not distinctively audible is inserted to an area located within the gap of silence between adjacent performances of music but located outside of the area given the index number 00. The specific data is therefore necessarily copied to a CD-R, even if the original CD 10 is copied to the CD-R by copying each audio track of the original CD 10 from the start address thereof bypassing the gap of silence between the respective audio tracks, because the n-th audio track is necessarily copied from the start address of the n-th audio track to the end of the n-th audio track including the gap of silence between the start address of the n-th audio track and the start of the n-th performance of music. The copied CD-R can therefore not normally be played back because of the specific data as described above. Of course, as apparent from the above explanation, the specific data is copied after the start address of the n-th audio track, even when a copied recording medium of a CD-R is created by copying in whole the original CD 10 produced in accordance with the technical concept of the specific data insertion scheme 3 as illustrated in FIG. 16.

Next, in the case of the specific data insertion scheme 4 for the recording medium according to the present invention as shown in FIG. 17, an original CD 10 is produced in accordance with the combination of the specific data insertion scheme 1 as shown in FIG. 14, the specific data insertion scheme 2 as shown in FIG. 15 and the specific data insertion scheme 3 as shown in FIG. 16. In this case, the specific data is inserted between the end of the (n−1-th performance of music and the end of the audio track corresponding to the audio track number n−1, also inserted within the area given the index number 00, and further inserted between the start address of the n-th audio track and the start of n-th performance of music.

While FIG. 17 illustrates the combination of the specific data insertion schemes 1 through 3, at least two of the specific data insertion schemes 1 through 3 can be combined to produce an original CD 10.

Accordingly, the specific data is necessarily copied to a CD-R, even if an original CD 10 produced in accordance with the combination of at least two of the specific data insertion schemes 1 through 3 is copied to the CD-R by copying the original CD 10 in whole, or copying each audio track of the original CD 10 from the start address thereof bypassing the gap of silence between the respective audio tracks. The copied CD-R can therefore not normally be played back because of the specific data as described above.

While the modulation device, the modulation method and the recording medium according to the present invention as explained in detail is based on the EFM scheme (the 8–14 modulation scheme), the present invention is not limited to them in conformity with the CD standards. The technical concept as described above is applicable to other types of p-q modulation schemes as long as input data words D of p bits are converted into code words C of q bits in which adjacent code words C and C are concatenated with a merge bit sequence 1$b$ of r bits without conforming to the restriction of the minimum run-length of (d+1)T and the maximum run-length of (k+1)T based on the run-length limiting rule RLL(d, k) but conforming to the minimum run-length of (d+1)T and the maximum run-length of (k+2)T.

Furthermore, the technical concept as described above is applicable when a code word sequence is generated from input data words D to be p-q modulated as music information by converting input data words D of p bits into code words C of q bits, concatenating adjacent code words C and C with a merge bit sequence 1$b$ of r bits which is selected, free from the restriction of the minimum run-length of (d+1)T and the maximum run-length of (k+1)T based on the run-length limiting rule RLL(d, k), and satisfying the minimum run-length of (d+1)T and the maximum run-length of (k+2)T, but in order to minimize the absolute value of the DSV value, while specific data comprising alternating current signals or direct current signals which are not distinctively audible is inserted to the gap of silence between adjacent performances of music. Still further, the copy-protection mechanism can be more effective by inserting the specific data to an area located within the gap of silence between adjacent performances of music but located outside of the area given the index number 00.

In accordance with the modulation device, the modulation method and the recording medium of the first embodiment according to the present invention as explained in detail, a code word sequence is generated by converting input data words of p bits into code words C of q bits, concatenating adjacent code words with a merge bit sequence 1$b$ of r bits not to conforming to the restriction of the minimum run-length of (d+1)T and the maximum run-length of (k+1)T based on the run-length limiting rule RLL (d, k) but conform to the minimum run-length of (d+1)T and the maximum run-length of (k+2)T while controlling the DSV value. Since adjacent code words are concatenated with a merge bit sequence 1$b$ of r bits not to conform to the restriction of the minimum run-length of (d+1)T and the maximum run-length of (k+1)T based on the run-length limiting rule RLL(d, k) but conform to the minimum run-length of (d+1)T and the maximum run-length of (k+2)T, a recording medium including this code word sequence can be played back without any trouble, while the particular frequency components are increased in the reproduced signals of a code word sequence from a copied recording medium, onto which the original code word sequence is copied, and therefore the copied recording medium can not be played back due to the problematic DSV value. As a result, it is possible to forestall the infringement of copyright to the digital information signals copied to the recording medium for copy.

Also, when alternating current signals or direct current signals as input data words which are not distinctively audible are input to the modulation device according to the first embodiment of the present invention or by the modulation method according to the present invention for a predetermined period, and encoded by a p-q modulation to record the encoded data on a recording medium, a user hears, during the playback of the copied recording medium, unpleasant sound such as "deep" due to the DSV control error in an illegible period and notices that his medium is not normal. It is therefore possible to forestall the infringement of copyright to the digital information signals copied to the recording medium for copy.

Still further, according to the modulation device, the modulation method and the recording medium of the first embodiment according to the present invention as explained in detail, while input data words comprises music information, when specific data comprising alternating current signals or direct current signals which are not distinctively audible is input for a predetermined period, the playback operation of a copied recording medium, to which an original recording medium is copied, is made impossible by inserting the specific data as described above to the gap of silence between adjacent performances of music or to an area located within the gap of silence between adjacent performances of music but located outside of the area given the index number 00. It is therefore possible to forestall the infringement of copyright to the digital information signals copied to the recording medium for copy.

<Second Embodiment>

Next, described is the second embodiment of the present invention, i.e., a modulation device, a modulation method and a recording medium capable of preventing in advance, copy of digital information signals recorded in a recording medium such as an optical disc and a digital magnetic tape by generating a code word sequence without conforming to a predetermined run-length limiting rule but ensuring that an original recording medium on which the code word sequence is recorded can be played back by means of a player that has been commercially available while disabling a copied recording medium, into which the digital information signals are copied, from being played back.

In what follows, only the differences of the second embodiment from the first embodiment are described.

According to the modulation device, the modulation method and the recording medium of the second embodiment of the present invention, when conforming to the CD standards for example, EFM signals 1 are generated by converting each input data word of p bits (=8 bits) into a code word C of q bits (=14 bits) and concatenating adjacent code words C and C with a merge bit sequence 1b of three bits while at least a current code word, a next code word and a further next code are prefetched. Particularly, a final single code word sequence is obtained by concatenating each adjacent code words with a merge bit sequence 1b, free from the restriction of the minimum run-length of (d+1)T=3T and the maximum run-length of (k+1)T=11T based on the run-length limiting rule RLL(2, 10) included in the CD standards but permitting the minimum run-length of (d+1)T=3T and the maximum run-length of (k+2)T=12T, in order that the merge bit sequence 1b is selected with reference to the DSV values of at least a current code word, a next code word and a further next code. Then the final code word sequence comprising the current code word and the next code word is output together with the selected merge bit sequence 1b therebetween. Furthermore, the second embodiment is characterized in that, the playback operation is normally performed with an original recording medium on which are recorded first and second code word sequences 1d and 1f of the EFM signals 1 including specific data to be hereinafter described, while during the playback operation of a copied recording medium, as a copy of the original recording medium, the reproduced signals of the first and second code word sequences 1d and 1f include particular frequency components which are increased to hinder the normal playback operation.

Figure 18:
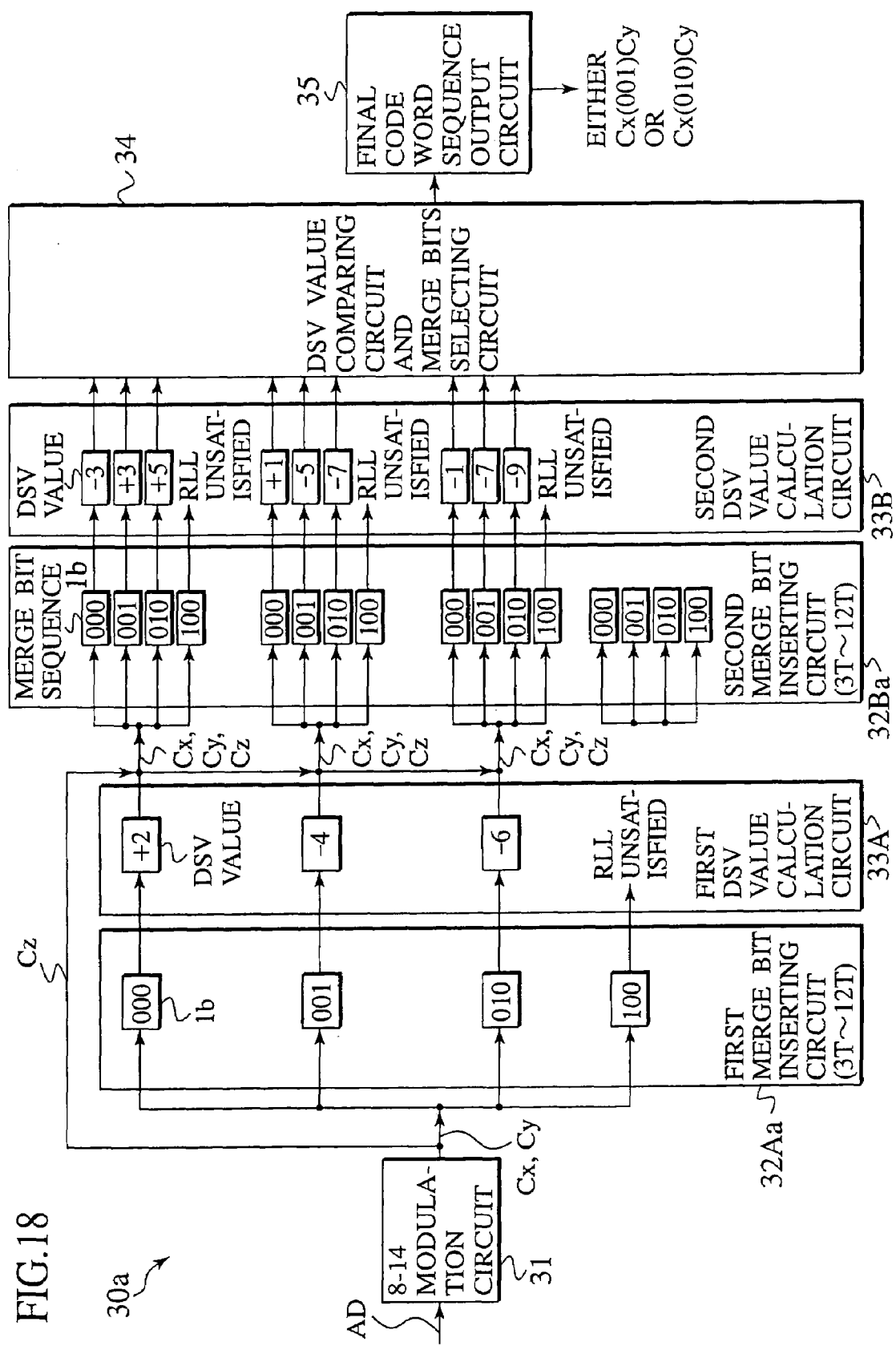
FIG. 18 is a block diagram schematically explaining the modulation device and the modulation method according to a second embodiment of the present invention.

FIG. 18 is a block diagram schematically explaining the modulation device and the modulation method according to the second embodiment of the present invention. FIG. 19 to FIG. 21 are schematic diagrams for explaining the variation of the DSV values of a plurality of code word sequences calculated in the encoding operation by the use of the modulation device according to the second embodiment of the present invention in which a current code word and a next code word are concatenated with a merge bit sequence, permitting a maximum run-length which does not conform to the run-length limiting rule included in the CD standards, while prefetching a current code word, a next code word and a further next code word.

A modulation device 30a according to the second embodiment of the present invention as shown in FIG. 18 is applicable to a glass master disc recording apparatus (not shown in the figure) for producing CDs and generally composed of an 8–14 modulation circuit 31, a first merge bit inserting circuit 32Aa, a first DSV value calculation circuit 33A, a second merge bit inserting circuit 32Ba, a second DSV value calculation circuit 33B, a DSV value comparing circuit and merge bit selecting circuit 34, and a final code word sequence output circuit 35.

The first and second merge bit inserting circuits 32Aa and 32Ba have the same internal structure, while the first and second DSV value calculation circuits 33A and 33B have the same internal structure. It is therefore possible, depending upon by the software for taking control of the modulation device 30 according to the second embodiment, to use only one merge bit inserting circuit functioning as the first and second merge bit inserting circuits 32Aa and 32Ba and only one DSV value calculation circuit functioning as the first and second DSV value calculation circuits 33A and 33B. However, for the purpose of facilitating the understanding, these separate circuits are used herein as described above.

The modulation device 30 according to the second embodiment serves to output EFM signals 1 which are generated by dividing music original data AD of 16 bits into upper eight bits and lower eight bits as input data words, converting the respective input data words D of eight bits into the respective code words C of 14 bits, temporarily concatenating the respective code words with intervening merge bit sequences of three bits. In the concatenating process, a plurality of code word sequences are generated by prefetching a current code word Cx, a next code word Cy and a further next code word Cz, and temporarily concatenating the current code word Cx and the next code word Cy with a respective one of merge bit sequences 1b of three bits, which are selected free from the run-length limiting rule RLL(2, 10) included in the CD standards but permitting the minimum run-length of (d+1)T=3T and the maximum run-length of (k+2)T=12T. Furthermore, by the use of the plurality of code word sequences as generated above, a plurality of code word sequences including the current code word Cx, the next code word Cy and the further next code word Cz are generated again by temporarily concatenating the next code word Cy and at least the further next code word Cz with a respective one of merge bit sequences 1b of three bits, which are selected also free from the run-length limiting rule RLL(2, 10) included in the CD standards but permitting the minimum run-length of (d+1)T=3T and the maximum run-length of (k+2)T=12T. Among from the plurality of the code word sequences, a code word sequence is selected whose absolute DSV value is closest to zero, and then the current code word Cx and the next code word Cy are concatenated with the merge bit sequence 1b therebetween of the selected code word sequence and output as a final single code word sequence.

More specifically explaining, in the case of the modulation device 30 according to the second embodiment, the music original data AD of 16 bytes is input to the 8–14 modulation circuit 31 in chronological order in the same manner as in the first embodiment.

In the 8–14 modulation circuit 31 as described above, the music original data AD as input is divided into an input data word D of upper eight bits and an input data word D of lower eight bits to generate a series of input data words D of eight bits in chronological order, followed by successively converting the respective input data words D of eight bits into code words C of 14 bits with reference to the coding table as shown in FIG. 2, in which when a current code word Cx is read, for example, a next code word Cy next to the code word Cx and a further next code word Cz are prefetched unlike the first embodiment.

Meanwhile, in the embodiment to be hereinafter described, a next code word Cy and a further next code word Cz are prefetched following a current code word Cx. However, not shown in the figure, it is possible to prefetch a still further next code word(s) after the further next code word Cz.

Then, while the current code word Cx and the next code word Cy are input to the first merge bit inserting circuit 32Aa from the 8–14 modulation circuit 31, the further next code word Cz is input, after outputting the next code word Cy, from the 8–14 modulation circuit 31 to the second merge bit inserting circuit 32Ba to be hereinafter described.

In the first merge bit inserting circuit 32Aa, four bit sequences of (000), (001), (010) and (100) are prepared as candidates of the merge bit sequence of three bits 1b selected free from the restriction of the minimum run-length 3T and the maximum run-length 11T based on the run-length limiting rule RLL(2, 10) included in the CD standards, but instead permitting the minimum run-length of 3T and the maximum run-length of 12T. Also in this second embodiment, like the first embodiment, the remaining four sequences, i.e., (011), (101), (110) and (111) cannot satisfy the minimum run-length 3T and therefore are removed from consideration because two or more 1's appear successively or with an intervening "0".

Then, the four merge bit sequences (000), (001), (010) and (100) are temporarily inserted, respectively between the current code word Cx and next code word Cy which are input to the merge bit inserting circuit 32 to generate a plurality of code word sequences.

In this case, as illustrated in FIGS. 19 to 21, for example, the current code word Cx and the next code word Cy are set to the same values as in the first embodiment for the purpose of facilitating the understanding the gist of the second embodiment. Namely, the current code word Cx has "010" from the 12th bit to the 14th bit while the next code word Cy is "00100010000010". Thus the current code word Cx has "1" at the 13th bit position while the next code word Cy has "1" at the third bit position. Thereby, out of the four merge bit sequences as described above, the fourth merge bit sequence (100) does not satisfy the minimum run-length of 3T while the first to third merge bit sequences (000), (001) and (010) satisfy the minimum run-length of 3T and the maximum run-length of 12T, and therefore the fourth merge bit sequence (100) is not inserted.

After inserting the three merge bit sequences (000), (001) and (010) respectively between the code words Cx and Cy, the resultant three code word sequences {Cx(000)Cy}, {Cx(001)Cy} and {Cx(010)Cy} are input to the first DSV value calculation circuit 33A to calculate the respective DSV values of the three code word sequences. As shown in FIG. 19 to FIG. 21, when the merge bit sequence (000) is inserted between the code words Cx and Cy, the DSV value of the code word sequence {Cx(001)Cy} is +2; when the merge bit sequence (001) is inserted between the code words Cx and Cy, the DSV value is −4; and when the merge bit sequence (010) is inserted between the code words Cx and Cy, the DSV value of the code word sequence {Cx(010)Cy} is −6. The above steps thus so far are equivalent to the conventional technique as explained above with reference to FIG. 4 and FIG. 5. In the conventional technique, the code word sequence {Cx(000)Cy} is selected as a final single code word sequence whose absolute DSV value is closest to zero. Since the current code word, the next code word and the further next code are prefetched according to the second embodiment as described above, a final single code word sequence is determined by inserting between the current code word Cx and the next code word Cy with a merge bit sequence 1b selected with reference to the DSV values calculated by temporarily concatenating the current code word Cx, the next code word Cy and the further next code word Cz with the respective merge bit sequences.

In this configuration, the three code word sequences {Cx(000)Cy}, {Cx(001)Cy} and {Cx(010)Cy} whose DSV values are calculated by the first DSV value calculation circuit 33A are input to the second merge bit inserting circuit 32Ba.

Also in the second merge bit inserting circuit 32Ba as described above, like the first merge bit inserting circuit 32Aa, four bit sequences of (000), (001), (010) and (100) are prepared as candidates of the merge bit sequence of three bits 1b satisfying the minimum run-length of 3T and the maximum run-length of 12T.

Then, in the second merge bit inserting circuit 32Ba, a larger number of code word sequences than generated in the first merge bit inserting circuit 32Aa are generated by temporarily concatenating the further next code word Cz as input and each of the three code word sequences {Cx(000)Cy}, {Cx(001)Cy} and {Cx(010)Cy} with each of the four merge bit sequences (000), (001), (010) and (100) respectively. In this case, the larger number of code word sequences are encoded as code word sequences in the form of a branching structure (tree structure) commonly from the current code word Cx to the further next code word Cz through the next code word Cy.

The next code word Cy is "00100010000010" as described above while the further next code word Cz is "00000001000001" as illustrated in FIG. 19 to FIG. 21. The current code word Cy has "1" at the 13th bit position while the further next code word Cz has "1" at the eight bit position. Thereby, out of the four merge bit sequences as described above, the fourth merge bit sequence (100) does not satisfy the minimum run-length of 3T while the first to third merge bit sequences (000), (001) and (010) satisfy the minimum run-length of 3T and the maximum run-length of 12T, and therefore the fourth merge bit sequence (100) is not inserted.

Then, after the further next code word Cz as input and each of the three code word sequences {Cx(000)Cy}, {Cx(001)Cy} and {Cx(010)Cy} are concatenated with each of the three merge bit sequences (000), (001) and (010) respectively, a total of nine code word sequences are input to the second DSV value calculation circuit 33B. Namely, the nine code word sequences are {Cx(000)Cy(000)Cz}, {Cx(000)Cy(001)Cz}, {Cx(000)Cy(010)CZ}, {Cx(001)Cy(000)Cz}, {Cx(001)Cy(001)Cz}, {Cx(001)Cy(010)Cz}, Cx(010)Cy(000)Cz), {Cx(010)Cy(001)Cz} and {Cx(010)Cy(010)Cz}. The respective DSV values of the nine code word sequences as calculated are as follows.

In the case 21 of the code word sequence {Cx(000)Cy(000)Cz} as shown in FIG. 19A, successive eleven 0's appears from the 13th bit of the code word Cy to the 7th bit of the code word Cz through the merge bit sequence (000) as the maximum run-length 12T while the DSV value of the code word sequence {Cx(000)Cy(000)Cz} is calculated as −3.

In the case 22 of the code word sequence {Cx(000)Cy(001)Cz} as shown in FIG. 19B, the maximum run-length 12T does not appear while the DSV value of the code word sequence {Cx(000)Cy(001)Cz} is calculated as +3.

In the case 23 of the code word sequence {Cx(000)Cy(010)Cz} as shown in FIG. 19C, the maximum run-length 12T does also not appear while the DSV value of the code word sequence {Cx(000)Cy(010)Cz} is calculated as +5.

In the case 31 of the code word sequence {Cx(001)Cy(000)Cz} as shown in FIG. 20A, successive eleven 0's appears from the 13th bit of the code word Cy to the 7th bit of the code word Cz through the merge bit sequence (000) as the maximum run-length 12T while the DSV value of the code word sequence {Cx(001)Cy(000)Cz} is calculated as +1.

In the case 32 of the code word sequence {Cx(001)Cy(001)Cz} as shown in FIG. 20B, the maximum run-length 12T does not appear while the DSV value of the code word sequence {Cx(001)Cy(001)Cz} is calculated as −5.

In the case 33 of the code word sequence {Cx(001)Cy(010)Cz} as shown in FIG. 20C, the maximum run-length 12T does also not appear while the DSV value of the code word sequence {Cx(001)Cy(010)Cz} is calculated as −7.

In the case 41 of the code word sequence {Cx(010)Cy(000)Cz} as shown in FIG. 21A, successive eleven 0's appears from the 13th bit of the code word Cy to the 7th bit of the code word Cz through the merge bit sequence (000) as the maximum run-length 12T while the DSV value of the code word sequence {Cx(010)Cy(000)Cz} is calculated as −1.

In the case 42 of the code word sequence {Cx(010)Cy(001)Cz} as shown in FIG. 21B, the maximum run-length 12T does not appear while the DSV value of the code word sequence ({x(010)Cy(001)Cz} is calculated as −7.

In the case 43 of the code word sequence {Cx(010)Cy(010)Cz} as shown in FIG. 21C, the maximum run-length 12T does also not appear while the DSV value of the code word sequence {Cx(010)Cy(010)Cz} is calculated as −9.

Thereafter, the nine code word sequences and the respective DSV values corresponding thereto are input to the DSV value comparing circuit and merge bit selecting circuit 34 from the second DSV value calculation circuit 33B. The DSV value comparing circuit and merge bit selecting circuit 34 selects one of the nine code word sequences having the DSV value that is closest to zero, i.e., either of the code word sequence {Cx(001)Cy(000)Cz} having a DSV value of +1 or the code word sequence {Cx(010)Cy(000)Cz} having a DSV value of −1, which is then input to the final code word sequence output circuit 35. In this case, it is apparent that the code word sequence having the DSV value that is closest to zero is selected from among the code word sequences including the maximum run-length 12T as shown in FIG. 19A, FIG. 20A and FIG. 21A.

Incidentally, in the modulation device 30a, it may be determined in advance which a code word sequence having a plus DSV value or a code word sequence having a minus DSV value is selected in the case where these code word sequences have the same absolute DSV value closest to zero when a code word sequence is selected by the DSV value comparing circuit and merge bit selecting circuit 34. In this case, a code word sequence having a DSV value of a predetermined polarity, either plus or minus, can be automatically selected as well as a merge bit sequence 1b corresponding to the selected polarity.

Next, the final code word sequence output circuit 35 outputs either the code word sequence {Cx(001)Cy} or the code word sequence {Cx(010)Cy} as the final single code word sequence by concatenating the current code word Cx and the next code word Cy with the merge bit sequence 1b included in the code word sequence as selected by the DSV value comparing circuit and merge bit selecting circuit 34. In other words, the final code word sequence is equivalent to the code word sequence as selected by the DSV value comparing circuit and merge bit selecting circuit 34 from which the code word Cz and the merge bit sequence 1b between the code words Cy and Cz are removed.

Namely, while the merge bit sequence 1b inserted between the code words Cx and Cy is (001) or (010) in the code word sequence {Cx(001)Cy(000)Cz) having a DSV value of +1 or the code word sequence {Cx(010)Cy(000)Cz} having a DSV value of −1, as input to the final code word sequence output circuit 35, the merge bit sequence 1b is selected in order that the DSV value has an absolute value closest to zero as calculated of the code word sequence comprising the current code word Cx, the next code word Cy and the further next code word Cz.

Figure 4:
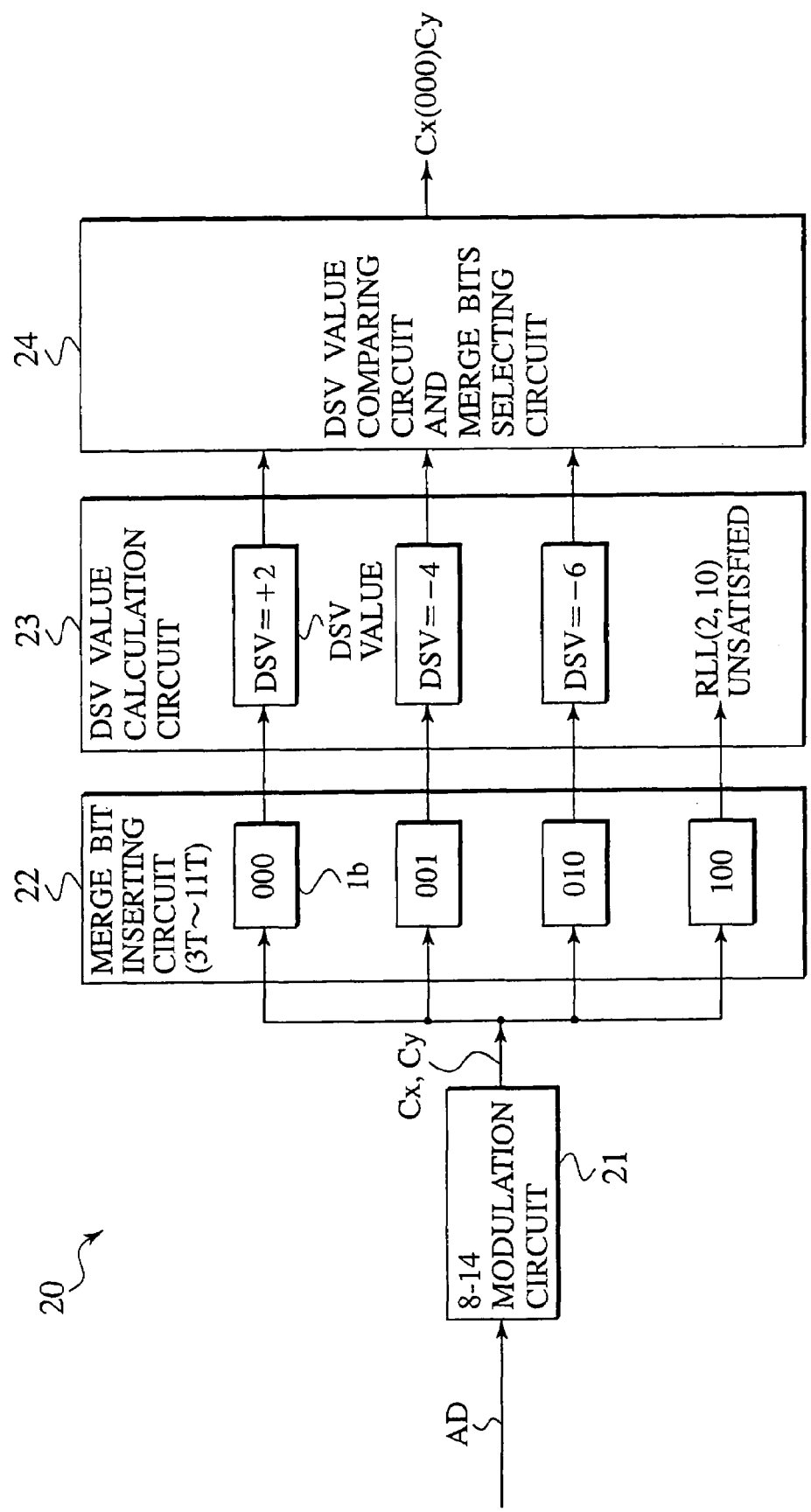
FIG. 4 is a block diagram schematically showing a conventional modulation device.
Figure 5:
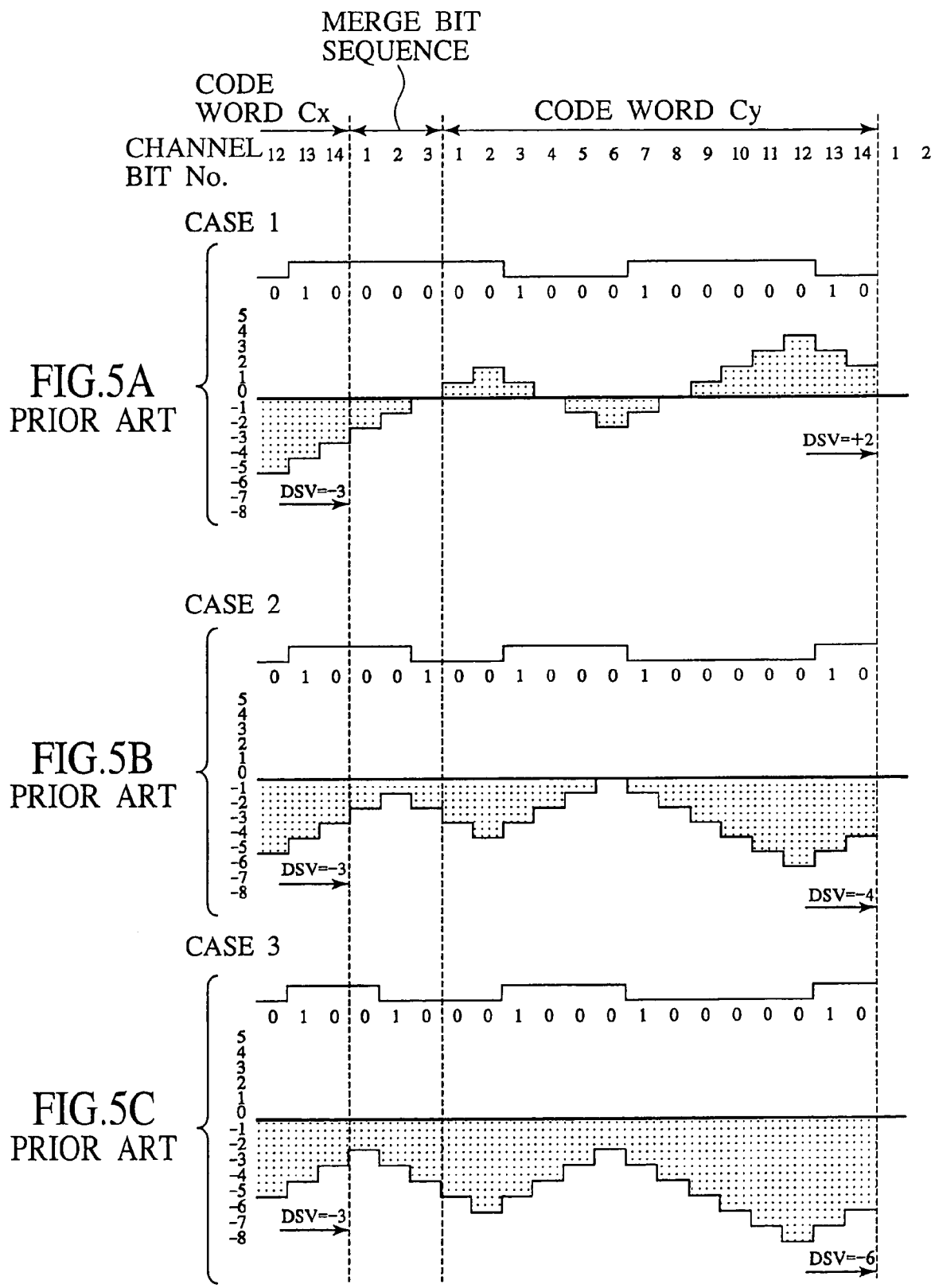
FIGS. 5A through 5C are views for explaining the calculation of the DSV values for a plurality of the code word sequences temporarily prepared, each code word sequence being generated in the conventional modulation device by inserting one of the merge bit sequences (000), (001), (010) and (100) between a current code word and the next code word while conforming to a predetermined run-length limiting rule.
Figure 6:
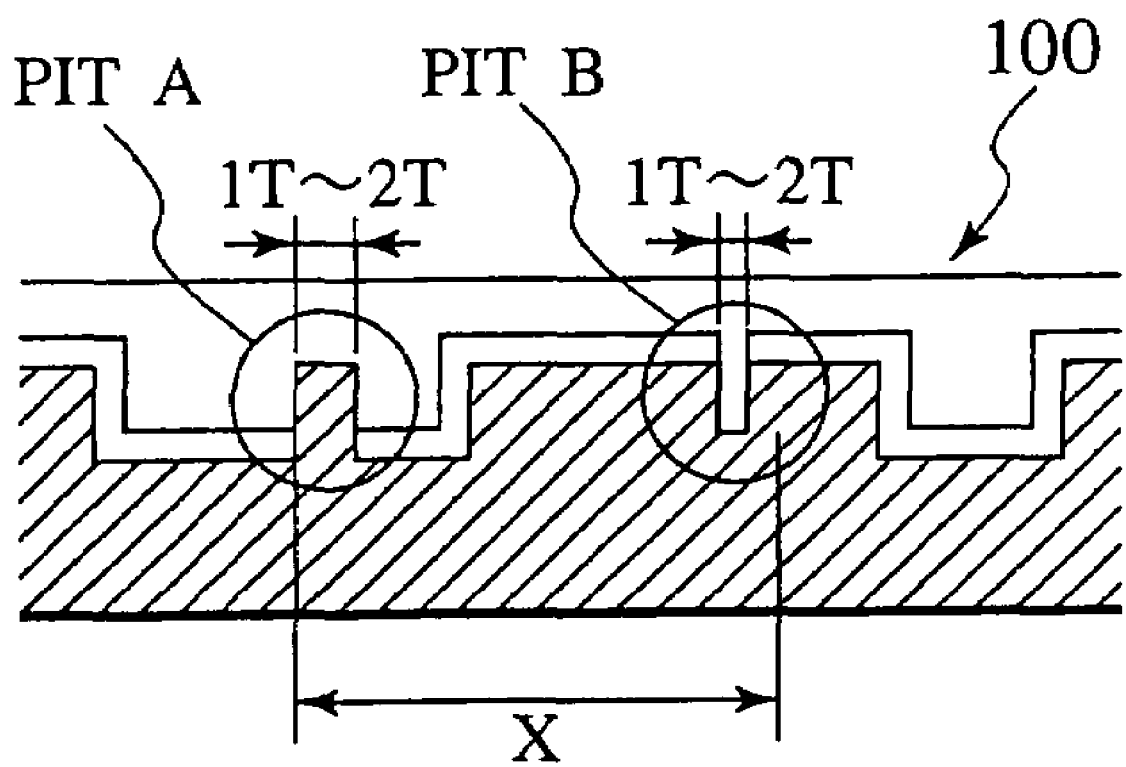
FIG. 6 is a longitudinal cross sectional view showing an optical disc, in which a copy-protection technology is incorporated, as an exemplary conventional technique.

Contrary to this, in the exemplary conventional technique shown in FIG. 4, only the current code word Cx and the next code word Cy are prefetched by the conventional modulation device 20 to select the merge bit sequence 1b of (000) to be inserted between the code words Cx and Cy. Although the DSV value temporarily decreases as illustrated in FIG. 18, and FIGS. 19A through 19C, the DSV value according to the exemplary conventional technique tends to positively or negatively increase, when viewed ahead, as compared with the second embodiment in which the further next code word Cz is also prefetched.

Meanwhile, for the purpose of generating the maximum run-length 12T in the combination of adjacent code words C and a merge bit sequence 1b, the merge bit sequence 1b is selected in order that the bit sequence made of the adjacent code words concatenated with the merge bit sequence 1b includes successive eleven 0's as "the code word Cy and the code word Cz" shown in FIG. 19 to FIG. 21 in the same manner as in the first embodiment.

Thereafter, according to the second embodiment, the final code word sequence {Cx(001)Cy...} or the final code word sequence {Cx(010)Cy...} arranged for obtaining the best DSV value is converted into the recording signals R (FIG. 1) suitable for recording and recorded on a glass master disc for CD (not shown in the figure) by a laser beam in the same manner as in the first embodiment. Also, in the same manner as in the first embodiment, the glass master disc for CD is used to prepare a stamper disc (not shown in the figure) which in turn is used to produce an optical disc (CD) 10 with reference to FIGS. 10A and 10B as the recording medium according to the second embodiment of the present invention.

The basic operation of the modulation device and the modulation method according to second embodiment of the present invention have been explained thus far with reference to the specific examples. However, for the purpose of facilitating the understanding, the calculation of the DSV value is explained here with the expressions such as the code word sequences {Cx(000)Cy}, {Cx(000)Cy(000)}, {Cx(000)Cy(000)Cz} and {Cx(000)Cy(000)Cz...}, giving the impression that the code word sequence having been already determined is calculated again together with the subsequent word. As a result, it might be mistaken as indispensable to completely receive all the code words Cx, Cy, Cz... in advance of starting the calculation of the DSV value and also outputting a final code word sequence. However, in the same manner as in the first embodiment, a DSV value storage circuit (not shown in the figure) is provided in the DSV value calculation circuits 33A and 33B or the merge bit selecting circuit 34, in the actual implementation, to save the DSV value for avoiding redundant calculation of the DSV value, and able to obtain a final single code word sequence when at least three code words are input.

When adjacent code words C and C are concatenated with a merge bit sequence 1b of three bits which is selected for obtaining the best DSV value, the modulation device 30a according to the present invention capable of generating the maximum run-length 12T is used to obtain a code word sequence having the smallest absolute DSV value among the code word sequences satisfying the maximum run-length 12T, as illustrated in FIG. 19 to FIG. 21.

Contrary to this, it is easily understood from the above description that, when the conventional modulation device 20 (FIG. 4) excluding the maximum run-length 12T is used in the same manner as illustrated in FIG. 8B, the DSV value is larger than that including the maximum run-length 12T as shown in FIG. 19 to FIG. 21. In this description, the maximum run-length 12T is explained as the example not conforming to the run-length limiting rule included in the CD standards. However, a longer maximum run-length such as 13T or longer, or a shorter maximum run-length of 2T or shorter can be used for the same purpose in the modulation device 30a according to the second embodiment like the first embodiment. Also in this case, the DSV value of code word sequences can be further decreased as compared to the case with the conventional modulation device 20.

Incidentally, in the case where there are successive code words to which the above described maximum run-length 12T is applicable for a certain period, the DSV value sometimes widely and periodically fluctuates for the period as illustrated in FIGS. 19A through 19C if a code word sequence is generated by the conventional modulation device 20 because the DSV value of the code word sequence is increased recurrently. However, as apparent from the above explanation, a normal playback operation is possible when recording is performed by the modulation device 30a according to the second embodiment.

When an original recording medium is produced according to this technical concept with a code word sequence which is generated permitting the restriction of the minimum run-length 3T and the maximum run-length 12T after prefetching a current code word Cx, a next code word Cy and at least a further next code word Cz, the DSV value of the code word sequence is maintained very small in the original recording medium so that no trouble occurs during playback in the same manner as the first embodiment. Contrary to this, as apparent from the above explanation, in the case of a copied recording medium, the fluctuation of the DSV value in the reproduced signals thereof is increased due to the specific data introduced by permitting the maximum run-length 12T on the original recording medium and therefore the particular frequency components in the reproduced signals thereof are increased (refer to FIG. 9).

Also, in the same manner as in the first embodiment, the technical concept of the second embodiment is applied to CD-ROMs for recording computer data.

Furthermore, the external appearance and the cross sectional structure of the optical disc as a recording medium are basically same as that of the first embodiment (refer to FIGS. 10A and 10B).

Still further, in the same manner as in the first embodiment, it is effective as copy protection measures to make use of specific data as encoded with alternating current signals or direct current signals which are not distinctively audible (refer to FIGS. 11A and 11B and FIGS. 12A and 12B).

Still further, the technical concept of the second embodiment can be implemented by inserting the specific data comprising alternating current signals or direct current signals, which are not distinctively audible as described above, to the gap of silence between adjacent performances of music of the music information in the same manner as specifically illustrated in the first embodiment with reference to FIG. 13 to FIG. 17.

Still further, in the same manner as in the first embodiment, the second embodiment is not limited to the EFM scheme (the 8–14 modulation scheme) in conformity with the CD standards.

In accordance with the modulation device, the modulation method and the recording medium of the second embodiment according to the present invention as explained in detail, a code word sequence is generated by converting input data words of p bits into code words C of q bits, concatenating the respective code words with intervening merge bit sequences of three bits. In the concatenating process, a number of code word sequences are generated by prefetching a current code word, a next code word and a further next code word, and temporarily concatenating the current code word and the next code word with a respective one of merge bit sequences of r bits, which are selected free from the predetermined run-length limiting rule. Furthermore, by the use of the plurality of code word sequences as generated above, a plurality of code word sequences including the current code word, the next code word and the further next code word are generated again by temporarily concatenating the next code word and at least the further next code word with a respective one of merge bit sequences of r bits, which are selected also free from the predetermined run-length limiting rule RLL. Among from the plurality of the code word sequences, a code word sequence is selected whose absolute DSV value is closest to zero while the current code word and the next code word are concatenated with the merge bit sequence therebetween of the selected code word sequence and output as a final single code word sequence. Since the original recording medium is produced with the final code word sequence which is successively output in this manner, the playback operation thereof is possible without trouble, while the particular frequency components are increased in the reproduced signals of a code word sequence from a copied recording medium, to which the original code word sequences are copied, and therefore the copied recording medium can not be played back due to the problematic DSV value. As a result, it is possible to forestall the infringement of copyright to the digital information signals copied to the recording medium for copy.

Also, when alternating current signals or direct current signals as input data words which are not distinctively audible are input to the modulation device according to the second embodiment of the present invention or by the modulation method according to the present invention for a predetermined period, and encoded by a p-q modulation to record the encoded data on a recording medium, a user hears, during the playback of the copied recording medium, unpleasant sound such as "beep" due to the DSV control error in an illegible period and notices that his medium is not normal. It is therefore possible to forestall the infringement of copyright to the digital information signals copied to the recording medium for copy.

Still further, according to the modulation device, the modulation method and the recording medium of the second embodiment according to the present invention as explained in detail, while input data words comprises music information, when specific data comprising alternating current signals or direct current signals which are not distinctively audible is input for a predetermined period, the playback operation of a copied recording medium, to which an original recording medium is copied, is made impossible by inserting the specific data as described above to the gap of silence between adjacent performances of music or to an area located within the gap of silence between adjacent performances of music but located outside of the area given the index number 00. It is therefore possible to forestall the infringement of copyright to the digital information signals copied to the recording medium for copy.

<Third Embodiment>

Next, described is the first embodiment of the present invention, i.e., a modulation device, a modulation method and a recording medium capable of preventing in advance, copy of digital information signals recorded in a recording medium such as an optical disc and a digital magnetic tape by ensuring that an original recording medium on which a code word sequence is recorded can be played back by means of a player that has been commercially available while disabling a copied recording medium, into which the digital information signals are copied, from being played back even when the code word sequence is generated with the predetermined run-length limiting rule conformed.

In what follows, only the differences of the third embodiment from the first embodiment and the second embodiment are described.

According to the modulation device, the modulation method and the recording medium of the third embodiment of the present invention, when conforming to the CD standards for example, EFM signals 1 are generated by converting each input data word of p bits (=8 bits) into a code word C of q bits (=14 bits) and concatenating adjacent code words C and C with a merge bit sequence 1b of three bits while at least a current code word, a next code word and a further next code are prefetched. Particularly, a final single code word sequence is obtained by concatenating each adjacent code words with a merge bit sequence 1b while satisfying the restriction of the minimum run-length of (d+1)T=3T and the maximum run-length of (k+1)T=11T based on the run-length limiting rule RLL (2, 10) included in the CD standards, in order that the merge bit sequence 1b is selected with reference to the DSV values of at least a current code word, a next code word and a further next code. Then the final code word sequence comprising the current code word and the next code word is output together with the selected merge bit sequence 1b therebetween. Furthermore, the third embodiment is characterized in that, the playback operation is normally performed with an original recording medium on which are recorded first and second code word sequences 1d and 1f of the EFM signals 1 including specific data to be hereinafter described, while during the playback operation of a copied recording medium, as a copy of the original recording medium, the reproduced signals of the first and second code word sequences 1d and 1f include particular frequency components which are increased to hinder the normal playback operation.

FIG. 22 is a block diagram schematically explaining the modulation device and the modulation method in according to the third embodiment of the present invention. FIG. 23 to FIG. 25 are schematic diagrams for explaining the variation of the DSV values of a plurality of code word sequences calculated in the encoding operation by the use of the modulation device according to the third embodiment of the present invention in which a current code word and a next code word are concatenated with a merge bit sequence, conforming to the run-length limiting rule included in the CD standards, while prefetching the current code word and the next code word together with a further next code word.

A modulation device 30b according to the third embodiment of the present invention as shown in FIG. 22 is applicable to a glass master disc recording apparatus (not shown in the figure) for producing CDs and generally composed of an 8–14 modulation circuit 31, a first merge bit inserting circuit 32Ab, a first DSV value calculation circuit 33A, a second merge bit inserting circuit 32Bb, a second DSV value calculation circuit 33B, a DSV value comparing circuit and merge bit selecting circuit 34, and a final code word sequence output circuit 35.

The first and second merge bit inserting circuits 32Ab and 32Bb have the same internal structure, while the first and second DSV value calculation circuits 33A and 33B have the same internal structure. It is therefore possible, depending upon by the software for taking control of the modulation device 30 according to the third embodiment, to use only one merge bit inserting circuit functioning as the first and second merge bit inserting circuits 32Ab and 32Bb and only one DSV value calculation circuit functioning as the first and second DSV value calculation circuits 33A and 33B. However, for the purpose of facilitating the understanding, these separate circuits are used herein as described above.

The modulation device 30 according to the third embodiment serves to output EFM signals 1 which are generated by dividing music original data AD of 16 bits into upper eight bits and lower eight bits as input data words, converting the respective input data words D of eight bits into respective code words C of 14 bits, temporarily concatenating the respective code words with intervening merge bit sequences of three bits. In the concatenating process, a plurality of code word sequences are generated by prefetching a current code word Cx, a next code word Cy and a further next code word Cz, and temporarily concatenating the current code word Cx and the next code word Cy with a respective one of merge bit sequences 1b of three bits, which are selected conforming to the run-length limiting rule RLL(2, 10) included in the CD standards. Furthermore, by the use of the plurality of code word sequences as generated above, a plurality of code word sequences including the current code word Cx, the next code word Cy and the further next code word Cz are generated again by temporarily concatenating the next code word Cy and at least the further next code word Cz with a respective one of merge bit sequences 1b of three bits, which are selected also conforming to the run-length limiting rule RLL(2, 10) included in the CD standards. Among from the plurality of the code word sequences, a code word sequence is selected whose absolute DSV value is closest to zero, and then the current code word Cx and the next code word Cy are concatenated with the merge bit sequence 1b therebetween of the selected code word sequence and output as a final single code word sequence.

More specifically explaining, in the case of the modulation device 30 according to the third embodiment, the music original data AD of 16 bytes is input to the 8–14 modulation circuit 31 in chronological order in the same manner as in the first embodiment and the second embodiment.

In the 8–14 modulation circuit 31 as described above, when a current code word Cx is read, for example, a next code word Cy next to the code word Cx and a further next code word Cz are prefetched in the same manner as in the first embodiment and the second embodiment. Also, in the same manner as the second embodiment, it is possible to prefetch a still further next code word(s) after the further next code word Cz.

Then, while the current code word Cx and the next code word Cy are input to the first merge bit inserting circuit 32Ab from the 8–14 modulation circuit 31, the further next code word Cz is input, after outputting the next code word Cy, from the 8–14 modulation circuit 31 to the second merge bit inserting circuit 32Bb to be hereinafter described.

In the first merge bit inserting circuit 32Ab, four bit sequences of (000), (001), (010) and (100) are prepared as candidates of the merge bit sequence of three bits 1b selected conforming to the restriction of the minimum run-length 3T and the maximum run-length 1T based on the run-length limiting rule RLL(2, 10) included in the CD standards. Also in this third embodiment, like the first embodiment and the second embodiment, the remaining four sequences, i.e., (011), (101), (110) and (111) cannot satisfy the minimum run-length 3T and therefore are removed from consideration because two or more 1's appear successively or with an intervening "0".

Then, the four merge bit sequences (000), (001), (010) and (100) are temporarily inserted, respectively between the current code word Cx and next code word Cy which are input to the merge bit inserting circuit 32 to generate a plurality of code word sequence.

In this case, as illustrated in FIGS. 23 to 25, for example, the current code word Cx and the next code word Cy are set to the same values as in the first embodiment and the second embodiment for the purpose of facilitating the understanding the gist of the third embodiment. Namely, the current code word Cx has "010" from the 12th bit to the 14th bit while the next code word Cy is "00100010000010". Thus the current code word Cx has "1" at the 13th bit position while the next code word Cy has "1" at the third bit position. Thereby, out of the four merge bit sequences as described above, the fourth merge bit sequence (100) does not conform to the run-length limiting rule RLL (2, 10), while the first to third merge bit sequences (000), (001) and(010) satisfy the minimum run-length of 3T and the maximum run-length of 1T, and therefore the fourth merge bit sequence (100) is not inserted.

After inserting the three merge bit sequences (000), (001) and (010) respectively between the code words Cx and Cy, the resultant three code word sequences {Cx(000)Cy}, {Cx(001)Cy} and {Cx(010)Cy} are input to the first DSV value calculation circuit 33A to calculate the respective DSV values of the three code word sequences. As shown in FIG. 23 to FIG. 25, when the merge bit sequence (000) is inserted between the code words Cx and Cy, the DSV value of the code word sequence {Cx(001)Cy} is +2; when the merge bit sequence (001) is inserted between the code words Cx and Cy, the DSV value is −4; and when the merge bit sequence (010) is inserted between the code words Cx and Cy, the DSV value of the code word sequence {Cx(010)Cy} is −6. The above steps thus so far are equivalent to the conventional technique as explained above with reference to FIG. 4 and FIG. 5. In the conventional technique, the code word sequence {Cx(000)Cy} is selected as a final single code word sequence whose absolute DSV value is closest to zero. Since the current code word, the next code word and the further next code are prefetched according to the third embodiment as described above, the final single code word sequence is determined by inserting between the current code word Cx and the next code word Cy with a merge bit sequence 1b selected with reference to the DSV values calculated by temporarily concatenating the current code word Cx, the next code word Cy and the further next code word Cz with the respective merge bit sequences.

In this configuration, the three code word sequences {Cx(000)Cy}, {Cx(001)Cy} and {Cx(010)Cy} whose DSV values are calculated by the first DSV value calculation circuit 33A are input to the second merge bit inserting circuit 32Bb.

Also in the second merge bit inserting circuit 32Bb as described above, like the first merge bit inserting circuit 32Ab, four bit sequences of (000), (001), (010) and (100) are prepared as candidates of the merge bit sequence of three bits 1b satisfying the minimum run-length of 3T and the maximum run-length of 11T.

Then, in the second merge bit inserting circuit 32Bb, a larger number of code word sequences than generated in the first merge bit inserting circuit 32Ab are generated by temporarily concatenating the further next code word Cz as input and each of the three code word sequences {Cx(000)Cy}, {Cx(001)Cy} and {Cx(010)Cy} with each of the four merge bit sequences (000), (001), (010) and (100) respectively. In this case, the larger number of code word sequences are encoded as code word sequences in the form of a branching structure (tree structure) commonly from the current code word Cx to the further next code word Cz through the next code word Cy.

The next code word Cy is "00100010000010" as described above while the further next code word Cz is "0010001000010" as illustrated in FIG. 23 to FIG. 25. The current code word Cy has "1" at the 13th bit position while the further next code word Cz has "1" at the third bit position. Thereby, out of the four merge bit sequences as described above, the fourth merge bit sequence (100) does not satisfy the minimum run-length of 3T while the first to third merge bit sequences (000), (001) and (010) satisfy the minimum run-length of 3T and the maximum run-length of 1T, and therefore the fourth merge bit sequence (100) is not inserted.

Then, after the further next code word Cz as input and each of the three code word sequences {Cx(000)Cy}, {Cx(001)Cy} and {Cx(010)Cy} are concatenated with each of the four merge bit sequences (000), (001) and (010) respectively, a total of nine code word sequences are input to the second DSV value calculation circuit 33B. Namely, the nine code word sequences are {Cx(000)Cy(000)Cz}, {Cx(000)Cy(001)Cz}, {Cx(000)Cy(010)Cz}, {Cx(001)Cy(000)Cz}, {Cx(001)Cy(001)Cz}, {Cx(001)Cy(010)CZ}, Cx(010)Cy(000)Cz}, {Cx(010)Cy(001)Cz} and {Cx(010)Cy(010)Cz}. The respective DSV values of the nine code word sequences as calculated are as follows.

In the case 51, as shown in FIG. 23A, the DSV value of the code word sequence {Cx(000)Cy(000)Cz} is calculated as −3. In the case 52, as shown in FIG. 23B, the DSV value of the code word sequence {Cx(000)Cy(001)Cz} is calculated as +3. In the case 53, as shown in FIG. 23C, the DSV value of the code word sequence {Cx(000)Cy(010)Cz} is calculated as +5.

In the case 61, as shown in FIG. 24A, the DSV value of the code word sequence {Cx(001)Cy(000)Cz} is calculated as +1. In the case 62, as shown in FIG. 24B, the DSV value of the code word sequence {Cx(001)Cy(001)Cz} is calculated as −5. In the case 63, as shown in FIG. 24C, the DSV value of the code word sequence {Cx(001)Cy(010)Cz} is calculated as −7.

Furthermore, in the case 71, as shown in FIG. 25A, the DSV value of the code word sequence {Cx(010)Cy(000)Cz} is calculated as −1. In the case 72, as shown in FIG. 25B, the DSV value of the code word sequence {Cx(010)Cy(001)Cz} is calculated as −7. In the case 73, as shown in FIG. 25C, the DSV value of the code word sequence {Cx(010)Cy(000)Cz} is calculated as −9.

Thereafter, the nine code word sequences and the respective DSV values corresponding thereto are input to the DSV value comparing circuit and merge bit selecting circuit 34 from the second DSV value calculation circuit 33B. The DSV value comparing circuit and merge bit selecting circuit 34 selects one of the nine code word sequences having the DSV value that is closest to zero, i.e., either of the code word sequence {Cx(001)Cy(000)Cz} having a DSV value of +1 or the code word sequence {Cx(010)Cy(000)Cz} having a DSV value of −1, which is then input to the final code word sequence output circuit 35.

Incidentally, in the modulation device 30b, it may be determined in advance which a code word sequence having a plus DSV value or a code word sequence having a minus DSV value is selected in the case where these code word sequences have the same absolute DSV value closest to zero when a code word sequence is selected by the DSV value comparing circuit and merge bit selecting circuit 34. In this case, a code word sequence having a DSV value of a predetermined polarity, either plus or minus, can be automatically selected as well as a merge bit sequence 1b corresponding to the selected polarity.

Next, the final code word sequence output circuit 35 outputs either the code word sequence {Cx(001)Cy} or the code word sequence {Cx(010)Cy} as the final single code word sequence by concatenating the current code word Cx and the next code word Cy with the merge bit sequence 1b included in the code word sequence as selected by the DSV value comparing circuit and merge bit selecting circuit 34. In other words, the final code word sequence is equivalent to the code word sequence as selected by the DSV value comparing circuit and merge bit selecting circuit 34 from which the code word Cz and the merge bit sequence 1b between the code words Cy and Cz are removed.

Namely, while the merge bit sequence 1b inserted between the code words Cx and Cy is (001) or (010) in the code word sequence {Cx(001)Cy(000)Cz} having a DSV value of +1 or the code word sequence {Cx(010)Cy(000)Cz} having a DSV value of −1, as input to the final code word sequence output circuit 35, the merge bit sequence 1b is selected in order that the DSV value has an absolute value closest to zero as calculated of the code word sequence comprising the current code word Cx, the next code word Cy and the further next code word Cz.

Contrary to this, when only the current code word Cx and the next code word Cy are prefetched and concatenated with a merge bit sequence 1b by the conventional modulation device 20 as in the exemplary conventional technique shown in FIG. 4, the final single code word sequence {Cx(010)Cy} is obtained with a DSV value of +2. Then, this final single code word sequence {Cx(010)Cy} is concatenated with the code word Cz as illustrated in FIGS. 23A through 23C. The DSV values as obtained in FIGS. 23A through 23C are greater in the positive or negative direction than the DSV value +1 of the code word sequence {Cx(001)Cy(000)Cz} and the DSV value −1 of the code word sequence {Cx(010)Cy(000)Cz} as obtained when prefetching the further next code word Cz.

Thereafter, according to the third embodiment, the final code word sequence {Cx(001)Cy . . . } or the final code word sequence {Cx(010)Cy . . . } arranged for obtaining the best DSV value is converted into the recording signals R (FIG. 1) suitable for recording and recorded on a glass master disc for CD (not shown in the figure) by a laser beam in the same manner as in the first embodiment and the second embodiment. Also, in the same manner as in the first embodiment and the second embodiment, the glass master disc for CD is used to prepare a stamper disc (not shown in the figure) which in turn is used to produce an optical disc (CD) 10 with reference to FIGS. 10A and 10B as the recording medium according to the third embodiment of the present invention.

The basic operation of the modulation device and the modulation method according to second embodiment of the present invention have been explained thus far with reference to the specific examples. However, for the purpose of facilitating the understanding, the calculation of the DSV value is explained here with the expressions such as the code word sequences {Cx(000)Cy}, {Cx(000)Cy(000)}, {Cx(000)Cy(000)Cz} and {Cx(000)Cy(000)Cz . . . }, giving the impression that the code word sequence having been already determined is calculated again together with the subsequent word. As a result, it might be mistaken as indispensable to completely receive all the code words Cx, Cy, Cz . . . in advance of starting the calculation of the DSV value and also outputting a final code word sequence. However, in the same manner as in the first embodiment and the second embodiment, a DSV value storage circuit (not shown in the figure) is provided in the DSV value calculation circuits 33A and 33B or the merge bit selecting circuit 34, in the actual implementation, to save the DSV value for avoiding redundant calculation of the DSV value, and able to obtain a final single code word sequence when at least three code words are input.

When adjacent code words C and C are concatenated with a merge bit sequence 1b of three bits which is selected for obtaining the best DSV value, the modulation device 30b according to the present invention capable of prefetching a current code word Cx, a next code word Cy and a further next code word Cz is used to obtain a code word sequence having the smallest absolute DSV value among a large number of code word sequences as illustrated in FIG. 23 to FIG. 25.

Contrary to this, it is easily understood from the above description that, when the conventional modulation device 20 (FIG. 4) which does not prefetch a further next code word Cz is used, the DSV value is larger than that obtained by prefetching the further next code word Cz as shown in FIG. 23 to FIG. 25. It is therefore possible to make smaller the DSV value of the code word sequence as generated by the modulation device 30b according to the third embodiment as compared to the DSV value by the conventional modulation device 20.

Incidentally, in the case where there are successive code words to which the above described maximum run-length 12T is applicable for a certain period, the DSV value sometimes widely and periodically fluctuates for the period if a code word sequence is generated by the conventional modulation device 20 because the DSV value of the code word sequence is increased recurrently. However, as apparent from the above explanation, a normal playback operation is possible when recording is performed by the modulation device 30b according to the third embodiment.

When an original recording medium is produced according to this technical concept with a code word sequence, including the specific data, which is generated conforming to the minimum run-length 3T and the maximum run-length 11T after prefetching a current code word Cx, a next code word Cy and at least a further next code word Cz, the DSV value of the code word sequence is maintained very small in the original recording medium so that no trouble occurs during playback thereof. Contrary to this, as apparent from the above explanation, in the case of a copied recording medium, the fluctuation of the DSV value in the reproduced signals thereof is increased due to the specific data recorded on the original recording medium and therefore the particular frequency components are increased in the reproduced signals thereof (refer to FIG. 9).

Also, in the same manner as in the first embodiment and the second embodiment, the technical concept of the second embodiment is applied to CD-ROMs for recording computer data.

Furthermore, the external appearance and the cross sectional structure of the optical disc as a recording medium are basically same as that of the first embodiment and the second embodiment (refer to FIGS. 10A and 10B).

Still further, in the same manner as in the first embodiment and the second embodiment, it is effective as copy protection measures to make use of specific data as encoded with alternating current signals or direct current signals which are not distinctively audible (refer to FIGS. 11A and 11B and FIGS. 12A and 12B).

Still further, the technical concept of the third embodiment can be implemented with the specific data comprising alternating current signals or direct current signals, which are not distinctively audible as described above, inserted to the gap of silence between adjacent performances of music of the music information in the same manner as specifically illustrated in the first embodiment with reference to FIG. 13 to FIG. 17.

Still further, in the same manner as in the first embodiment and the second embodiment, the second embodiment is not limited to the EFM scheme (the 8–14 modulation scheme) in conformity with the CD standards.

In accordance with the modulation device, the modulation method and the recording medium of the second embodiment according to the present invention as explained in detail, a code word sequence is generated by converting input data words of p bits into code words C of q bits, concatenating the respective code words with intervening merge bit sequences of three bits. In the concatenating process, a number of code word sequences are generated by prefetching a current code word, a next code word and a further next code word, and temporarily concatenating the current code word and the next code word with a respective one of merge bit sequences of r bits. Furthermore, by the use of the plurality of code word sequences as generated above, a plurality of code word sequences including the current code word, the next code word and the further next code word are generated again by temporarily concatenating the next code word and at least the further next code word with a respective one of merge bit sequences of r bits, which are selected with the predetermined run-length limiting rule RLL conformed. Among from the plurality of the code word sequences, a code word sequence is selected whose absolute DSV value is closest to zero while the current code word and the next code word are concatenated with the merge bit sequence therebetween of the selected code word sequence, and then the finally concatenated code word sequence is output as a final single code word sequence. Since the original recording medium is produced with the final code word sequence which is successively output in this manner, the playback operation thereof is possible without trouble, while the particular frequency components are increased in the reproduced signals of a code word sequence reproduced from a copied recording medium, to which the original code word sequences are copied, and therefore the copied recording medium can not be played back due to the problematic DSV value. As a result, it is possible to forestall the infringement of copyright to the digital information signals copied to the recording medium for copy.

Also, when alternating current signals or direct current signals as input data words which are not distinctively audible are input to the modulation device according to the third embodiment of the present invention by the modulation method according to the present invention for a predetermined period, and encoded by a p-q modulation to record the encoded data on a recording medium, a user hears, during the playback of a copied recording medium of this recording medium, unpleasant sound such as "beep" due to the DSV control error in an illegible period and notices that his medium is not normal. It is therefore possible to forestall the infringement of copyright to the digital information signals copied to the recording medium for copy.

Still further, according to the modulation device, the modulation method and the recording medium of the third embodiment according to the present invention, while input data words comprises music information, when specific data comprising alternating current signals or direct current signals which are not distinctively audible is input for a predetermined period, the playback operation of a copied recording medium, to which an original recording medium is copied, is made impossible by inserting the specific data as described above to the gap of silence between adjacent performances of music or to an area located within the gap of silence between adjacent performances of music but located outside of the area given the index number 00. It is therefore possible to forestall the infringement of copyright to the digital information signals copied to the recording medium for copy.

It should be understood that many modifications and adaptations of the invention will become apparent to those skilled in the art and it is intended to encompass such obvious modifications and changes in the scope of the claims appended hereto.

What is claimed is:

1. A modulation device for converting input data words of p bits into code words of q bits, concatenating adjacent ones of the code words with a merge bit sequence of r bits to form a code word sequence, and outputting the code word sequence, the modulation device comprising:

a modulation means for converting the input data words of p bits into the code words of q bits while prefetching at least a current code word and a next code word;

a merge bit inserting means for generating a plurality of code word sequences by temporarily concatenating the current code word and the next code word with each of a plurality of merge bit sequences of the r bits respectively to prepare a plurality of code word sequences without conforming to at least one of a minimum run-length (d+1)T and a maximum run-length (k+1)T which are set on the basis of a run-length limiting rule RLL(d, k);

a DSV value calculation means for calculating the DSV value of each of the large number of code word sequences as generated by the merge bit inserting means;

a comparing and selecting means for selecting one code word sequence having an absolute DSV value as calculated by the DSV value calculation means closest to zero among the large number of code word sequences; and a final code word sequence output means for outputting a final code word sequence finally determined by concatenating the current code word and the next code word with the merge bit sequence which is inserted between the current code word and the next code word of the one code word sequence as selected by the comparing and selecting means, wherein d is a minimum number of successive 0's occurring between adjacent logic 1's in the code words of q bits, k is a maximum number of successive 0's occurring between adjacent logic 1's in the code words of q bits, and T is a length of a channel bit.

2. The modulation device as claimed in claim 1 wherein the merge bit inserting means inserts the merge bit sequence of r bits between the adjacent code words without conforming to the maximum run-length (k+1)T on the basis of the run-length limiting rule RLL(d, k) but permitting a maximum run-length of (k+2)T.

3. The modulation device as claimed in claim 1 wherein the merge bit inserting means generates the code word sequence not to conform to the run-length limiting rule RLL(d, k) for a period during which the modulation means inputs therein specific data as the input data words, the specific data being the input data words that would cause increase of particular frequency components in a reproduced signal based on the code word sequence corresponding to the specific data if the merge bit inserting means generates the corresponding code word sequence to conform to the run-length limiting rule RLL(d, k).

4. The modulation device as claimed in claim 3 wherein the specific data comprises alternating current signals or direct current signals which are not distinctively audible.

5. The modulation device as claimed in claim 3 wherein the input data words comprise music information, and the modulation means inputs therein the music information as the input code words including the specific data which is inserted to the gap of silence between adjacent performances of music and is not distinctively audible.

6. The modulation device as claimed in claim 3 wherein the input data words comprise music information, and the modulation means inputs therein the music information as the input code words including the specific data which is inserted to an area located within the gap of silence between adjacent performances of music but located outside of the area given the index number 00 and is not distinctively audible.

7. A recording medium on which is recorded the code word sequence encoded by the modulation device as recited in claim 1.

8. A modulation method for converting input data words of p bits into code words of q bits, concatenating adjacent ones of the code words with a merge bit sequence of r bits to form a code word sequence, and outputting the code word sequence, the modulation method comprising:
  a modulation step of converting the input data words of p bits into the code words of q bits while prefetching at least a current code word and a next code word;
  a merge bit inserting step of generating a plurality of code word sequences by temporarily concatenating the current code word and the next code word with each of a plurality of merge bit sequences of the r bits respectively to prepare a plurality of code word sequences without conforming to at least one of a minimum run-length (d+1)T and a maximum nm-length (k+1)T which are set on the basis of a run-length limiting rule RLL(d, k);
  a DSV value calculation step of calculating the DSV value of each of the large number of code word sequences as generated by the merge bit inserting step;
  a comparing and selecting step of selecting one code word sequence having an absolute DSV value as calculated by the DSV value calculation step closest to zero among the large number of code word sequences; and
  a final code word sequence output step of outputting a final code word sequence finally determined by concatenating the current code word and the next code word with the merge bit sequence which is inserted between the current code word and the next code word of the one code word sequence as selected by the comparing and selecting step,
  wherein d is a minimum number of successive 0's occurring between adjacent logic 1's in the code words of q bits. k is a maximum number of successive 0's occurring between adjacent logic 1's in the code words of q bits, and T is a length of a channel bit.

9. The modulation method as claimed in claim 8 wherein the merge bit inserting step inserts the merge bit sequence of r bits between the adjacent code words without conforming to the maximum run-length (k+1)T on the basis of the run-length limiting rule RLL(d, k) but permitting a maximum run-length of (k+2)T.

10. The modulation method as claimed in claim 8 wherein the merge bit inserting step generates the code word sequence not to conform to the run-length limiting rule RLL(d, k) for a period during which the modulation step inputs specific data as the input data words, the specific data being the input data words that would cause increase of particular frequency components in a reproduced signal based on the code word sequence corresponding to the specific data if the merge bit inserting step generates the corresponding code word sequence to conform to the run-length limiting rule RLL(d, k).

11. The modulation method as claimed in claim 10 wherein the specific data comprises alternating current signals or direct current signals which are not distinctively audible.

12. The modulation method as claimed in claim 10 wherein when the input data words comprise music information, and the modulation step inputs the music information as the input code words including the specific data which is inserted to the gap of silence between adjacent performances of music and is not distinctively audible.

13. The modulation method as claimed in claim 10 wherein the input data words comprise music information, and the modulation step inputs the music information as the input code words including the specific data which is inserted to an area located within the gap of silence between adjacent performances of music but located outside of the area given the index number 00 and is not distinctively audible.

14. A recording medium on which is recorded the code word sequence encoded in accordance with the modulation method as recited in claim 8.

15. A modulation device for converting input data words of p bits into code words of q bits, concatenating adjacent ones of the code words with a merge bit sequence of r bits to form a code word sequence, and outputting the code word sequence, the modulation device comprising:
  a modulation means for converting the input data words of p bits into the code words of q bits while prefetching at least a current code word, a next code word, and a further next code word;
  a merge bit inserting means for generating a plurality of code word sequences by temporarily concatenating the current code word and the next code word with each of a plurality of merge bit sequences of the r bits respectively to prepare a plurality of code word sequences without conforming to the run-length limiting rule RLL(d. k), and then temporarily concatenating at least the further next code word and the next code word of each code word sequence with each of the plurality of merge bit sequences of the r bits to prepare a large number of code word sequences from the current code word to the further next code word without conforming to the run-length limiting rule RLL(d. k);
  a DSV value calculation means for calculating the DSV value of each of the large number of code word sequences as generated by the merge bit inserting means;
  a comparing and selecting means for selecting one code word sequence having an absolute DSV value as calculated by the DSV value calculation means closest to zero among the large number of code word sequences; and
  a final code word sequence output means for outputting a final code word sequence finally determined by concatenating the current code word and the next code word with the merge bit sequence which is inserted between the current code word and the next code word of the one code word sequence as selected by the comparing and selecting means;
  wherein d is a minimum number of successive 0's occurring between adjacent logic 1's in the code words of q bits, and k is a maximum number of successive 0's occurring between adjacent logic 1's in the code words of q bits.

16. The modulation device as claimed in claim 15 wherein the merge bit inserting means inserts the merge bit sequence of r bits between the adjacent code words without conforming to the maximum run-length (k+1)T on the basis of the run-length limiting rule RLL(d, k) but permitting a maximum run-length of (k+2)T. in which T is a length of a channel bit.

17. The modulation device as claimed in claim 15 wherein the merge bit inserting means generates the code word sequence not to conform to the run-length limiting rule RLL(d, k) for a period during which the modulation means inputs therein specific data as the input data words, the specific data being the input data words that would cause increase of particular frequency components in a reproduced signal based on the code word sequence corresponding to the specific data if the merge bit inserting means generates the corresponding code word sequence to conform to the run-length limiting rule RLL(d, k).

18. The modulation device as claimed in claim 17 wherein the specific data comprises alternating current signals or direct current signals which are not distinctively audible.

19. The modulation device as claimed in claim 17 wherein the input data words comprise music information, and the modulation means inputs therein the music information as the input code words including the specific data which is inserted to the gap of silence between adjacent performances of music and is not distinctively audible.

20. The modulation device as claimed in claim 17 wherein the input data words comprise music information, and the modulation means inputs therein the music information as the input code words including the specific data which is inserted to an area located within the gap of silence between adjacent performances of music but located outside of the area given the index number 00 and is not distinctively audible.

21. A recording medium on which is recorded the code word sequence encoded by the modulation device as recited in claim 15.

22. A modulation method for converting input data words of p bits into code words of q bits, concatenating adjacent ones of the code words with a merge bit sequence of r bits to form a code word sequence, and outputting the code word sequence, the modulation method comprising:

a modulation step of converting the input data words of p bits into the code words of q bits while prefetching at least a current code word, a next code word, and a further next code word;

a merge bit inserting step of generating a plurality of code word sequences by temporarily concatenating the current code word and the next code word with each of a plurality of merge bit sequences of the r bits respectively to prepare a plurality of code word sequences without conforming to the run-length limiting rule RLL(d, k), and then temporarily concatenating at least the further next code word and the next code word of each code word sequence with each of the plurality of merge bit sequence of the r bits to prepare a large number of code word sequences from the current code word to the further next code word without conforming to the run-length limiting rule RLL(d, k);

a DSV value calculation step of calculating the DSV value of each of the large number of code word sequences as generated in the merge bit inserting step;

a comparing and selecting step of selecting one code word sequence having an absolute DSV value as calculated in the DSV value calculation step closest to zero among the large number of code word sequences; and a fifth final code word sequence output step of outputting a final code word sequence finally determined by concatenating the current code word and the next code word with the merge bit sequence which is inserted between the current code word and the next code word of the one code word sequence as selected in the comparing and selecting step, wherein d is a minimum number of successive 0's occurring between adjacent logic 1's in the code words of q bits, and k is a maximum number of successive 0's occurring between adjacent logic 1's in the code words of q bits.

23. The modulation method as claimed in claim 22 wherein the merge bit inserting step inserts the merge bit sequence of r bits between the adjacent code words without conforming to the maximum run-length (k+1)T on the basis of the run-length limiting rule RLL(d, k) but permitting a maximum run-length of (k+2)T, in which T is a length of a channel bit.

24. The modulation method as claimed in claim 22 wherein the merge bit inserting step generates the code word sequence not to conform to the run-length limiting rules RLL(d, k) for a period during which the modulation step inputs specific data as the input data words, the specific data being the input data words that would cause increase of particular frequency components in a reproduced signal based on the code word sequence corresponding to the specific data if the merge bit inserting step generates the corresponding code word sequence to conform to the run-length limiting rules RLL(d, k).

25. The modulation method as claimed in claim 24 wherein the specific data comprises alternating current signals or direct current signals which are not distinctively audible.

26. The modulation method as claimed in claim 24 wherein the input data words comprise music information, and the modulation step inputs the music information as the input code words including the specific data which is inserted to the gap of silence between adjacent performances of music and is not distinctively audible.

27. The modulation method as claimed in claim 24 wherein the input data words comprise music information, and the modulation step inputs the music information as the input code words including the specific data which is inserted to an area located within the gap of silence between adjacent performances of music but located outside of the area given the index number 00 and is not distinctively audible.

28. A recording medium on which is recorded the code word sequence encoded by the modulation method as recited in claim 22.

29. A modulation device for converting input data words of p bits into code words of q bits, concatenating adjacent ones of the code words with a merge bit sequence of r bits to form a code word sequence, and outputting the code word sequence, the modulation device comprising:

a modulation means for converting the input data words of p bits into the code words of q bits while prefetching at least a current code word, a next code word, and a further next code word;

a merge bit inserting means for generating a plurality of code word sequences by temporarily concatenating the current code word and the next code word with each of a plurality of merge bit sequences of the r bits respectively to prepare a plurality of code word sequences with the mn-length limiting rule RLL(d, k) conformed, and then temporarily concatenating at least the further next code word and the next code word of each code word sequence with each of the plurality of merge bit sequences of the r bits to prepare a large number of code word sequences from the current code word to the further next code word with the run-length limiting rule RLL(d, k) conformed, wherein d is a minimum number of successive 0's occurring between adjacent logic 1's in the code words of a bits, and k is a maximum number of successive 0's occurring between adjacent logic 1's in the code words of q bits;

a DSV value calculation means for calculating the DSV value of each of the large number of code word sequences as generated by the merge bit inserting means;

a comparing and selecting means for selecting one code word sequence having an absolute DSV value as calculated by the DSV value calculation means closest to zero among the large number of code word sequences; and a final code word sequence output means for outputting a final code word sequence finally determined by concatenating the current code word and the next code word with the merge bit sequence which is inserted between the current code word and the next code word of the one code word sequence as selected by the comparing and selecting means, wherein the modulation means inputs therein specific data as the input data words and encodes the input data words including the specific data by the p-q modulation scheme, the specific data comprising alternating current current signals or direct current signals which would cause a modulation device that prefetches only the next code word to output a code word sequence from which a reproduced signal including particular frequency components is reproduced.

30. The modulation device as claimed in claim 29 wherein the input data words comprise music information, and the modulation means inputs therein the music information as the input code words including the specific data which is inserted to the gap of silence between adjacent performances of music and is not distinctively audible.

31. The modulation device as claimed in claim 29 wherein the input data words comprise music information, and the modulation means inputs therein the music information as the input code words including the specific data which is inserted to an area located within the gap of silence between adjacent performances of music but located outside of the area given the index number 00 and is not distinctively audible.

32. A recording medium on which is recorded the code word sequence encoded by the modulation device as recited in claim 29.

33. A modulation method for converting input data words of p bits into code words of q bits, concatenating adjacent ones of the code words with a merge bit sequence of r bits to form a code word sequence, and outputting the code word sequence, the modulation method comprising:

a modulation step of converting the input data words of p bits into the code words of q bits while prefetching at least a current code word, a next code word, and a further next code word;

a merge bit inserting step of generating a plurality of code word sequences by temporarily concatenating the current code word and the next code word with each of a plurality a merge bit inserting step of generating a plurality of code word sequences by temporarily concatenating the current code word and the next code word with each of a plurality of merge bit sequences of the r bits respectively to prepare a plurality of code word sequences with the run-length limiting rule RLL(d, k) conformed, and then temporarily concatenating at least the further next code word and the next code word of each code word sequence with each of the plurality of merge bit sequences of the r bits to prepare a large number of code word sequences from the current code word to the further next code word with the run-length limiting rule RLL(d, k) conformed, wherein d is a minimum number of successive 0's occurring between adjacent logic 1's in the code words of q bits, and k is a maximum number of successive 0's occurring between adjacent logic 1's in the code words of q bits;

a DSV value calculation step of calculating the DSV value of each of the large number of code word sequences as generated in the merge bit inserting step;

a comparing and selecting step of selecting one code word sequence having an absolute DSV value as calculated in the DSV value calculation step closest to zero among the large number of code word sequences; and a final code word sequence output step of outputting a final code word sequence finally determined by concatenating the current code word and the next code word with the merge bit sequence which is inserted between the current code word and the next code word of the one code word sequence as selected in the comparing and selecting step, wherein the modulation step inputs specific data as the input data words and encodes the input data words including the specific data by the p-q modulation scheme, the specific data comprising alternating current signals or direct current signals which would cause a modulation device that prefetches only the next code word to output a code word sequence from which a reproduced signal including particular frequency components is reproduced.

34. The modulation method as claimed in claim 33 wherein the input data words comprise music information, and the modulation step inputs the music information as the input code words including the specific data which is inserted to the gap of silence between adjacent performances of music and is not distinctively audible.

35. The modulation method as claimed in claim 33 wherein the input data words comprise music information, and the modulation step inputs the music information as the input code words including the specific data which is inserted to an area located within the gap of silence between adjacent performances of music but located outside of the area given the index number 00 and is not distinctively audible.

36. A recording medium on which is recorded the code word sequence encoded by the modulation method as recited in claim 33.

* * * * *